(12) United States Patent
Gutierrez et al.

(10) Patent No.: US 8,845,367 B2
(45) Date of Patent: **\*Sep. 30, 2014**

(54) MODULAR ELECTRONIC HEADER ASSEMBLY AND METHODS OF MANUFACTURE

(71) Applicant: Pulse Electronics, Inc., San Diego, CA (US)

(72) Inventors: Aurelio J. Gutierrez, Bonita, CA (US); Russell L. Machado, San Diego, CA (US); Christopher P. Schaffer, Fallbrook, CA (US); Victor H. Renteria, Poway, CA (US)

(73) Assignee: Pulse Electronics, Inc., San Diego, CA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 13/953,645

(22) Filed: Jul. 29, 2013

(65) Prior Publication Data

US 2014/0036459 A1 Feb. 6, 2014

Related U.S. Application Data

(63) Continuation of application No. 11/399,002, filed on Apr. 5, 2006, now Pat. No. 8,496,499.

(51) Int. Cl.
| | |
|---|---|
| *H01R 13/66* | (2006.01) |
| *H05K 7/10* | (2006.01) |
| *H01F 27/02* | (2006.01) |
| *H02M 1/12* | (2006.01) |
| *H05K 3/30* | (2006.01) |
| *H01F 27/26* | (2006.01) |
| *H01F 17/06* | (2006.01) |
| *H01F 38/00* | (2006.01) |

(52) U.S. Cl.
CPC ............... *H05K 7/10* (2013.01); *H01F 27/263* (2013.01); *H01F 27/027* (2013.01); *H02M 1/126* (2013.01); *H01F 17/062* (2013.01); *H01F 27/02* (2013.01); *H05K 3/303* (2013.01); *H01F 2038/006* (2013.01)
USPC ..................................................... 439/620.01

(58) Field of Classification Search
CPC ................................................... H01R 13/6633
USPC ..................................................... 439/620.01
See application file for complete search history.

(56) References Cited

U.S. PATENT DOCUMENTS

| | | |
|---|---|---|
| 3,721,747 A | 3/1973 | Renskers |
| 3,985,310 A | 10/1976 | Kent et al. |
| 5,015,981 A | 5/1991 | Lint et al. |
| 5,212,345 A | 5/1993 | Gutierrez |
| 5,253,145 A | 10/1993 | Lint |
| 5,274,346 A | 12/1993 | Izu et al. |

(Continued)

*Primary Examiner* — Xuong Chung Trans
(74) *Attorney, Agent, or Firm* — Gazdzinski & Associates, PC

(57) ABSTRACT

A device for electrically interconnecting and packaging electronic components. In one embodiment, a modular non-conducting base member having one or more component recesses and a plurality of lead channels formed therein is provided. At least one electronic component is disposed within the recess, and the wire leads of the component routed through the lead channels to a conductive lead terminal. A plurality of lead terminals, adapted to cooperate with the non-conducting base member, are received therein, and adapted to place the device in signal communication with an external printed circuit board. The modular non-conducting base members are assembled or stacked to form a unitary modular assembly. Methods for fabricating the device are also disclosed.

20 Claims, 43 Drawing Sheets

(56) References Cited

U.S. PATENT DOCUMENTS

| | | |
|---|---|---|
| 5,309,130 A | 5/1994 | Lint |
| 5,455,741 A | 10/1995 | Wai et al. |
| 5,973,932 A | 10/1999 | Nguyen |
| 5,986,894 A | 11/1999 | Lint et al. |
| 6,005,463 A | 12/1999 | Lint et al. |
| 6,225,560 B1 | 5/2001 | Machado |
| 6,395,983 B1 | 5/2002 | Gutierrez |
| 6,540,564 B1 | 4/2003 | Ko |
| 6,585,540 B2 | 7/2003 | Gutierrez |
| 6,593,840 B2 | 7/2003 | Morrison et al. |
| 6,642,827 B1 | 11/2003 | McWilliams et al. |
| 6,660,561 B2 | 12/2003 | Forthun et al. |
| 6,691,398 B2 | 2/2004 | Gutierrez |
| 6,786,772 B1 | 9/2004 | Liu |
| 6,946,942 B1 | 9/2005 | Chih-Min |
| 7,060,611 B1 | 6/2006 | Lin |
| 7,241,181 B2 | 7/2007 | Machado et al. |
| 7,326,084 B1 | 2/2008 | Chen et al. |
| 7,942,700 B2 * | 5/2011 | Gutierrez ........ 439/620.05 |
| 8,496,499 B2 * | 7/2013 | Gutierrez ........ 439/620.01 |
| 2001/0035572 A1 | 11/2001 | Isaak |
| 2003/0030143 A1 | 2/2003 | Wennemuth et al. |
| 2003/0231477 A1 | 12/2003 | Vierow et al. |
| 2004/0150500 A1 | 8/2004 | Kiko |
| 2005/0046534 A1 | 3/2005 | Gilmartin |
| 2005/0068147 A1 | 3/2005 | Skibinski |
| 2005/0282441 A1 | 12/2005 | Murr |
| 2007/0015416 A1 | 1/2007 | Gutierrez |

* cited by examiner

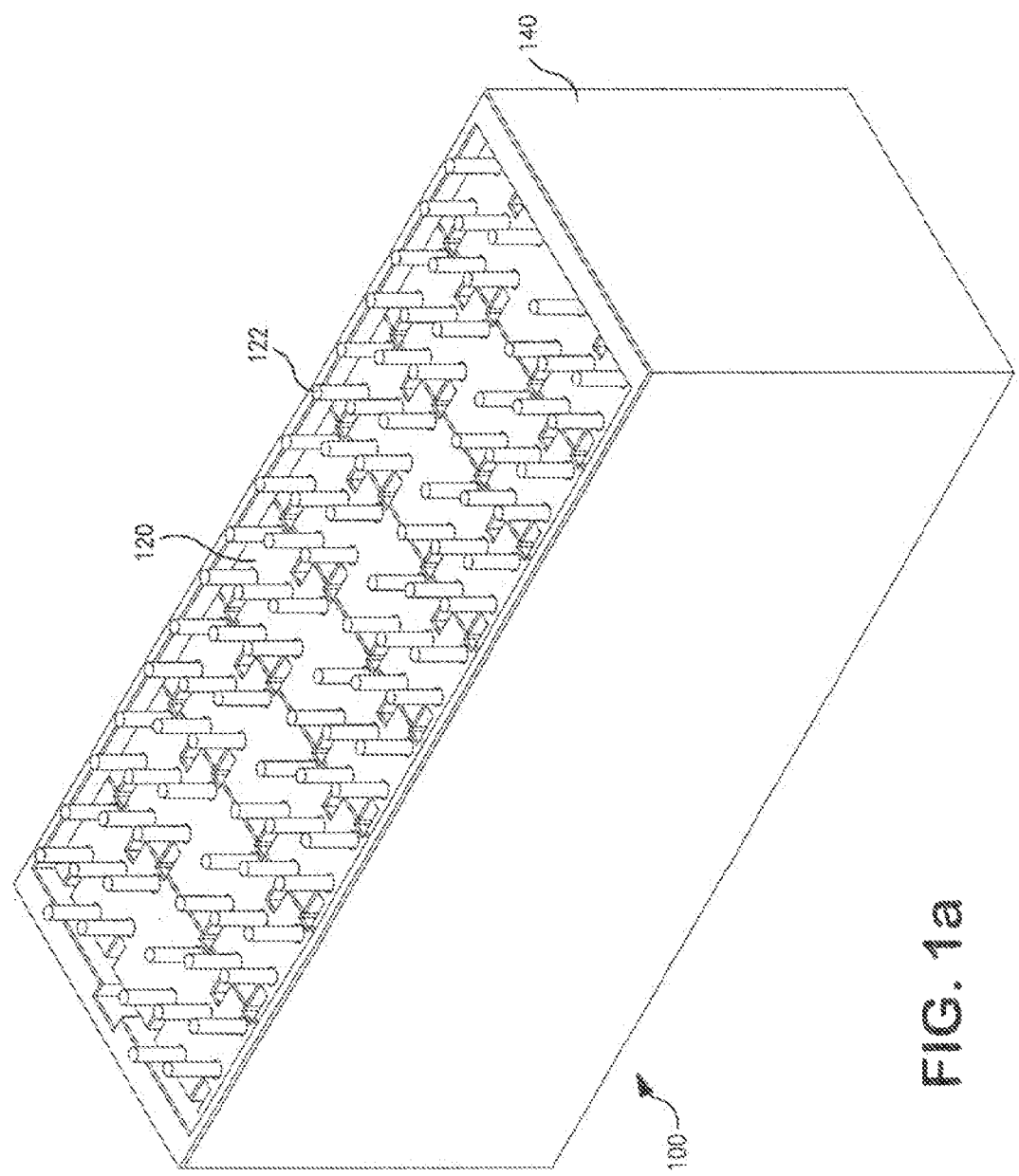

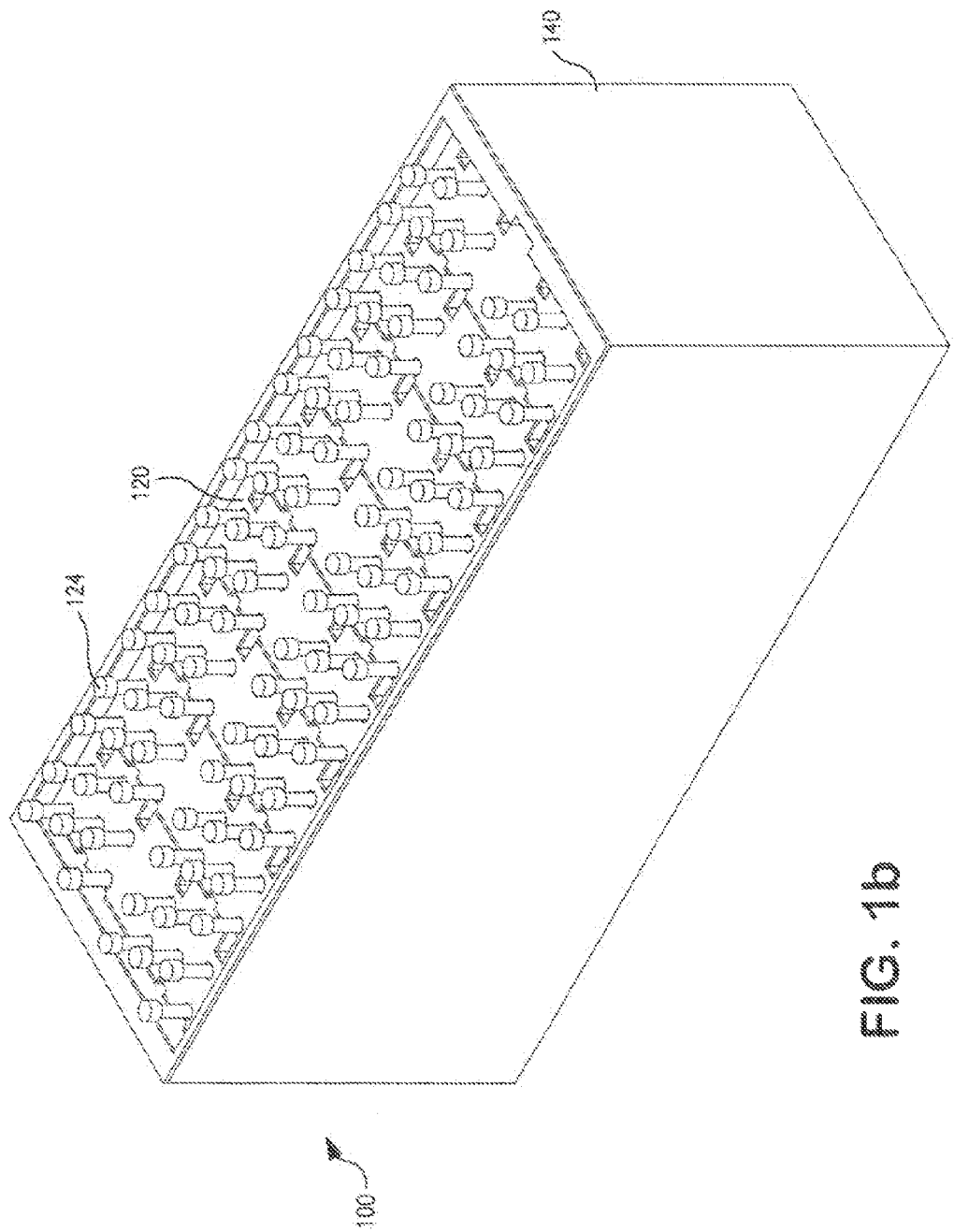

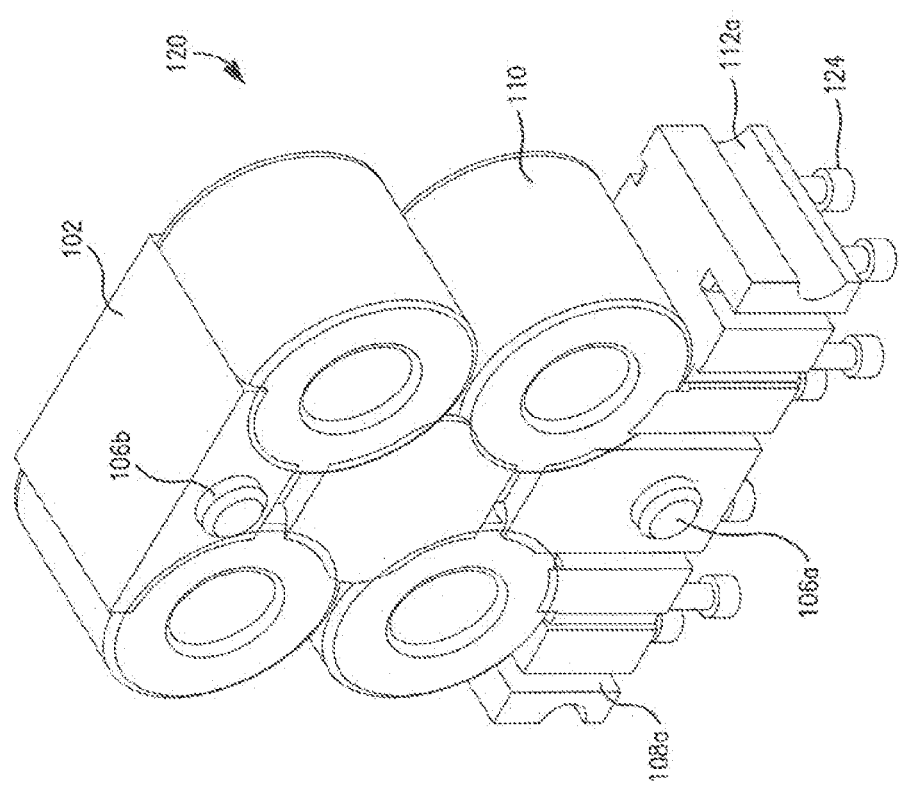

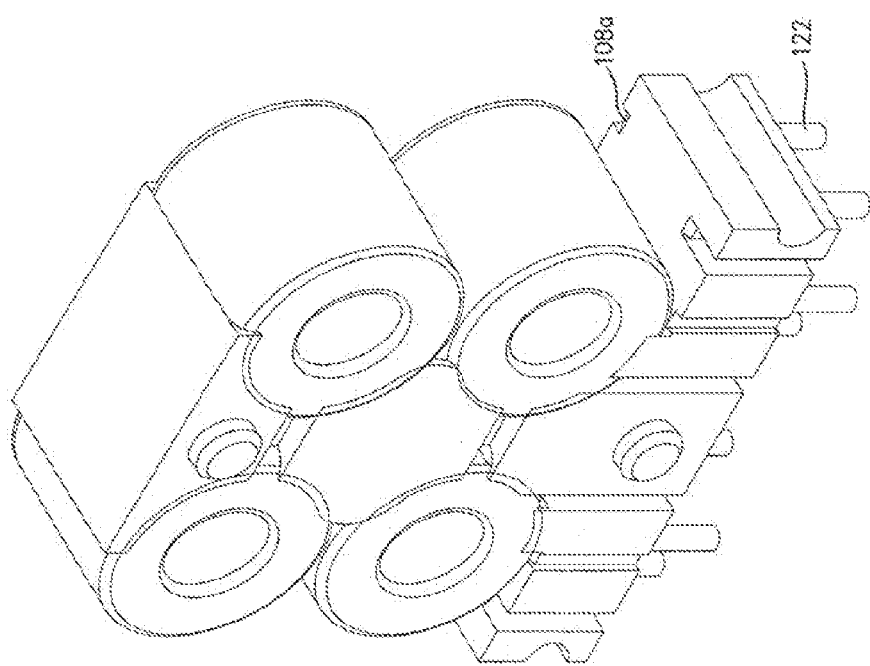

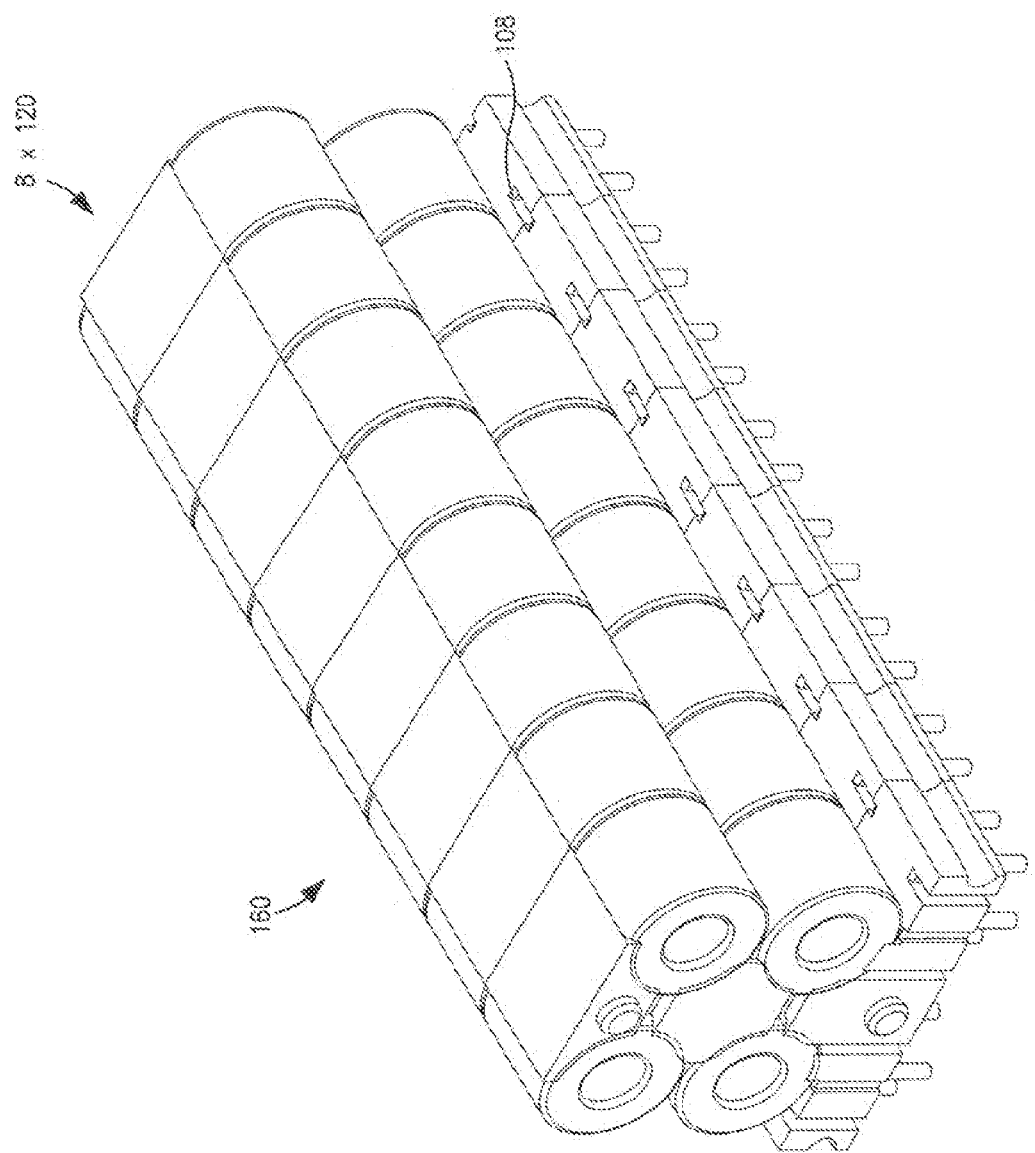

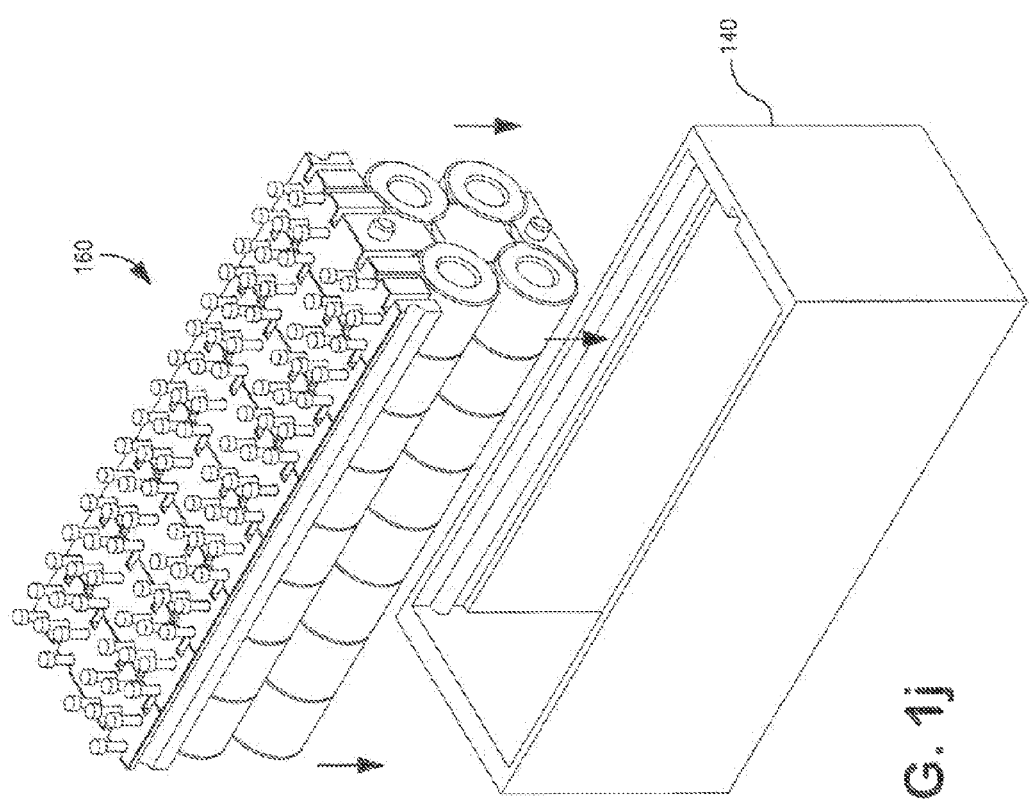

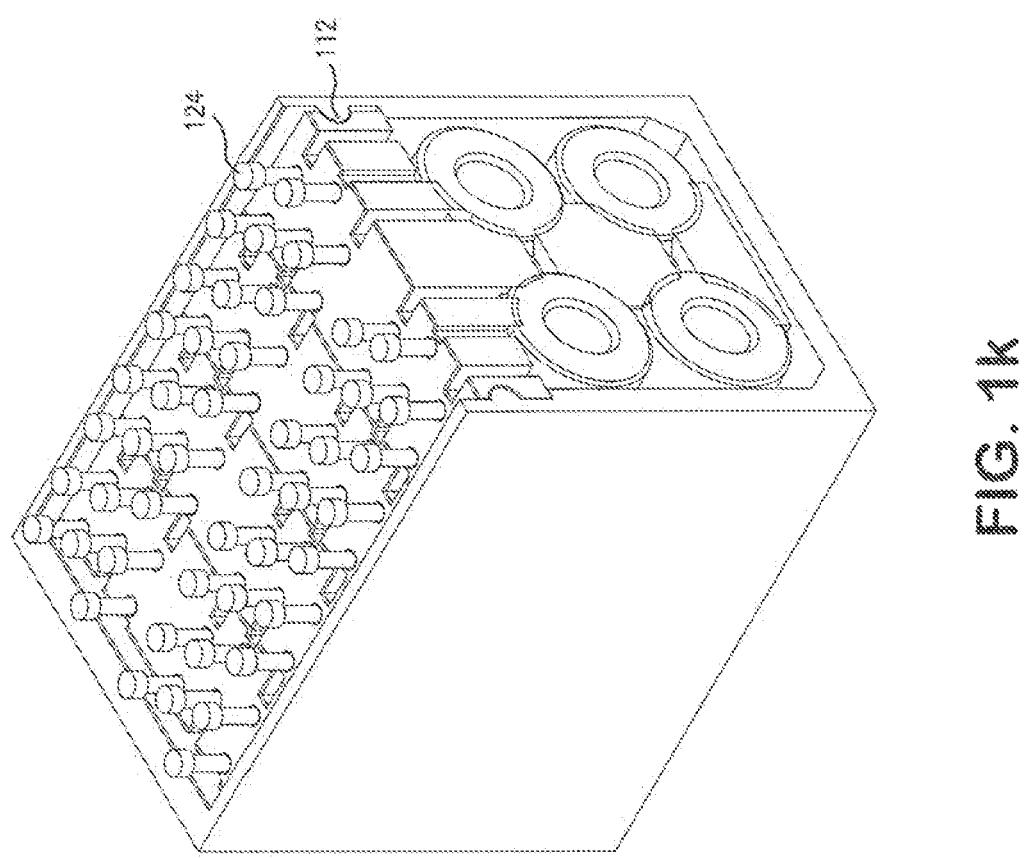

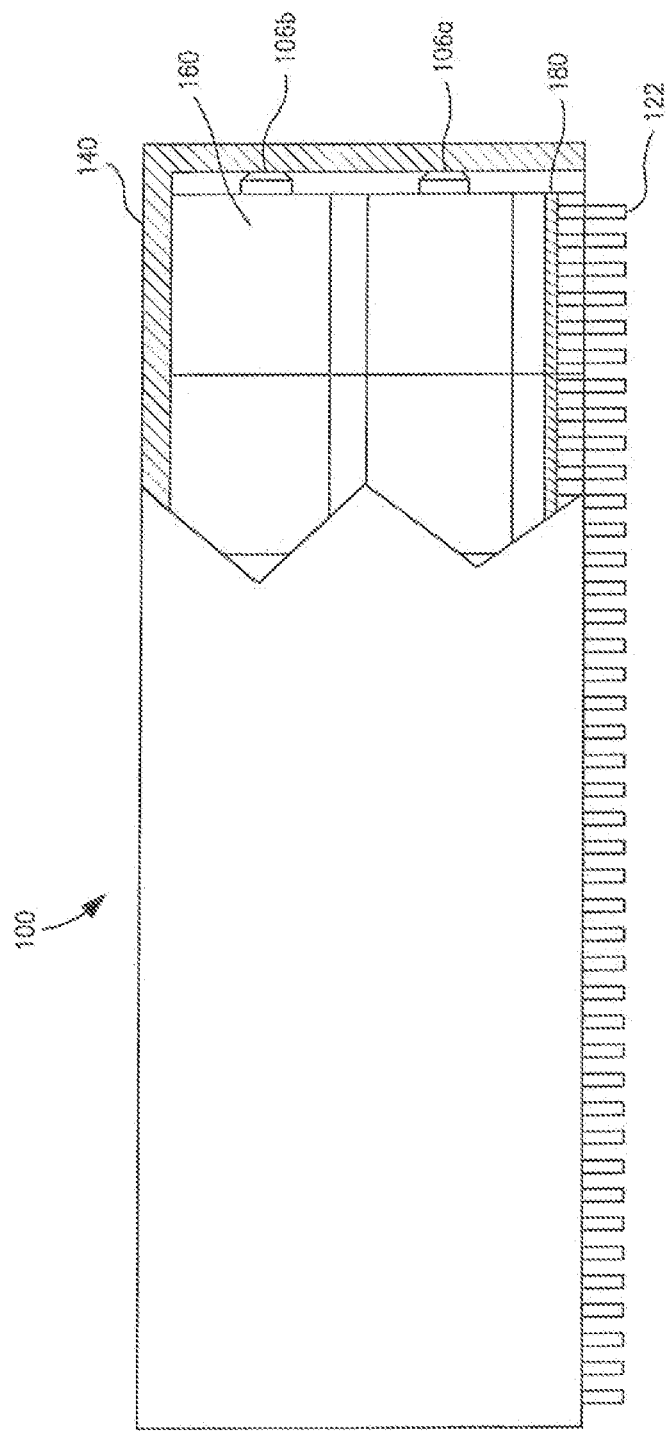

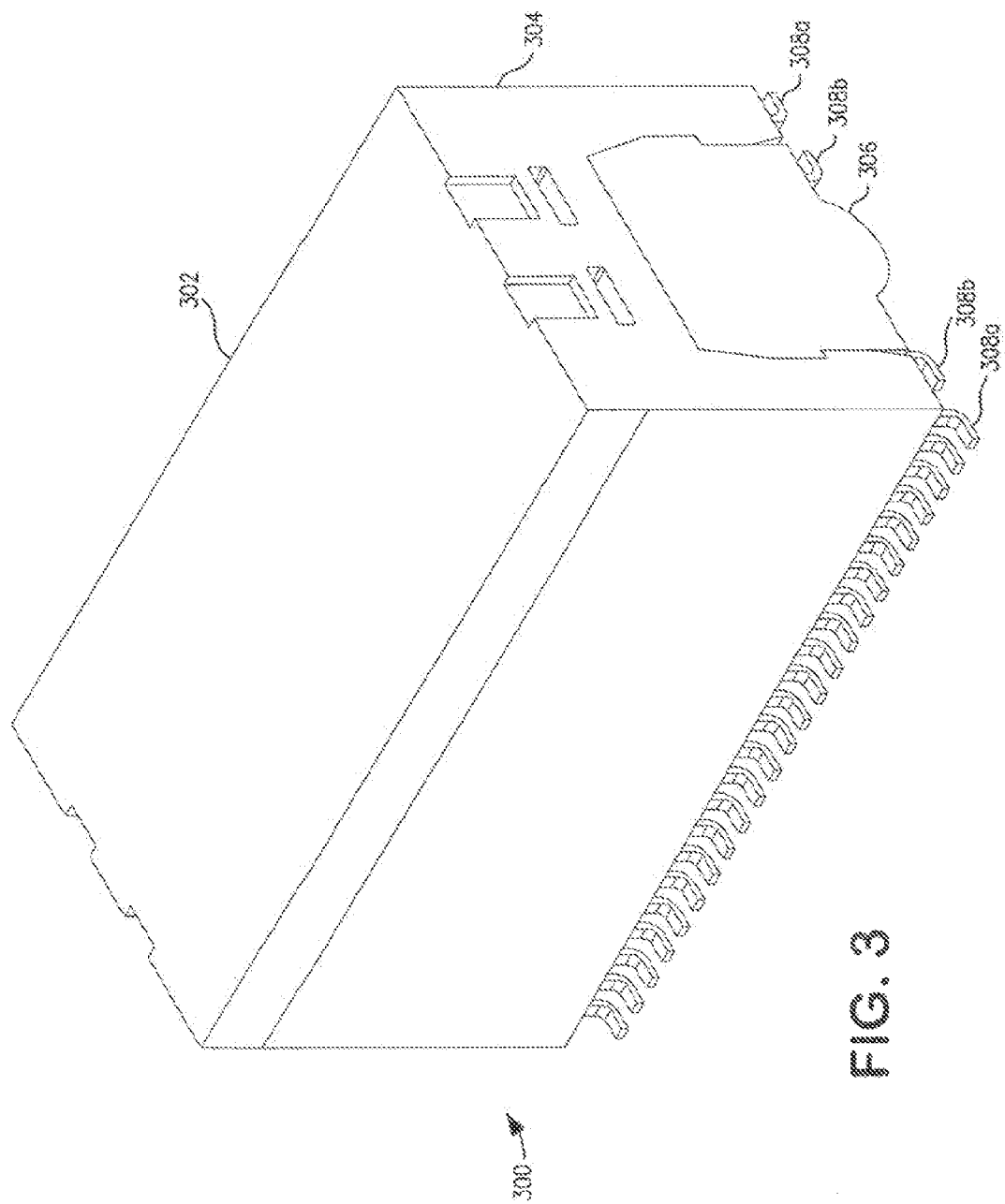

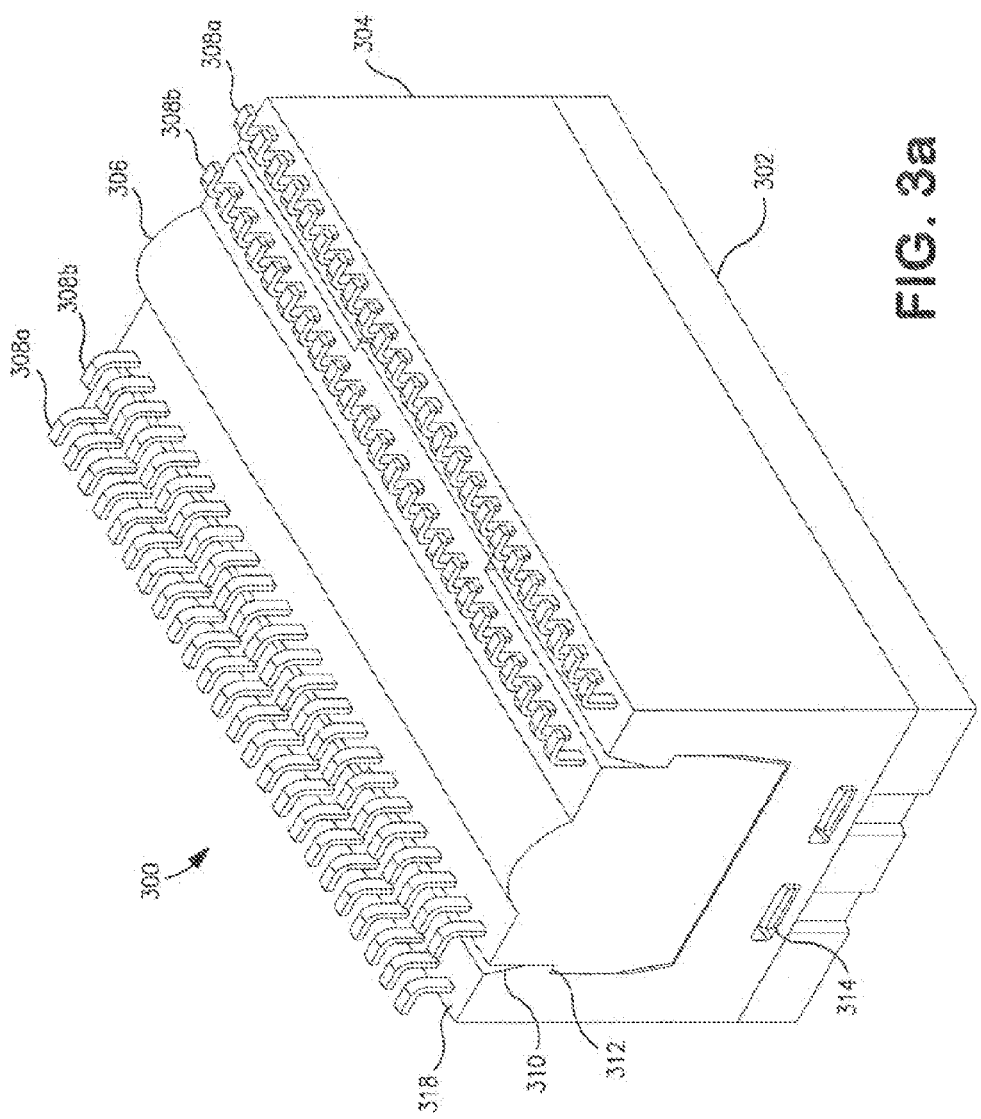

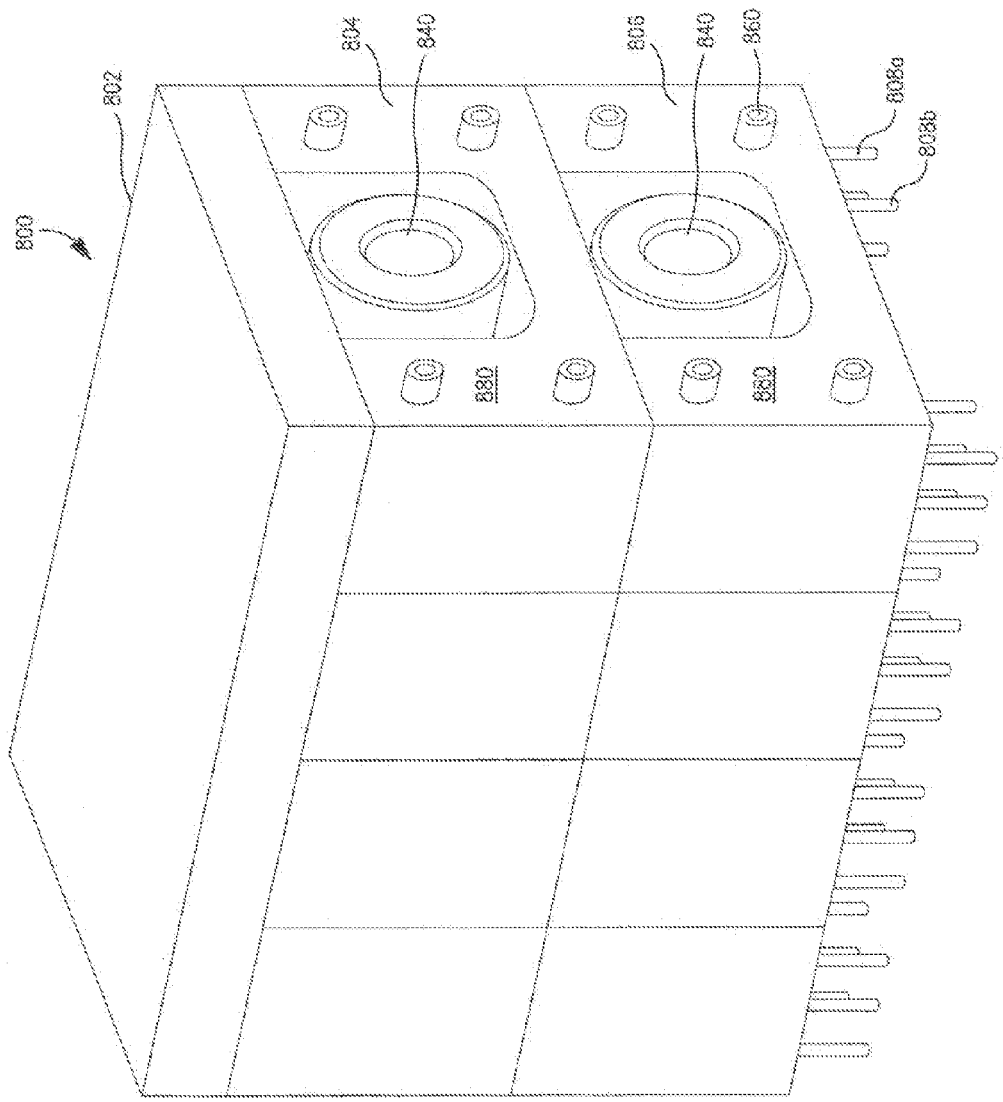

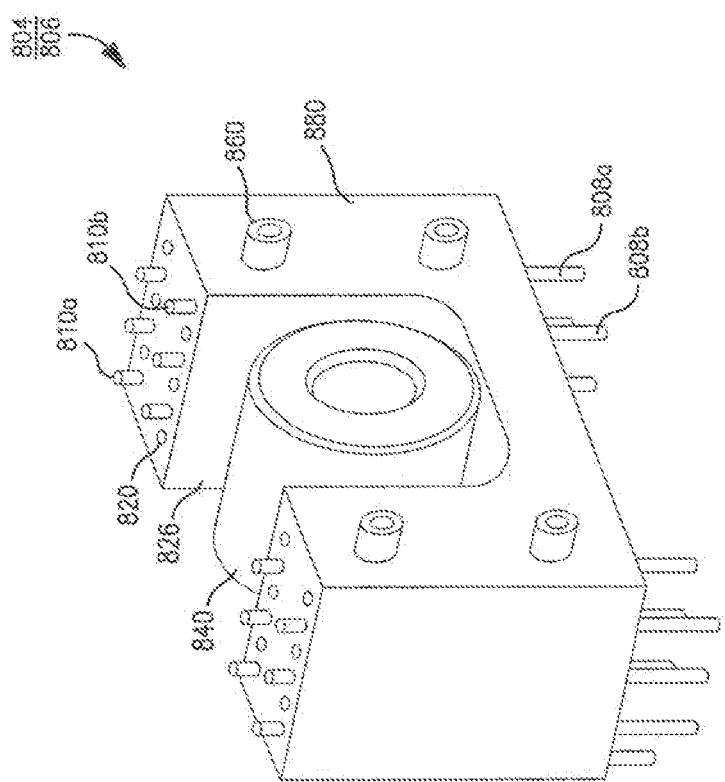

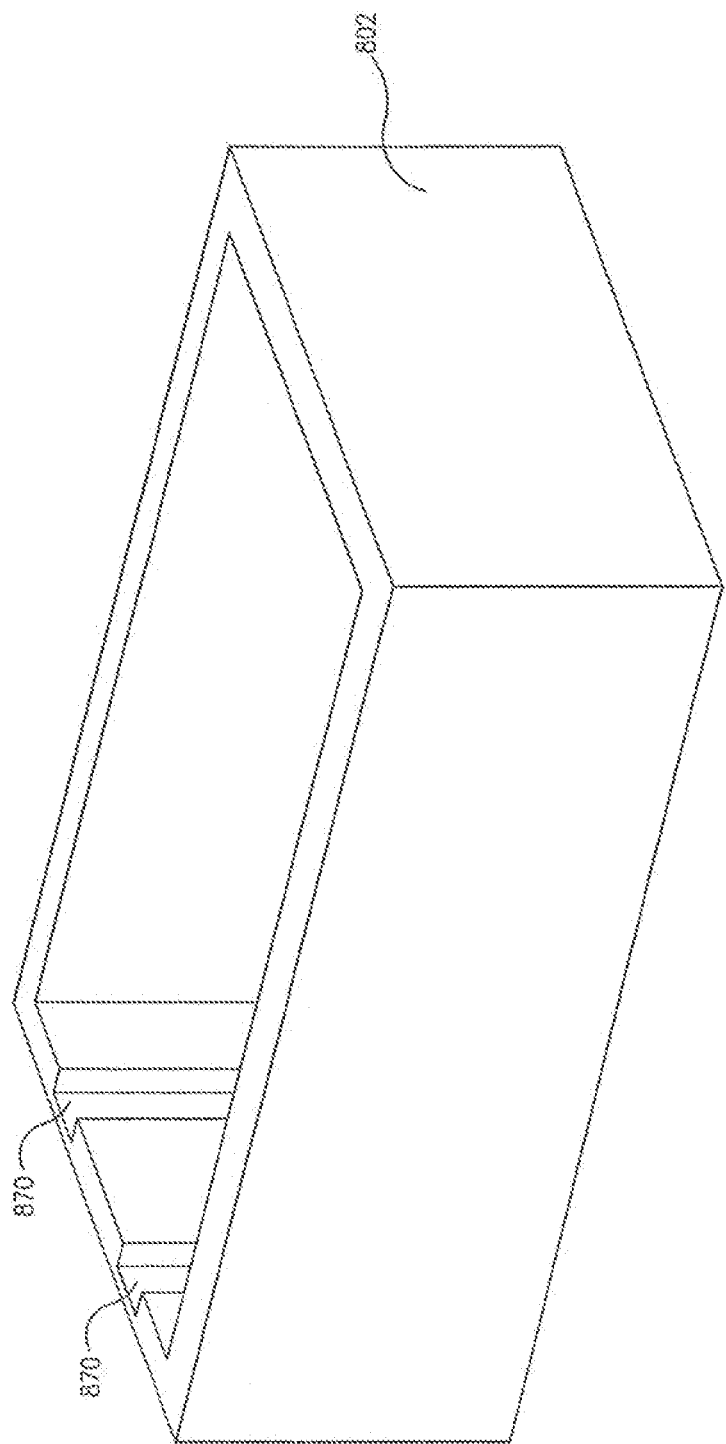

MODULAR ELECTRONIC HEADER ASSEMBLY AND METHODS OF MANUFACTURE

PRIORITY

This application is a continuation of co-owned and co-pending U.S. patent application Ser. No. 11/399,002 filed Apr. 5, 2006 of the same title. This application is also related to U.S. Pat. No. 7,942,700 filed May 10, 2010 of the same title, which is a continuation of U.S. patent application Ser. No. 11/399,002 filed Apr. 5, 2006, each of the foregoing being incorporated herein by reference in their entirety.

FIELD OF THE INVENTION

The present invention relates generally to electrical and electronic elements used in printed circuit board or other applications, and particularly to an improved package and method of packaging microminiature electronic components.

DESCRIPTION OF RELATED TECHNOLOGY

For many years, electronic devices such as circuit boards have been fabricated by interconnecting a plurality of electronic components, both active and passive, on a planar printed circuit board. Typically, this printed circuit board has comprised an epoxy/fiberglass laminate substrate clad with a sheet of copper, which as been etched to delineate the conductive paths. Holes were drilled or formed through terminal portions of the conductive paths for receiving electronic component leads which were subsequently soldered thereto.

So-called surface mount technology has evolved to permit more efficient automatic mass production of circuit boards with higher component densities. With this approach, certain packaged components are automatically placed at pre-selected locations on top of a printed circuit board so that their leads are registered with, and lie on top of, corresponding solder paths. The printed circuit board is then processed by exposure to infrared or vapor phase soldering techniques to reflow the solder and thereby establish a permanent electrical connection between the leads and their corresponding conductive paths on the printed circuit board.

Dual in-line chip carrier packages have existed for many years. The most common example is an integrated circuit, which is bonded to a ceramic carrier and electrically connected to a lead frame providing opposite rows of parallel electrical leads. The integrated circuit and ceramic carrier are normally encased in a black, rectangular plastic housing from which the leads extend. Typically, these dual in-line packages (DIPs) are mounted horizontally, i.e. with the leads extending co-planar with the printed circuit board. Such dual in-line packages have heretofore been attached to printed circuit boards by surface mounting techniques.

Other various techniques have been utilized in the prior art in order to provide more space and cost efficient packaging (and stacking) for microminiature electronic components such as that disclosed in U.S. Pat. No. 5,015,981 to Lint, et al. issued May 14, 1991 and entitled "Electronic microminiature packaging and method", which is incorporated herein by reference in its entirety, discloses an electronic device having a plurality of leads comprises a three dimensional electronic element holder of a non-conducting material having at least one cavity therein and a plurality of lead slots extending from the cavity to a base of the holder, an electronic element mounted in the cavity and having a plurality of leads extending therefrom, a plurality of the leads extending within the slots from the element to the base, and a plurality of lead terminals mounted on the holder and each having one end extending into one of the slots into conducting engagement with a lead and a free end extending outward therefrom.

U.S. Pat. No. 5,212,345 to Gutierrez issued May 18, 1993 entitled "Self leaded surface mounted coplanar header", which is incorporated herein by reference in its entirety, discloses a self leaded header for surface mounting of a circuit element to a PC board comprises a generally box-like support body having a cavity for mounting a circuit element, the support body having a base and a plurality of feet extending downward from the base for supporting the same on a PC board, a plurality of lead support members having a generally spool configuration extending generally horizontally outward from the support body adjacent the base, an inductance coil mounted in the cavity, and a lead extending from the coil to and wound multiple turns around each of the lead support members and disposed for surface bonding to a PC board.

U.S. Pat. No. 5,253,145 to Lint issued Oct. 12, 1993 and entitled "Compliant cantilever surface mount lead", which is incorporated herein by reference in its entirety, discloses a compliant lead structure for mounting a circuit element to a PC board comprising a support body for supporting a circuit element, a plurality of elongated compliant cylindrical conductive lead members secured at an inner end to the support body and extending outward from the support body substantially perpendicular to a mounting plane of a PC board to which the support body is to be mounted and to a position for surface bonding to a PC board, the lead members having an elongated unrestricted section between the inner end and the outer end for enabling relative movement between the support body and a PC board to which the lead member is bonded, and a lead wire extends from a circuit element on the support body and connected to the lead member.

U.S. Pat. No. 5,309,130 to Lint issued May 3, 1994 entitled "Self leaded surface mount coil lead form", which is incorporated herein by reference in its entirety, discloses a self leaded holder for surface mounting of a circuit element to a PC board comprising a generally box-like support body having a cavity for mounting a circuit element, the support body having a base and a plurality of lead support members having a generally spool configuration extending generally horizontally outward from the support body adjacent the base, lead ports extending from the cavity through the sides, an inductance coil mounted in the cavity, and a lead extending from the coil via the lead ports to and wound a partial turn around each of the lead support members and disposed for surface bonding to a PC board.

U.S. Pat. No. 5,455,741 to Wai, et al. issued Oct. 3, 1995 entitled "Wire-lead through hole interconnect device", which is incorporated herein by reference in its entirety, discloses an electronic device comprising a three dimensional electronic element holder of a non-conducting material having at least one cavity in a first surface and a plurality of lead through holes with inlet guides extending from the cavity to a second surface having a circuit thereon, an electronic element mounted in the cavity and having a plurality of leads, a plurality of the leads extending via the through holes from the element to the second surface, and a plurality of lead terminal recesses formed at the second surface for receiving and forming terminal ends and connections of the leads to the circuit on the second surface.

U.S. Pat. No. 6,005,463 to Lint, et al. issued Dec. 21, 1999 entitled "Through-hole interconnect device with isolated wire-leads and component barriers", which is incorporated herein by reference in its entirety, discloses a device for electrically interconnecting the wire leads of various electronic elements within a microminiature package. A non-conducting base member having a plurality of electronic element barriers and wire lead through-holes is provided. The through-holes are generally located within the interior regions of the base element to minimize potentially detrimental field interactions or capacitive coupling between the leads and the external package terminals. During package assembly, the electronic elements are placed within recesses created within the base member by the aforementioned barriers. These recesses and barriers align the elements and help maintain electrical separation and uniformity during manufacturing. The wire leads from two or more elements are interconnected by twisting them together and inserting them into one of the through-holes. The leads are inserted into the through-holes such that they protrude below the bottom surface of the base element, thereby facilitating soldering of all such connections in a single process step. This arrangement reduces manufacturing and labor costs and increases component and overall package reliability.

U.S. Pat. No. 6,225,560 to Machado issued May 1, 2001 and entitled "Advanced electronic microminiature package and method", which is incorporated herein by reference in its entirety, discloses an advanced microelectronic component package incorporating a specially shaped base element which holds and electrically separates the individual conductors associated with the microelectronic component(s) so that the individual conductors may be bonded to external package leads and other conductors within the package. In a first embodiment, jacketed, insulated wire is used as one winding of a toroidal transformer, while unjacketed insulated wire is used as another winding. The jacketing is stripped from the first winding and the exposed conductors are routed into channels along the sides of the base element. The unjacketed conductors are also routed into the same channels, where both conductors are bonded to the external package leads. Raised elements along the sides of the base provide the required electrical separation between the conductors during both manufacture and operation. A method of manufacturing the improved microelectronic package is also disclosed.

U.S. Pat. No. 6,395,983 to Gutierrez issued May 28, 2002 entitled "Electronic packaging device and method", which is incorporated herein by reference in its entirety, discloses a device for electrically interconnecting and packaging electronic components. A non-conducting base member having a component recess and a plurality of specially shaped lead channels formed therein is provided. At least one electronic component is disposed within the recess, and the wire leads of the component routed through the lead channels. A plurality of lead terminals, adapted to cooperate with the specially shaped lead channels, are received within the lead channels, thereby forming an electrical connection between the lead terminals and the wire leads of the electronic component(s). The special shaping of the lead channels and lead terminals restricts the movement of the lead terminals within the lead channels in multiple directions during package fabrication, thereby allowing for the manufacture of larger, more reliable devices. In another aspect of the invention, the device includes a series of specially shaped through-holes are provided within the base member to allow the routing of wire leads there through. The bottom surface of the base member is chamfered to facilitate "wicking" of molten solder up the wire leads during soldering, thereby allowing for a stronger and more reliable joint. A method of fabricating the device is also disclosed.

U.S. Pat. No. 6,540,564 to Ko issued Apr. 1, 2003 and entitled "Connector assembly" discloses a connector assembly mounted on a printed circuit board for mating with the network cable includes a housing configured to two mating ports to receive their complementary connector. A conditioning unit is installed into the housing and disposed between these mating ports, and includes a circuit board having conditioning components and two terminal modules surface mounted thereon. A pair of flexible latching portions is formed on two side edges of the rear side of the housing respectively. And a stopping portion is formed underneath every latching portion and extending a predetermined distance longer than the length of the latching portion. A notch is formed at one edge of the circuit board to be engaged with the latch to fix the conditioning unit in position. The latching portion is easily detached from the notch of the circuit board by a tool to simply any rework or repair process while the stopping portion will restrict and protect the flexible latching portion from being overstressed or over-bending.

U.S. Pat. No. 6,593,840 to Morrison, et al. issued Jul. 15, 2003 entitled "Electronic packaging device with insertable leads and method of manufacturing", which is incorporated herein by reference in its entirety, discloses a device for electrically interconnecting and packaging electronic components. A non-conducting base member having a component recess and a set of specially shaped lead channels formed therein is provided. At least one electronic component is disposed within the recess, and the conductors of the component are routed through the lead channels. A set of insertable lead terminals, adapted to cooperate with the specially shaped lead channels, are received and captured within the lead channels, thereby forming an electrical connection between the lead terminals and the conductors of the electronic component(s). A method of fabricating the device is also disclosed.

U.S. Pat. No. 6,660,561 to Forthun, et al. issued Dec. 9, 2003 and entitled "Method of assembling a stackable integrated circuit chip" discloses a stackable integrated circuit chip package comprising a carrier and a flex circuit. The flex circuit itself comprises a flexible substrate having opposed top and bottom surfaces, and a conductive pattern which is disposed on the substrate. The chip package further comprises an integrated circuit chip which is electrically connected to the conductive pattern. The substrate is wrapped about and attached to at least a portion of the carrier such that the conductive pattern defines first and second portions which are each electrically connectable to another stackable integrated circuit chip package. The carrier is sized and configured to be releasably attachable to the carrier of at least one other identically configured stackable integrated circuit chip package in a manner wherein the chip packages, when attached to each other, are maintained in registry along first and second axes which are generally co-planar and extend in generally perpendicular relation to each other.

U.S. Patent Publication No. 20030030143 to Wennemuth, et al. and published Feb. 13, 2003 entitled "Electronic component with stacked electronic elements and method for fabricating an electronic component" discloses an electronic component which includes stacked electronic elements with external contacts. The external contacts are connected to contact terminal pads of an interconnect layer disposed on an isolating body. This isolating body extends over underlying side edges of a further electronic element, and its interconnect layer is connected to another interconnect layer of the stack via its external contact surfaces.

U.S. Patent Publication No. 20030231477 to Vierow, et al. published Dec. 18, 2003 and entitled "Discrete component array" discloses integrated passive component assemblies utilize array shell or array frame receiving structures to isolate and protect discrete passive components and provide a modular configuration for mounting to a substrate. Receiving structure embodiments include a base portion, spacer ribs, and optional side walls. Spacer ribs may be connected or provided in opposing spacer rib portions to effectively isolate adjacent component terminations. Standoff features may be incorporated into select embodiments of the disclosed technology to aid in device mounting and to facilitate post-affixment cleaning and visual termination contact. Discrete passive components in accordance with the present subject matter may include select combinations of resistors, capacitors, inductors, and other suitable devices.

Despite the foregoing solutions, there exists substantial room for improvement in the area of electronic packaging design. For example, in telecommunications signal conditioning circuits, basic circuit elements such as choke coils, inductors, capacitors, etc. are often repeated in order to handle a multiplicity of incoming data channels. Prior art techniques are unable to efficiently handle manufacturing mistakes or deficiencies in one or more of these channels, and often the entire component must be "scrapped" even though much of the circuit (e.g., multiple channels) functioned as designed. No ability to change the electrical configuration of a component is readily provided under the prior art either.

In addition, "real estate" of the circuit board or other parent device (including sometimes the volume consumed as well as the two-dimensional footprint) is often at a premium in systems where these microminiature devices would be utilized.

It is therefore desirable that an improved package and method of packaging of microminiature electronic components be available that can substantially increase electronic component density, improve modularity to decrease rework and scrap costs, and thereby provide an overall cheaper solution for the end customers purchasing and utilizing these devices.

Such improved solution would also ideally allow the designer to specify varying configurations of planar (footprint) and vertical profile based on their needs for a particular application, while still maintaining the aforementioned benefits of modularity (particularly on a "per-channel" basis).

SUMMARY OF THE INVENTION

The invention satisfies the aforementioned needs by providing, inter alia, an improved modular electronic component package that increases electronic component density, and decreases rework and scrap costs, thereby reducing the cost of the overall solution.

In a first aspect of the invention, a modular filter apparatus is disclosed. In one embodiment, the apparatus comprises: a plurality of substantially separable modular header assemblies capable of interconnecting with one another, each of the modular header assemblies comprising: a non-conductive base member having a cavity formed therein; a plurality of signal conducting elements disposed at least partially within the non-conductive base member; and at least one electronic component at least partially disposed within the cavity. A cover at least partially enclosing the plurality of modular header assemblies is optionally used as well.

In a second embodiment, the modular electronic apparatus comprises: a plurality of substantially unitary modular header assemblies, each of the assemblies comprising: a non-conductive base member having a plurality of cavities formed therein; a plurality of signal conducting elements disposed at least partially within the non-conductive base member; a plurality of recesses forming channels between the cavities and each of the plurality of signal conducting elements; and at least one electronic component at least partially disposed within each of the cavities; and a cover at least partially enclosing the plurality of modular header assemblies. The plurality of modular header assemblies in combination with the cover form a substantially unitary structure.

In a third embodiment, the apparatus comprises: a plurality of substantially unitary modular header assemblies, each of the assemblies comprising: a non-conductive base member having a plurality of cavities formed therein; a plurality of signal conducting elements disposed at least partially within the non-conductive base member; a plurality of recesses forming channels between the cavities and each of the plurality of signal conducting elements; and at least one electronic component at least partially disposed within each of the cavities; and a cover at least partially enclosing the plurality of modular header assemblies. The plurality of modular header assemblies in combination with the cover form a substantially unitary structure.

In a fourth embodiment, the apparatus comprises: a upper modular header assembly, comprising: a base member having a first cavity formed therein; a plurality of signal conducting elements each comprising a surface mounting end and a wire terminating end; and an interlocking feature resident at least proximate to the cavity; and a lower modular header assembly, comprising: a base member having an interlocking feature formed therein and adapted to fit at least partly within the cavity of the upper modular header assembly; a plurality of signal conducting elements having a surface mounting end and a wire termination end; and a second cavity adapted to receive a plurality of electronic components at least partly therein; and a plurality of electronic components, the plurality of electronics placed at least partly in the first cavity and in the second cavity.

In a fifth, the apparatus comprises: a plurality of substantially separable modular header assemblies capable of interconnecting with one another, each of the modular header assemblies comprising: a non-conductive base member having at least first and second substantially co-extensive yet substantially separate cavities formed therein; a plurality of signal conducting elements disposed at least partially within the non-conductive base member; and a plurality of electronic components at least partially disposed within each of the first and second cavities and each in electrical communication with at least one of the signal conducting elements. The header assemblies mate with one another in juxtaposed fashion so that the first cavity of a first one of the plurality of assemblies directly faces the second cavity of a second one of the plurality of assemblies.

In a second aspect of the invention, a method of manufacturing a stacked modular header assembly is disclosed. In one embodiment, the method comprises: forming a plurality of sub-assemblies by at least: forming a plurality of modular header elements; disposing a plurality of conductive members into each of the plurality of modular header elements; disposing at least one electronic component into each of the plurality of modular header elements; placing the at least one electronic component into signal communication with at least a portion of the plurality of conductive members; and stacking a plurality of the sub-assemblies into a substantially unitary modular header assembly. In another embodiment, the method further comprises testing each of the plurality of sub-assemblies prior to the act of stacking to determine conformity with a predetermined specification, and selectively discarding at least one of the sub-assemblies for failing the testing.

In a third aspect of the invention, a method of manufacturing an electronic package is disclosed. In one embodiment, the method comprises: providing a plurality of substantially unitary modular electronic assemblies adapted to fit together in a substantially stacked disposition; testing at least one of the assemblies; and selectively including or excluding the at least one assembly from the package based at least in part on the testing. In one variant, the act of selectively excluding comprises: repairing or reworking at least a portion of the at least one assembly; and subsequently including the repaired or reworked at least one assembly in the package, or another similar package.

In a fourth aspect of the invention, a method of doing business is disclosed. In one embodiment, the method comprises providing substantially modular electronic devices comprising a plurality of electrical channels, the devices being repairable or replaceable on a substantially per-channel basis.

In a fifth aspect of the invention, a modular support element for use in an electronics assembly is disclosed. In one embodiment, the element comprises a substantially non-conductive base element having a plurality of recesses formed therein, the recesses being adapted to receive at least a portion of respective electronic components. The element is further adapted to separably mate with another substantially identical element in front-to-back disposition, each of the elements being associated with a different electrical channel of circuitry within which the assembly is used. In one variant, the electronic components comprise substantially toroidal devices, the recesses being shaped to closely conform with at least a portion of an outer periphery of the substantially toroidal devices, the devices being disposed in a substantially upright orientation within the element so that the devices are also in a front-to-back disposition with respect to other such devices of the another element when both elements are mated.

In a sixth aspect of the invention, a method of attaching and interconnecting a substrate (e.g., PCB) and a device (e.g., modular assembly) is disclosed. In one embodiment, the method comprises using a single-step stencil print process to solder the pins of the assembly to the PCB, and to form a "bump" grid-array interconnect structure on the PCB. The bump grid-array interconnect method offers improved reliability over other prior art techniques (e.g., LGA or Land Grid Array) by increasing the component-to-PCB standoff (or standoff between the assembly and any intermediary component or substrate). It also offers improved manufacturability over an LGA or other such technique, as the bumps are essentially "pre-tinned" and easy to solder.

In a seventh aspect of the invention, a modular electronic apparatus for mounting onto an external substrate is disclosed. In one embodiment, the modular electronic apparatus includes a multi-layer printed circuit board having a first layer comprised of surface mountable conductive interfaces and a second layer comprised of a plurality of ball-grid array conductive interfaces. The apparatus further includes substantially identical modular headers comprised of a non-conductive base member having an electronic component receiving cavity formed therein, surface-mountable signal conducting elements disposed at least partially within the non-conductive base member on a bottom surface thereof and a cover at least partially enclosing the modular headers. An interior surface of the cover is configured to mate with one or more respective top surfaces of the modular headers. Electronic components are also disclosed that are at least partially disposed within the electronic component receiving cavities of the modular headers. At least one of the electronic components comprises a wire having two ends that are wire wrapped around respective ones of at least a portion of the surface-mountable signal conducting elements. At least a portion of the surface-mountable signal conducting elements is soldered to the first layer of the multi-layer printed circuit board.

BRIEF DESCRIPTION OF THE DRAWINGS

The features, objectives, and advantages of the invention will become more apparent from the detailed description set forth below when taken in conjunction with the drawings, wherein:

FIG. 1a is a bottom perspective view of a first exemplary embodiment of the modular assembly of the invention.

FIG. 1b is a bottom perspective view of a second exemplary embodiment of the modular assembly of the invention.

FIG. 1d is a perspective view showing the modular header element of FIG. 1c, used in the context of the assembly of FIG. 1b and populated with electronic components.

FIG. 1f is a perspective view showing a modular header assembly utilized in the device embodiment of FIG. 1a.

FIG. 1g is a front elevational view showing the modular header assembly of FIG. 1f.

FIG. 1i is a perspective view showing a plurality of modular header assemblies of the type shown in FIGS. 1f and 1g assembled as a multi-header modular assembly.

FIG. 1j is a bottom perspective view showing the multi-header modular assembly of FIG. 1i being inserted into the outer case of FIG. 1h.

FIG. 1k is a bottom perspective sectional view showing the interlocking of the multi-header modular assembly and outer case.

FIG. 1l is a side elevational, partial sectioned view showing the header modular assembly and outer case of FIG. 1a with a printed circuit board installed.

FIG. 3 is a perspective view of a first embodiment of a vertically stacked header assembly according to the principles of the present invention.

FIG. 3a is a bottom perspective view of the first embodiment of a vertical stacked header assembly of FIG. 3.

FIG. 3b is a perspective view of a first embodiment of a lower header element as shown in FIGS. 3 and 3a.

FIG. 3c is a perspective view of a first embodiment of an upper header element with the lower vertical header installed as shown in FIGS. 3 and 3a.

FIG. 5b is a perspective view of a third embodiment of a lower header as shown in FIGS. 5 and 5a.

FIG. 5c is a perspective view of a third embodiment of an upper header as shown in FIGS. 5 and 5a.

FIG. 8b is a perspective view of a second embodiment of a mixed modular header assembly according to invention.

FIG. 8c is a perspective view of an exemplary modular header element (with component(s)) utilized in the embodiments of FIGS. 8a and 8b.

FIG. 8f is a perspective view of a first embodiment of a cover utilized with the mixed modular header assembly shown in FIG. 8d.

FIG. 9 is a logical flow diagram illustrating one exemplary embodiment of the method of manufacturing the mixed modular header assembly of FIG. 8a.

DETAILED DESCRIPTION OF THE EXEMPLARY EMBODIMENTS

Figure 1C:
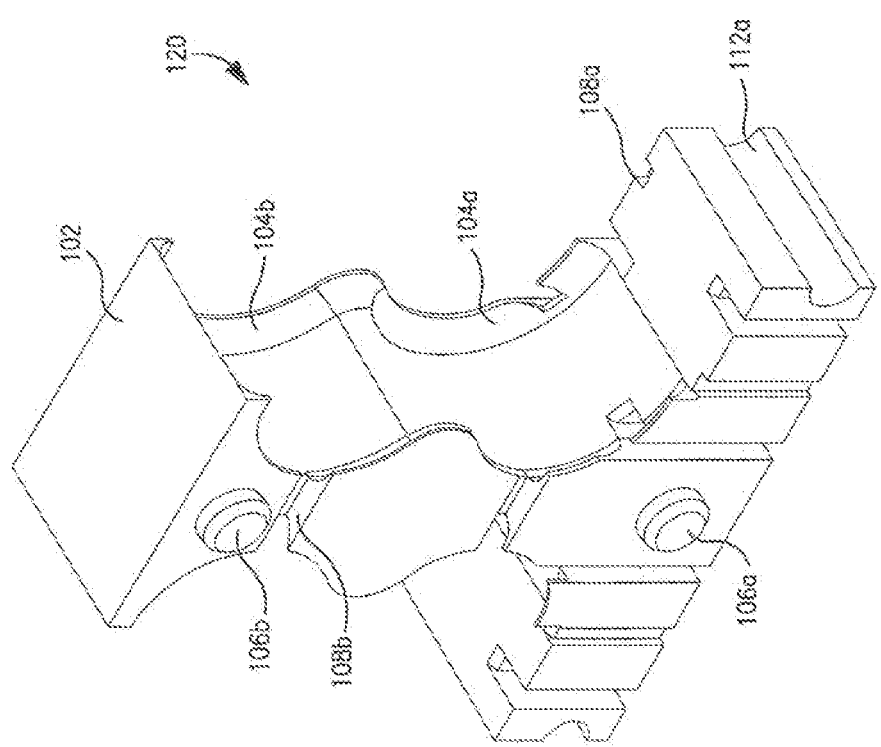
FIG. 1c is a perspective view of one embodiment of a modular leadless header element utilized in the assemblies of FIGS. 1a and 1b.

Reference is now made to the drawings wherein like numerals refer to like parts throughout.

As used herein, the term "signal conditioning" or "conditioning" shall be understood to include, but not be limited to, signal voltage transformation, filtering and noise mitigation or elimination, current limiting, sampling, signal processing, and time delay.

As used herein, the terms "electrical component" and "electronic component" are used interchangeably and refer to components adapted to provide some electrical or electronic function, including without limitation inductive reactors ("choke coils"), transformers, filters, gapped core toroids, inductors, capacitors, resistors, operational amplifiers, and diodes, whether discrete components or integrated circuits, whether alone or in combination, as well as more sophisticated integrated circuits such as SoC devices, ASICs, FPGAs, DSPs, RCFs, etc. For example, the improved toroidal device disclosed in Assignee's co-owned U.S. Pat. No. 6,642,827 entitled "Advanced Electronic Microminiature Coil and Method of Manufacturing" filed Sep. 13, 2000, which is incorporated herein by reference in its entirety, may be used in conjunction with the invention disclosed herein.

As used herein, the terms "circuit board" and "printed circuit board" are used generally to refer to any substrate or other structure that has one or more electrical pathways associated therewith. Such boards may comprise, without limitation, single-layer boards, multi-layer boards, flexible (flex) boards, or even paper or other substrates having one or more circuit traces disposed thereon or therein.

As used herein, the term "network" refers generally to any type of telecommunications or data network including, without limitation, data networks (including MANs, WANs, LANs, WLANs, PANs, internets, and intranets), wireless and Radio Area (RAN) networks, hybrid fiber coax (HFC) networks, satellite networks, and telco networks (including ADSL or the like). Such networks or portions thereof may utilize any one or more different topologies (e.g., ring, bus, star, loop, etc.), transmission media (e.g., twisted pair (TP), wired/RF cable, RF wireless, millimeter wave, optical, etc.) and/or communications or networking protocols (e.g., Ethernet, Gigabit Ethernet, 10-Gig-E, SONET, DOCSIS, ATM, X.25, Frame Relay, etc.).

As used herein, the terms "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, and application-specific integrated circuits (ASICs). Such digital processors may be contained on a single unitary IC die, or distributed across multiple components.

As used herein, the term "integrated circuit (IC)" refers to any type of device having any level of integration (including without limitation ULSI, VLSI, and LSI) and irrespective of process or base materials (including, without limitation Si, SiGe, CMOS and GAs). ICs may include, for example, memory devices (e.g., DRAM, SRAM, DDRAM, EEPROM/Flash, ROM), digital processors, SoC devices, FPGAs, ASICs, ADCs, DACs, transceivers, memory controllers, and other devices, as well as any combinations thereof.

As used herein, the term "memory" includes any type of integrated circuit or other storage device adapted for storing digital data including, without limitation, ROM, PROM, EEPROM, DRAM, SDRAM, DDR/2 SDRAM, EDO/FPMS, RLDRAM, SRAM, "flash" memory (e.g., NAND/NOR), and PSRAM.

Overview—

In one salient aspect, the present invention provides an improved and highly modular electronic device suitable for any number of applications including, e.g., surface-mount telecommunications signal conditioning applications. Basic circuit elements such as choke coils, inductors, capacitors, etc., that are often repeated in order to handle a multiplicity of incoming data channels are, in the exemplary embodiment of the invention, disposed in substantially modular and separable support elements. This modular "per-channel" approach allows for efficient and effective handling manufacturing mistakes or deficiencies in one or more of these channels, thereby obviating the scrapping of the entire component even though much of the circuitry (e.g., multiple channels) function as designed. The use of multiple substantially identical sub-assemblies for each channel also enhances manufacturing efficiency (through mass production of multiple identical assemblies).

In addition, the "real estate" of the circuit board or other parent device (including the overall volume consumed as well as the two-dimensional footprint) is optimized in the present invention, since: (i) the toroids or other electronic components are space-efficiently stacked in a horizontal and/or vertical disposition to provide maximal density while maintaining a high degree of electrical performance; and (ii) the use of horizontal and/or vertical stacking allows for customizing the device so as to fit a footprint and/or vertical profile restriction.

The various embodiments of the invention provide a number of other desirable features and advantages as well. In one aspect, the modular design of the invention enables substantially simplified production of 1-channel to n-channel devices using the same sub-assemblies.

Additionally, the electronic component (e.g., toroidal coil) arrangement within the device, combined with the mechanical design, enables a very compact footprint while also providing a very short terminal (e.g., pin) length and short component lead length, thereby also providing excellent electrical noise (e.g., EMI) performance.

Furthermore, fine-pitch pins or terminals can also be redistributed into a larger-pitch (e.g., "bump" array) if desired, thereby, inter alia simplifying manufacturing and any subsequent bonding processes.

Passive or active circuit components can also be readily added to the assembly using this modular approach; such as where these passive or active components are disposed in a modular header that is simply mated to one end of the existing assembly (as opposed to the prior art where a whole new device would need to be designed and fabricated, or the added components added external to the header).

The header assembly of the invention also advantageously allows for the conversion of a through-hole mounted device to a surface-mount device, and also provides for a highly coplanar interconnect to a motherboard or other external device to which the modular assembly is mounted. The CTE (coefficient of thermal expansion) of the assembly may also be matched to that of the motherboard/external device, thereby yielding a high-reliability assembly.

Easy manufacturing is also facilitated, such as through use of a panelized PCB assembly process).

Modular Header Assembly and Methods—

Referring now to FIG. 1a, a first embodiment of the modular header assembly device 100 according to the principles of the present invention is shown. The device 100 comprises an outer case 140, a plurality (e.g. eight (8)) of modular header support assemblies 120 each of which utilize twelve (12) straight conductive pins 122. The device 100 of FIG. 1a therefore has a total of ninety-six (96) signal conducting straight pins 122. The pins 122 can either be utilized for through-hole applications, i.e. wherein the pins are received through corresponding apertures or recesses of a printed circuit board or similar device, or alternatively could be specifically adapted for surface mounting applications (as shown in embodiments discussed subsequently herein). In one variant of the latter mentioned surface mounting applications, the pins 122 may be placed into soldering fixtures which deposit a small semi-spherical ball or "bump" of solder at the tip of each pin 122. The device 100 then may be mounted on an end customer printed circuit board in a ball-grid array ("BGA") fashion. The latter BGA-like configuration is exemplary as it reduces lead lengths of the pins 122 and resultant inductances of the leads, thereby promoting less signal distortion at high frequencies than similar through-hole mounted configurations.

Referring now to FIG. 1b, a second embodiment of the microminiature packaging device 100, generally similar to the device as shown in FIG. 1a is disclosed. The device 100 shown in FIG. 1b utilizes a spool head at the end of each pin 124, thereby providing more surface area and increasing the bond strength of the terminal array connection.

As is best illustrated in FIG. 1c, an exemplary embodiment of a modular header support elements 102 utilized in the embodiments of FIGS. 1a and 1b is shown. Each element 102 generally comprises a polymer material such as a high-temperature thermoset or thermoplastic polymer. The element 102 is advantageously manufactured by an injection-molding process, although other processes such as e.g., transfer molding or machining can be used if desired. The benefits of injection-molding are well understood in the polymer processing arts, and as such will not be discussed further herein. In one exemplary configuration, the element 102 is manufactured from a liquid crystal polymer ("LCP"), such as that manufactured by RTP® Corporation. LCP is exemplary as it has a high heat deflection temperature when reinforced with glass fiber, and shows excellent dimensional stability at high temperatures (which is desirable if the component is to be used in standard manufacturing processes such as IR or vapor-phase reflow, wave soldering, and the like). In another exemplary embodiment, the element 102 comprises a high temperature phenolic, such as that manufactured by the Sumitomo Co. which exhibits similar high temperature properties to LCP while generally being of a lower cost than LCPs.

The modular header element 102 generally comprises a plurality of cavities 104, for receiving electronic components such as wire wound toroidal components. While these cavities 104 are shown placing electronic components, such as wound toroids, in a generally vertical orientation, it is appreciated that these cavities could alternatively be placed in a horizontal, or any other position for that matter, depending on the design constraints of the final design and the particular dimensions and features of the electronic components themselves. However, the illustrated vertical orientation is exemplary in many telecommunications applications, as this configuration minimizes "X-Y" real estate on the customer's main printed circuit board (and similarly the pitch of the pins) when utilizing standard 0.140" diameter toroidal coils. A plurality of wire routing cavities 108a are specifically adapted to route wire or leadframe to leads (leads not shown) or from cavity to cavity 108b. The length of these cavities 108a, 108b can also be adjusted to meet creepage and clearance requirements for supplementary insulation requirements if desired.

Figure 1E:
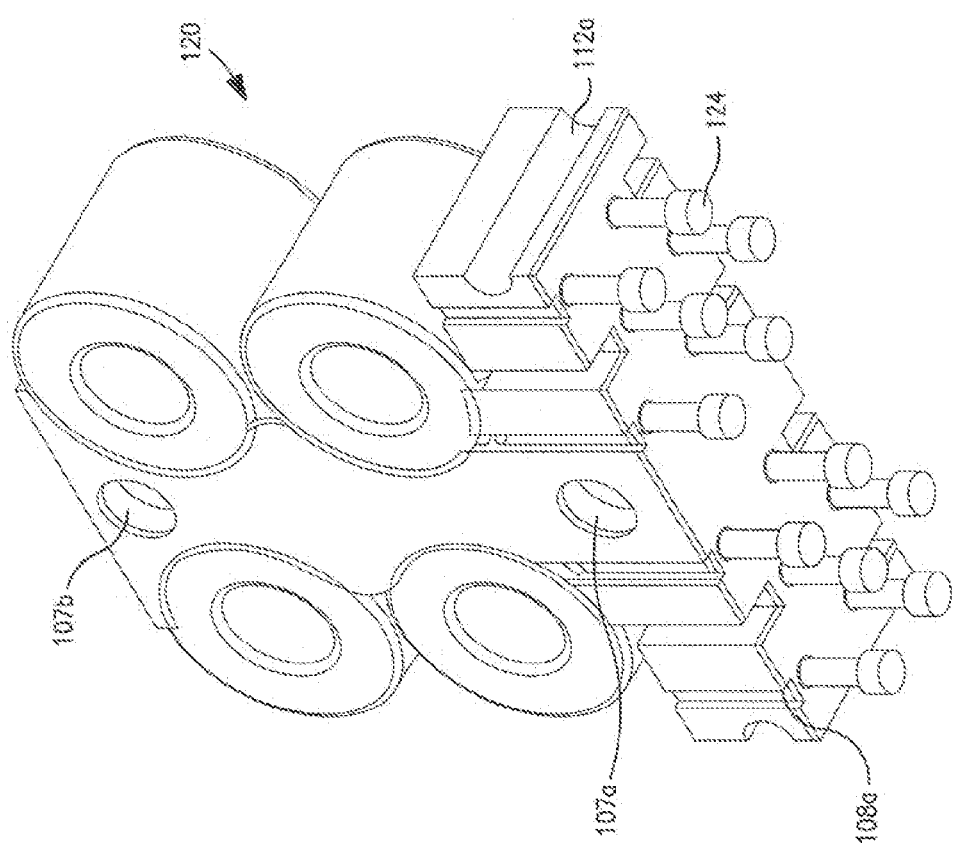
FIG. 1e is a bottom perspective view showing the header assembly of FIG. 1d.
Figure 19:
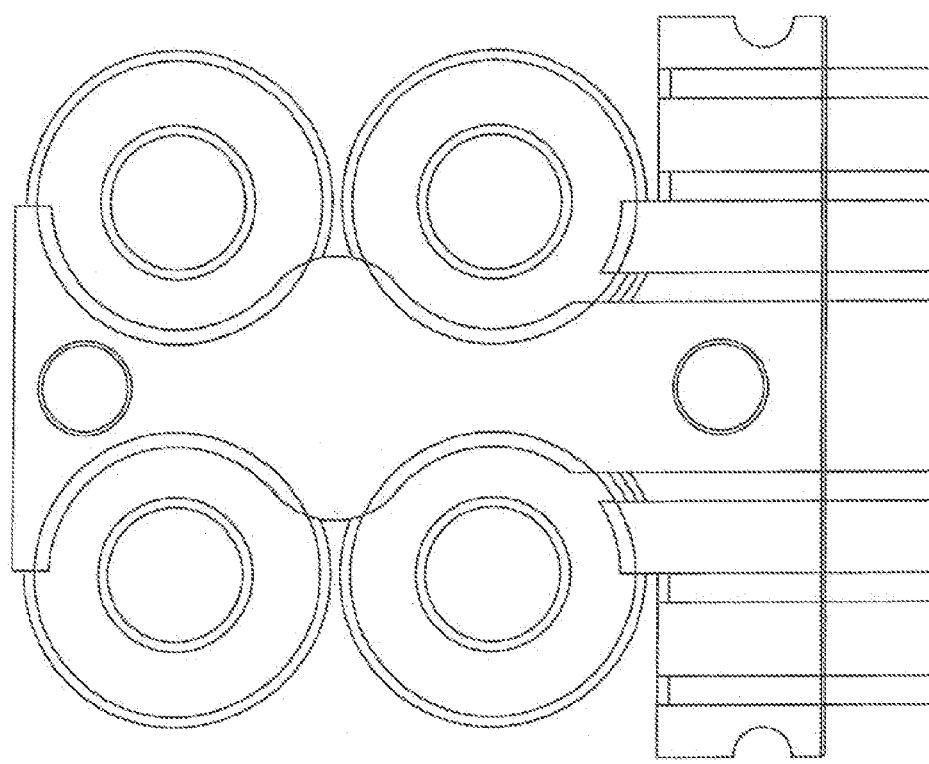

Exemplary posts 106a, 106b are used on the elements 102 so that a plurality of the support elements may be stacked in horizontal succession. These posts 106 engage respective holes or recesses placed on the back side of a second adjacent modular header element 102. As is best shown in FIG. 1e, cavities 107a, 107b are adapted to mate with respective posts 106a, 106b when the modular header assemblies 120 are "stacked" horizontally. These posts may engage with their respective holes 107 via a sliding or frictional fit or alternatively may contain retention features that allow the modular header elements 102 to engage and lock with one another, such as a ridge- and groove "snap" fit, use of tabs, or any number of other well known techniques for selectively engaging and disengaging two components. While generally shown as a post formed in, inter alia, the non-conductive element 102, these posts could alternatively be formed as a separate structure and could even be made electrically conductive if desired. Further, although a post shape is shown, other shapes and configurations could be used if desired, such as cantilever snaps, the main purpose being to interconnect two or more modular header assemblies 120.

The snap guide channels 112*a* of each header element 102 are positioned to engage with a respective snap feature 112*b* on the case 140, such as the case shown in FIG. 1*h* discussed subsequently herein. Chamfers and fillets of the type known in the art are also optionally utilized throughout the design (e.g. on cavities 108*a*, posts 106*a*, etc.) to minimize the possibility of cutting or chafing the mounted components (e.g. wires on a wire wound toroid) when assembling the signal conditioning component.

An exemplary embodiment of a modular header element utilizing spool head leads 124 is shown in FIG. 1*d*. This embodiment is utilized in the device 100 shown in FIG. 1*b*, although it can obviously be adapted for any number of other configurations such as for example that of FIG. 1*a*. The exemplary modular header element 102 is designed to accommodate four (4) toroidal coils 110, although it is appreciated that any desired number may be utilized (such as e.g. 6 or 8). The depth (horizontal dimension) of one or more of the elements 102 can also be varied, such as to accommodate two rows of toroids or other components.

In the embodiment of FIG. 1*d*, a four-coil design is chosen because the circuit utilized requires the use of four coils 110 per transmit/receive channel. As modular header support elements 120 are "stacked" horizontally, the number of channels desired can then be chosen for any given application. For example, a modular header element 102 can be stacked with seven (7) additional modular header housings 102 in order to form an eight (8) channel device such as that shown in FIG. 1*b*.

Modularizing the device package in this way has many manufacturing and other advantages over prior art approaches. By representing each modular header assembly 120 as a single channel within an electrical design, each individual assembly can be independently tested, and each modular channel that does not meet electrical specification can be replaced, reworked, or scrapped. Because manufacturing defects can be isolated to a single channel, an entire device (e.g. an eight channel device) does not need to be scrapped merely because there was a manufacturing defect in one of the channels. This greatly improves overall manufacturing efficiency and lowers device 100 manufacturing costs.

In the modular header embodiment shown in FIG. 1*d*, wires are routed from cavity to cavity in order to form a signal pathway between the coils 110 and respective ones of the spool head signal pins 124. After each wire has been routed and wrapped to (or otherwise communicated with) its respective terminal pin 124, the entire assembly 120 is suited for termination according to any number of techniques such as, e.g., a mass-termination technique such as wave soldering. Furthermore, the methods and apparatus of U.S. Pat. No. 5,973,932 to Nguyen issued Oct. 26, 1999 entitled "Soldered component bonding in a printed circuit assembly", incorporated herein by reference in its entirety, can be utilized consistent with the invention to provide enhanced solder performance such as where, e.g., multiple boards or solder processes are used.

Also, in the embodiment shown in FIGS. 1*d* and 1*e*, twelve (12) signal conducting pins 124 are used. It will be appreciated that more or fewer pins may be utilized depending on the desired design constraints. In addition, while the terminal pins 124 may be either insert molded (i.e., in the plastic mold during the injection molding process) or post-inserted (i.e. after the modular header element 102 has been manufactured), it is generally considered a more cost effective process to post-insert the pins 124 after the element 102 has been formed. However, in certain applications and/or with certain manufacturing equipment it may be desired to insert mold these pins directly into the header base, or bond them using yet another technique. Hence, the present invention contemplates literally any suitable approach for maintaining the pins in a substantially fixed position with respect to the support element(s) 102.

The signal conducting terminals 124, while shown utilizing a generally round cross-sectional shape, may be utilized in any number of cross-sectional shapes (including without limitation square, rectangular, triangular, polygonal, e.g., hexagonal, oval or elliptical, and so forth) depending on the particular needs of the application. The round cross-section is readily manufactured from standard gauge copper or copper alloy round wire (e.g., 26AWG, etc.). Other cross sectional shapes are prevalent as well, such as square or rectangular cross-sections, which have can advantages over round pins because of there sharp edges which can be utilized by an operator to terminate wire that is being wrapped on to the respective pin.

In yet other alternative embodiments utilizing the aforementioned post-insertion process (i.e. the pins 124 are inserted into the modular header element 102 after the element 102 has been manufactured), other cross sectional shapes such as hexagonal cross sections have advantages in terms of pin retention strength and pin insertion yield (i.e. by reducing the amount of modular header support elements 102 that are cracked during the pin insertion process). The large number of variations and tradeoffs for the selection of signal conducting pins 124 are well understood in the art, and as such will not be discussed further herein. For example, FIG. 1*f* shows a configuration that is utilized in the device 100 of FIG. 1*a*, and is generally well-suited for either through-hole or surface mounted configurations.

It is also noted that in the embodiments shown in FIGS. 1*c*-1*g*, each channel 108*a* corresponds to a respective pin 122, 124 such that the number of pins and the number of channels is equal. However, it is also envisioned that other embodiments may change this ratio of channels 108*a* to pins 122, 124 so as to be greater or less than parity. Also, while each of these pins 122, 124 is utilized in the illustrated configurations as a signal conducting path (or alternatively ground so that materials and labor are minimized), it is appreciated that one or more of these pins 124 may have no electrical or conductive function within the device without adversely affecting the electrical performance of the device. For example, these unused terminals might comprise installed spares, areas for future expansion, mechanical stabilizers, etc.

Figure 1H:
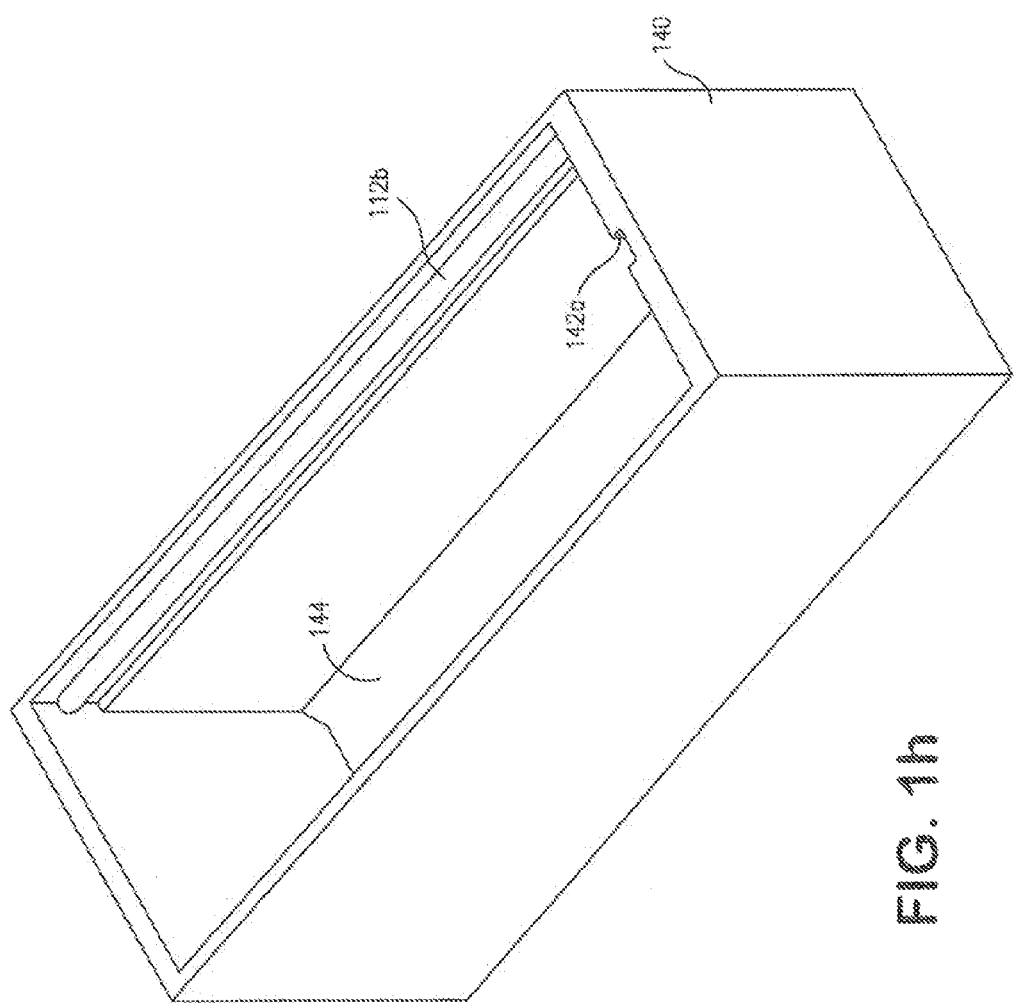
FIG. 1h is a bottom perspective view of the outer case utilized in the device embodiments of FIGS. 1a and 1b.

FIG. 1*h* shows a first embodiment of the outer case 140 that can be utilized with an eight (8) channel modular header base assembly 160, such as that shown in FIGS. 1*a* and 1*i*. The outer case 140 comprises a generally rectangular shape with only the bottom surface open. The overall length of the outer case will vary depending on the size or number of the modular header elements 102 needed for the particular application; however, it will be appreciated that a case matching the desired number of header elements 102 is not a requirement; i.e., the housing 140 can be loaded with a number of header elements fewer than that required to completely fill the housing, with the remaining space within the housing case 140 either left vacant, filled by a spacer or other mechanical stabilization component(s), or even used to house one or more electronic components or devices of a heterogeneous nature (such as an integrated circuit and associated discrete components). For example, a Bluetooth or WiFi wireless chipset, 802.3af PoE controller or power supply or receiver unit, micro-controller, storage device or memory, or a microprocessor, DSP, or RISC core could be disposed on a substrate mounted within the unused portion of the case 140, thereby producing a "hybrid" device capable of both its signal conditioning functions as well as one or more ancillary functions (which may or may not be related to the signal conditioning functions). See, e.g., co-owned and co-pending U.S. patent application Ser. No. 11/387,226 entitled "Power-Enabled Connector Assembly And Method Of Manufacturing" filed Mar. 22, 2006, incorporated herein by reference in its entirety, which describes one such exemplary PoE device useful with the present invention.

The embodiment of FIG. 1h comprises an injection moldable polymer that is chosen based on its intended application. For example, if the outer case 140 is to be utilized in a high temperature application such as a surface mounting reflow process, a high temperature polymer such as high temperature PPS may be desirable. The selection of polymer materials is well understood in the arts and as such will not be discussed further herein.

The outer case 140 also comprises an orientation channel 142a that is adapted to receive the guide posts 106 of the end support elements 102 when the modular header base assembly 160 is received within the case. Engagement ribs 112b are adapted to engage snap guide channels 112a as best seen in the cross sectional view shown in FIG. 1k. Alternatively, the snap guide channels could be positioned within the outer case while the engagement rib features were placed on the modular header elements 102; however the exemplary embodiments shown in FIGS. 1h, 1i and 1k offer a highly space efficient solution due to design considerations such as molding wall thicknesses on the outer case 140.

The outer case 140 can also be fully or partially covered with a metal noise shield (not shown) or alternatively plated or otherwise processed to improve the EMI shielding of the device 100. For example, one exemplary process that is well understood in the art is that of utilizing a conductive filler material within the plastic itself to provide EMI shielding protection. Alternatively, one could plate desired surfaces (i.e., through vacuum metallization or the like) to provide means to reduce the effects of EMI on the device or other devices operating in close proximity to the device 100.

The mating face of the device 100 (i.e., that from which the pins 122, 124 protrude) can also be shielded if desired, such as for example through use of the multi-layered metalized/non-conducting substrate shields described in U.S. Pat. No. 6,585,540 to Gutierrez, et al. issued Jul. 1, 2003 entitled "Shielded microelectronic connector assembly and method of manufacturing", incorporated herein by reference in its entirety.

Internal shields (such as those described in U.S. Pat. No. 6,585,540) can also be utilized, such as between the individual header assemblies 120, and/or between vertically stacked rows of components (as described subsequently herein).

FIG. 1i shows an exemplary embodiment of a modular header base assembly 160 utilizing eight (8) modular header assemblies 120 of the type shown in FIGS. 1f-1g. As previously discussed, one salient advantage of the present invention is that essentially any number of modular header housings 120 may be stacked horizontally and utilized to accommodate various design constraints. In addition, while the embodiment of FIG. 1i shows modular header assemblies 120 that are essentially identical (i.e. in size, shape, pin number, etc.), it is also contemplated that one or more of these assemblies 120 may be heterogeneous in configuration and/or function from other header elements in order to accommodate any desired footprint, electrical circuit design, electrical or signal processing/conditioning functions, etc.

Furthermore, while it is primarily considered advantageous to engage the modular header assembly 160 with a respective outer case 140 as is best shown in FIG. 1j, this outer case may not be necessary in all cases. For example, one alternate embodiment of the invention uses a plurality of header elements 102 mated together (such as frictionally, via adhesive, etc.) without any external case or housing 140. In another variant, plastic is molded directly around the header assembly 160 to encapsulate the internal components, or encapsulated using silicone or a similar encapsulant or potting compound.

FIG. 1l shows another exemplary embodiment of the modular header assembly 160 of the invention being mounted inside an outer case 140. A printed circuit board 180 is mounted onto the bottom side of the device and at least partially disposed within the outer case 140. In one exemplary embodiment, the printed circuit board 180 comprises a multi-layer printed circuit board made of a fibrous material such as FR-4, although it will be appreciated that different materials and constructions (e.g., single layer boards, flex "sheet" boards, etc.) may be used if desired. Plated through-holes are positioned throughout the printed circuit board to line up with the terminals 122 of the modular header assembly 160. Printed copper traces provide signal paths between terminals 122. In addition, various electronic components such as resistors, capacitors, diodes, etc. can be utilized within the signal paths created by these copper traces (whether as part of the board structure or as discrete components on either side of the board or elsewhere) to filter or condition the signals transmitted through the device.

While the embodiment of FIG. 1l utilizes a configuration wherein the printed circuit board 180 mounts over each set of pins on all eight modular header housings, it is contemplated that the printed circuit board 180 may alternatively be placed over individual ones of the modular header assemblies 120, or alternatively over any subset of modular header housings present within the device 100. In addition, the printed circuit board 180 need not interface directly with pins 122; rather wires, leadframe, etc. could be routed between the electronic components resident within the modular header cavities to the printed circuit board 180.

Within or on the printed circuit board 180 itself, an additional layer of conductive material, such as copper, may be utilized in order to provide a means for shielding against undesirable electromagnetic radiation or interference into (i.e., from external sources) or off of (i.e., from within) the device 100. The various terminals 122 can then be soldered by hand or via a mass termination process in order to form desired electrical connections between any of the terminals 122 and the printed circuit board 180.

Figure 2:
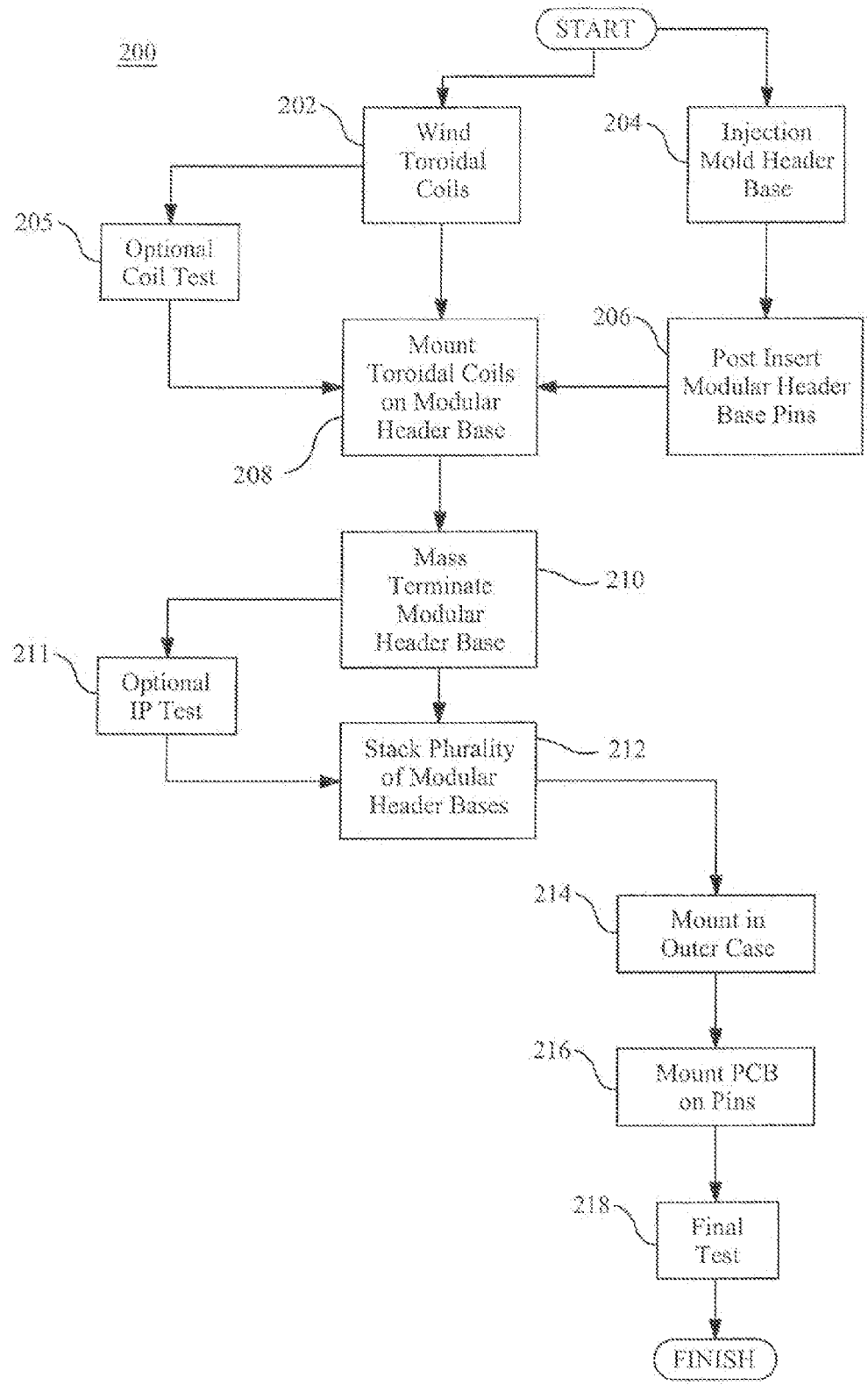
FIG. 2 is a logical flow diagram illustrating one exemplary method of manufacturing the modular header assembly of FIG. 1.

Referring now to FIG. 2, one exemplary embodiment of the method 200 of manufacturing the aforementioned modular device 100 is described in detail. It is noted that while the following description of the method 200 of FIG. 2 is cast in terms of the eight-channel modular header assembly of FIGS. 1a-1l, the methodology is equally applicable to other configurations.

In the illustrated embodiment of FIG. 2, the method 200 generally comprises first preparing the electronic components; e.g., winding the magnetically permeable toroidal coils (step 202). These toroidal coils may be wound manually or alternatively could be wound using an automated process such as that disclosed in co-owned U.S. Pat. No. 3,985,310 entitled "Method for winding ring-shaped articles", the contents of which being incorporated by reference in its entirety. The coils may then be optionally stripped and/or "pre-tinned" to provide exposed conductive ends to the wound coils. Other types of electronic components may also or alternatively be used as previously described.

Either serially or in parallel, the modular header element(s) 102 of FIG. 1c is/are formed using an injection molding apparatus in step 204. The modular header element 102 could either have the terminal pins 122 insert molded during step 204 or alternatively be post-inserted after molding in step 206.

In step 205, the wound coils or other components are subjected to optional electrical and/or physical testing. The coils may be tested for open circuit inductance ("OCL"), DC-resistance ("DCR"), turns-ratio testing and the like. The purpose of such a test is to verify that the coils have been manufactured properly and meet design constraints prior to being mounted within a modular header housing, thereby preventing costly waste and/or rework. For example, if a coil does need to be re-worked, it often can require as little as the winding of an additional turn, which is much simpler to perform prior to the wound toroid being mounted on a modular header element 102. Physical inspection could be utilized to inspect for such defects as chipped toroids and nicked wires that could cause field failures later down the supply line. It will be appreciated, however, that in certain cases it is desirable to perform testing or inspection after assembly (i.e., either on a per-assembly 120 basis, or per-device 100 basis); see the discussion of step 211 below. For example, damage done to components during the assembly process would not be detected during pre-assembly testing/inspection. If the device 100 is mounted to a PCB or other external component, it may even be optimal in certain cases to test or inspect the device 100 as part of the parent assembly testing/inspection regimen.

In step 208, the wound coils or other components are mounted on the modular header elements 102. The coils or components can optionally be secured in the modular header element utilizing an adhesive or other bonding agent; e.g., epoxy adhesive such as a single or dual stage epoxy. Alternatively, the coils will be secured simply by routing the wires into the channels 108a and wrapping the wires around the terminals 122. Each element 102 and its components 110 can also be partly encapsulated in, e.g., silicone or the like as another option.

In step 210, the wire-wrapped terminals are dipped into a eutectic solder bath and the wires are mass-terminated to the terminals. Because the modular header element 102 of the exemplary embodiment is made from a high temperature polymer, the dimensional integrity of the assembly remains stable even if it partially submerged in the solder bath for a few seconds. While solder bath mass termination methods are exemplary, other methods such as e.g. hand soldering or resistance welding may also be utilized if desired.

In step 211, each modular support header assembly, such as that assembly shown in FIGS. 1d and 1f, can optionally be electrically tested or inspected to ensure there are no defects in workmanship (i.e., cold solder joints, coil shorts due to solder splash, etc.) as previously described.

In step 212, the modular header assemblies 120 are next "stacked" using posts 106a, 106b that are placed into respective holes 107a, 107b. In one exemplary embodiment, eight (8) modular header housing assemblies are horizontally stacked in succession to form an eight-channel signal conditioning device 160 such as that of FIG. 1i. As previously described, more or less modular header housing assemblies could be used as well. Friction between the posts and respective holes hold the modular header elements 102 together, although adhesives, heat staking, or other techniques could be used as well.

In step 214, the eight-channel modular header assembly 160 is inserted into an outer case 140, as best shown in FIG. 1j. Posts 106a, 106b orient the device into the case by sliding or otherwise being received into cover channel 142a. The top surface of the modular header assembly 160 is constrained by an internal surface 144 of the outer case 140, while snaps 112b engage respective channels 112a on the assembly 160, thereby constraining the assembly 160 in all six degrees of freedom with respect to the outer case 140.

In step 216, an optional printed circuit board 180 is mounted onto the bottom of the modular header assembly 160 such as in the configuration shown in FIG. 1l. The advantages of using a printed circuit board 180 are well understood in the art. For example, a printed circuit board provides a means for providing signal interconnects between pluralities of pin terminals 122, 124. In addition any number of discrete components such as resistors, capacitors and inductors can be mounted on the printed circuit board and subsequently in the signal path of the mounted toroids 110 on the modular header assembly 160. The board 180 can also be used to provide EMI shielding as previously described.

In step 218, the final assembled part is sent to optional test prior to being shipped to an end customer (or mounted to another device). A test fixture of the type well understood in the electronic arts is utilized to determine various performance aspects of the finished device such as, without limitation, return loss ("RL"), insertion loss ("IL"), OCL, DCR, etc.

Referring now to FIG. 3, another embodiment of the header device of the invention is described. In this embodiment, the device 300 is stacked in a vertical dimension as opposed to the "horizontal" staking of the device 100 previously described (here, the terms "vertical" and "horizontal" being merely relative to the PCB or other device to which the assembly 300 is mated, and not restrictive or absolute in any sense). The exemplary device 300 comprises a lower header 306, upper header 304 and a cover 302. The device 300 further comprises four (4) rows of surface mountable leads 308a, 308b, each protruding from the bottom service of the upper and lower headers respectively, although through-hole pins or other types of terminations are contemplated as well. As the device embodied in FIG. 3 utilizes surface mountable leads, the upper header, lower header and case (cover) all comprise a high temperature polymer adapted for use in high temperature environments such as might be experienced during an IR reflow process.

FIG. 3a shows a bottom perspective view of the device 300 of FIG. 3. As shown, the inner leads 308b and outer leads 308a comprise a total or ninety-six (96) leads composed of four (4) in-line rows. However, while the embodiment of FIGS. 3 and 3a show these leads disposed in-line, it is appreciated that the leads (e.g., the inner and outer sets) may be offset from one another as well to provide alternatives to trace routing on an end customers printed circuit board, etc. Advantageously, the leads also are formed from a copper based alloy plated with a tin-nickel overplate that is compliant with the restriction of hazardous substances ("RoHS") directive well known in the electronic arts. It is recognized, however, that any number of plating and base material combinations may be used (such as Alloy 42 with a tin/lead alloy, etc.) consistent with the present invention, the aforementioned copper alloy/tin-nickel combination merely being exemplary.

The lower header 306 is positioned inside of the upper header 304 via guided ramped surfaces 310 in order for form a substantially unitary device 300. The retention features 312 prevent the lower and upper headers from separating after they have been assembled; many different varieties of such features can be used. The device cover 302 generally comprises a high temperature polymer. Notwithstanding, the performance requirements need not necessarily be as stringent as is required with the upper 304 and lower 306 vertical headers, since the upper header 304 and the lower header 306 may be subjected to direct contact with a eutectic solder bath during optional mass termination and/or lead tinning processes while the cover 302 generally will not.

The cover 302 also includes a plurality of snap features 314 that are received within respective features on the upper header 304, although a plurality of other methods could be utilized (i.e., heat staking, epoxy adhesives, etc.).

Figure 3B:
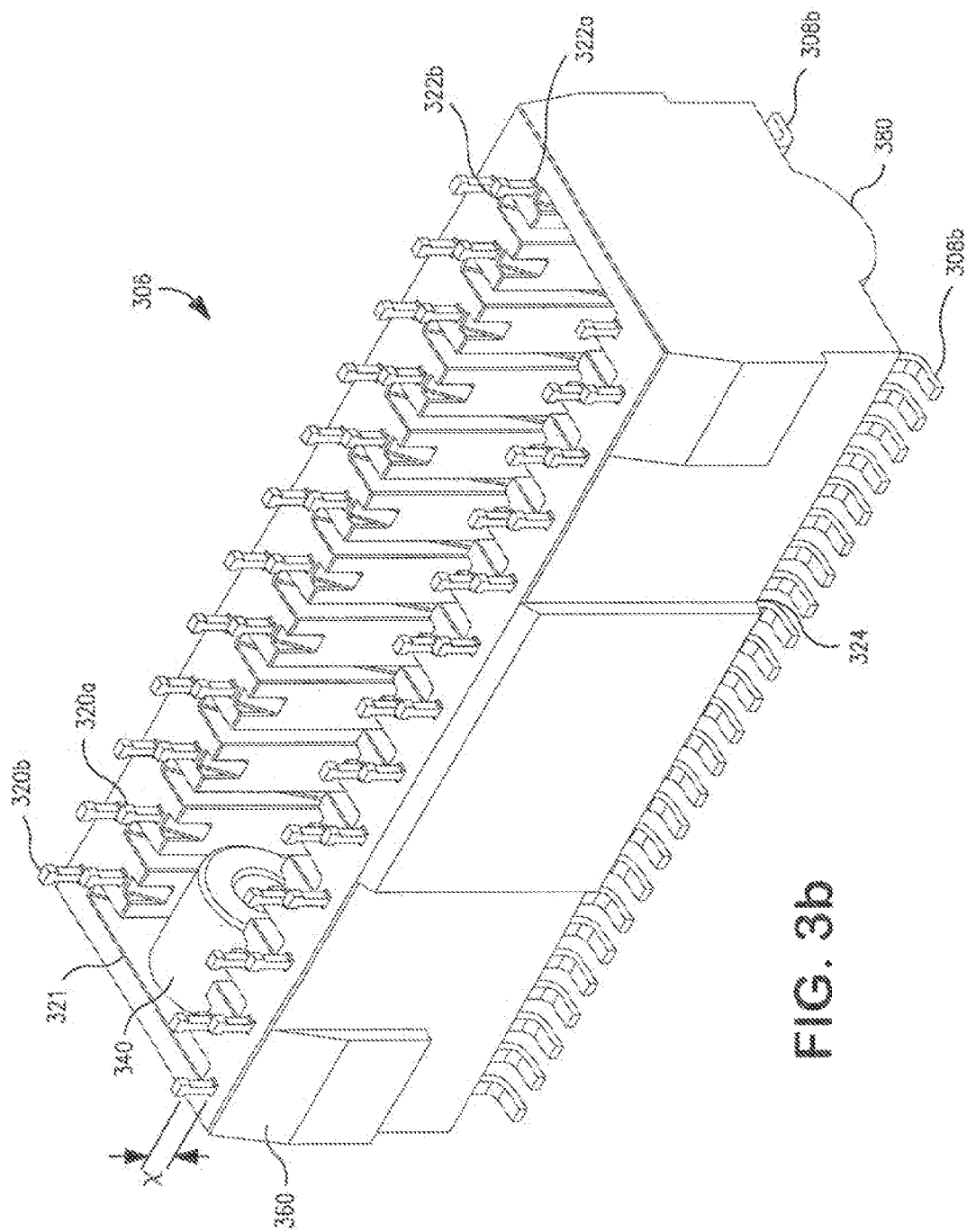

FIG. 3b shows a perspective view of a first exemplary embodiment of the lower header 306 of the device 300. The lower header 306 generally comprises an injection molded polymer base 380, a plurality of surface mountable terminal pins 308b, with both a board mounting end and a wire wrap end 320a, 320b. As previously discussed, the molded polymer base 380 comprises a high temperature polymer such as a liquid crystal polymer ("LCP") previously described. Alternatively, a high temperature phenolic may be used as previously described, as well as any number of other materials.

Although the wire wrap ends 320a, 320b are generally considered part of the surface mount lead terminals 308a, 308b, this is not a requirement. In some cases, it may be desirable to form the two structures as separate entities and place the features in signal communication with one another, such as through the addition of a copper wire, traces, etc. However, where an insert molding process is utilized to form the polymer base 380, it is typically desirable that the features be formed from a single unitary structure. The wire wrap features of the wire wrap ends 320a, 320b are characterized by a notched feature denoted by the dimension "x". This dimension ensures a sufficient number of turns (i.e., 2-3 turns) can be placed around the wire wrap prior to any soldering operations to make sure the wire stays as it is placed. Other notch configurations can be used, and furthermore the presence of the notches is optional.

Also of note is the offset present between adjacent ones of the wire wrap ends 320a, 320b. Although not required, this offset is desirable in many cases since it provides additional spacing between terminals to prevent the occurrence of solder "bridging" during solder manufacturing processes. It has been found by the Assignee hereof that a spacing greater than about 0.040 inches (~1 mm) is generally sufficient to prevent solder bridging between adjacent terminals during solder dipping operations.

A cavity 321 formed in the lower header is adapted to house a plurality of electronic components (e.g. the toroidal coil 340 shown in FIG. 3b). The cavity 321 is generally rectangular in shape with a bottom surface that is circular in cross section. Such a shape provides an efficient packing of components within the lower vertical header 306 itself, although other shapes are contemplated depending on the geometry of the electronic components that need to be housed. The header cavity 321 may also have a heterogeneous profile; such as where one region has one profile (for one type of component), and another region another profile to efficiently accommodate a second type of component.

A plurality of wire-routing cavities 322a, 322b provide channels for the routing of wires from inside the cavity 321 to the terminal ends 320a, 320b. This is particularly useful when wound toroidal cores 340 or other components are placed within the cavity to prevent damaging the wires during coil placement, soldering processes, etc.; however, such a channel may not be needed in certain configurations, such as that shown in FIG. 3d discussed subsequently herein.

Figure 3C:
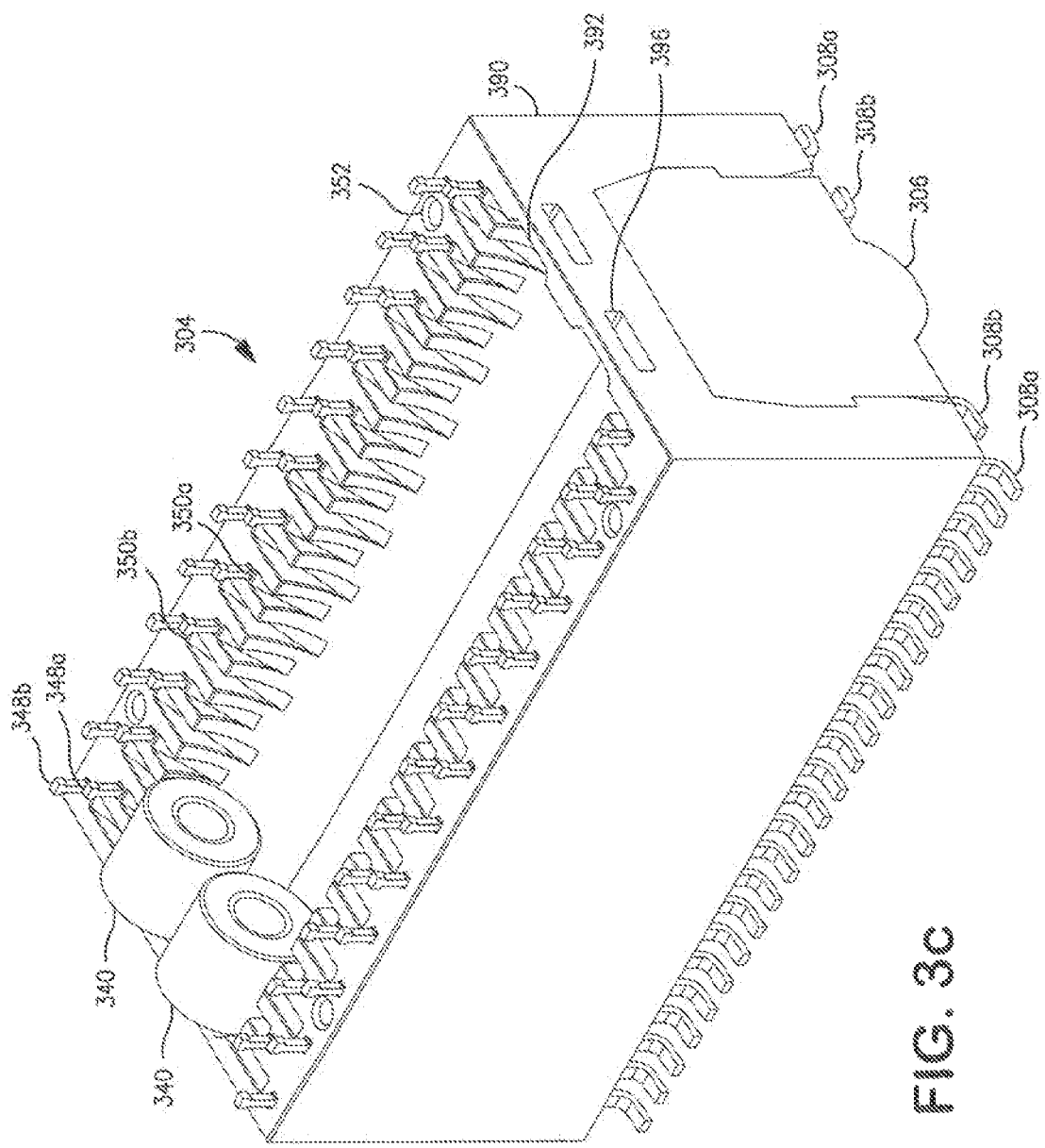

FIG. 3c shows a perspective view of a first exemplary embodiment of an upper header 304, with a lower header 306 engaged in its lower portion. The upper header 304 generally comprises an injection molded polymer base 390, a plurality of surface mountable terminal pins 308a, with both a board mounting end and a wire wrap end 348a, 348b. As previously discussed, the molded polymer base 390 comprises a high temperature polymer such as, e.g., a liquid crystal polymer ("LCP") or phenolic.

Similar to the lower header 306 previously discussed, the wire wrap ends 348a, 348b are part of surface mount lead terminals 308a, though this is not necessarily a requirement (e.g., where device 300 geometries do not allow them to be part of a unitary structure). As previously noted, it may be desirable under certain circumstances to form the two structures as separate entities, and place the features in electrical communication with one another. However, where an insert molding process is utilized to form the polymer base 390, it is often desirable that the features comprise a single unitary structure.

An offset is again present between adjacent wire wrap ends 348a, 348b like wire wrap ends 320a, 320b in the embodiment of FIG. 3c. As previously discussed, this offset is desirable as it provides additional spacing (greater than about 1 mm) between terminals to prevent the occurrence of solder "bridging" during solder manufacturing processes.

A cavity 392 formed in the header 304 is adapted to house a plurality of electronic components (e.g. the toroidal coils 340 shown in FIG. 3b). The cavity 392 is generally rectangular in shape with a bottom surface that is circular in cross section and generally can be larger than cavity 321 of the other header 306 due to the geometry of the exemplary device 300. Such a cavity shape again provides an efficient packing of components within the upper header 304 itself, although other shapes are contemplated depending on the geometry of the electronic components that need to be housed.

A plurality of wire-routing cavities 350a, 350b provide channels for the routing of wires from inside the cavity 392 to the terminal ends 348a, 348b. This is particularly useful when wound toroidal cores 340 are placed within the cavity to prevent damaging the wires during coil placement, soldering processes, etc.; however, such a channel may not be needed in configurations such as that shown in FIG. 3d.

The post receptacles 352 are adapted to receive respective posts from the cover 302 to help ensure proper alignment, while the snap undercuts 396 provide a feature to receive a respective cantilever snap on the cover 302. Other methods of securing the cover 302 to the upper vertical header 304 are contemplated as well, such as heat-staking, epoxy adhesives and the like consistent with the principles of the present invention.

Similar to the configurations discussed previously with respect to FIG. 1a, et seq., the aforementioned "vertical" configuration of FIG. 3 improves the modularity of the overall design, as compared with prior art techniques, and further provides manufacturing advantages such as reduced rework and scrapping costs. As a result, the device of FIGS. 3-3c provide an overall more cost effective solution than prior art devices due at least in part to savings in costs associated with the improved modularity.

Figure 3D:
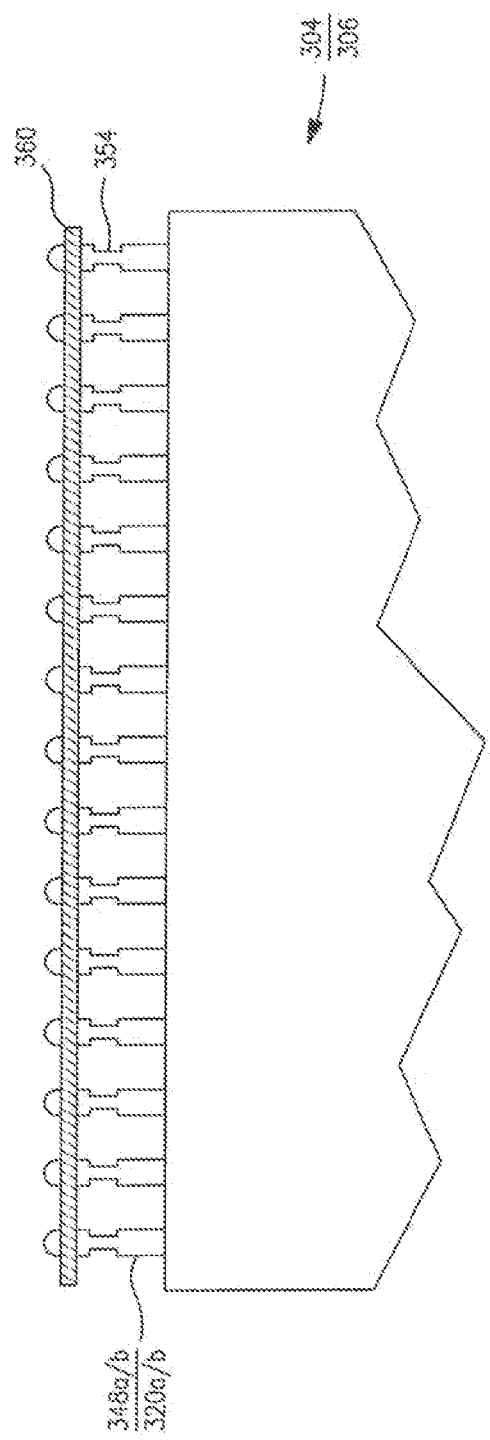
FIG. 3d is a detail view of a second embodiment of the upper (or lower) vertical header of FIG. 3 with a printed circuit board installed.

FIG. 3d shows a second embodiment of the device 300 shown in FIG. 3, now incorporating a printed circuit board 360 with the upper and/or lower modular headers 304, 306. For purposes of brevity, the incorporation of a printed circuit board 360 within the upper header 304 is now discussed, although it is recognized that either or both of the headers could incorporate the printed circuit board consistent with the principles of the present invention.

A plurality of plated through-holes are positioned throughout the printed circuit board 360 to receive the terminal wire wrap ends 348a, 348b. Optional standoffs (not shown) may also be employed to position the printed circuit board 360 above the wire wrap features 354 so that wires from any internally mounted components, such as the toroids 340, are not damaged as a result of placement of the printed circuit board 360. The printed circuit board 360 can be either a single or multi-layer variety with any number of electronic components mounted thereon, or alternatively a flex board of the type well known in the art. The use of miniaturized printed circuit boards in conjunction with other electronic components such as wound toroidal cores 340 is well understood in the art, especially for telecommunications applications, and as such will not be discussed further herein.

Figure 4:
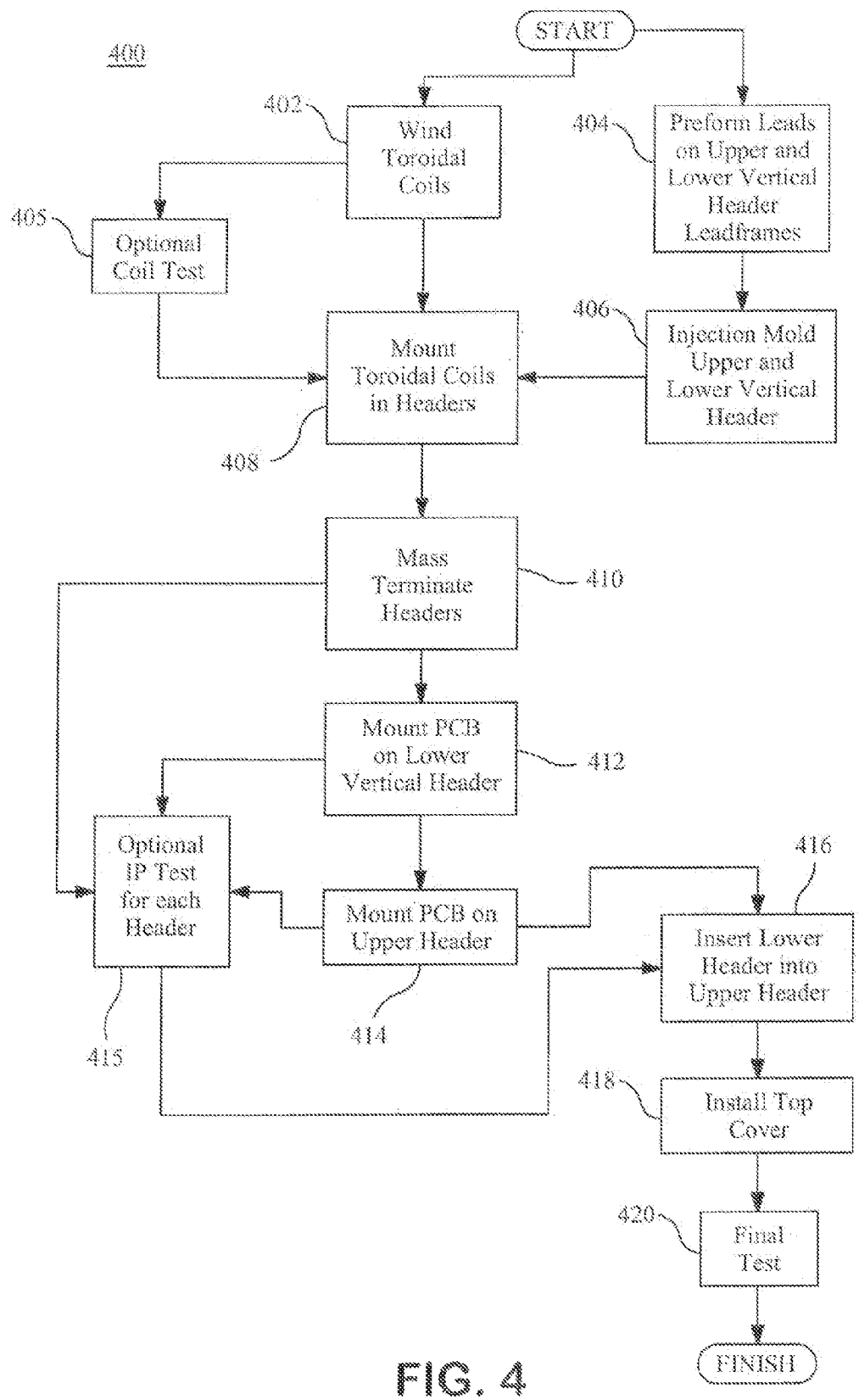
FIG. 4 is a logical flow diagram illustrating one exemplary embodiment of the method of manufacturing the stacked vertical header assembly of FIG. 3.

Referring now to FIG. 4, a method 400 of manufacturing the aforementioned "vertically" stacked header assembly 300 of FIG. 3 is described in detail. It is noted that while the following description is cast in terms of the device 300 of FIG. 3, the broader concepts of the method 400 of the invention disclosed herein are equally applicable to alternative configurations.

In the embodiment of FIG. 4, the method 400 generally comprises first winding the magnetically permeable toroidal coils (or otherwise preparing the electronic components) per step 402. These toroidal coils may be wound manually or alternatively could be wound using an automated process such as that disclosed in U.S. Pat. No. 3,985,310. The coils may then be optionally stripped and/or "pre-tinned" to provide exposed conductive ends to the wound coils.

Either serially or in parallel, the upper and lower header lead frames are pre-formed in step 404, and the upper 304 and lower 306 headers are injection molded with the pre-formed lead frames present in the mold, such as by using an injection molding apparatus (step 406).

In step 405, the wound coils are subjected to optional electrical and/or physical testing and inspection. The coils may be tested for open circuit inductance ("OCL"), DC-resistance ("DCR"), turns-ratio testing and the like. The purpose of such testing and inspection is to verify that the coils have been manufactured properly and meet electrical (and mechanical) design constraints prior to being mounted within a modular header housing, thereby preventing costly waste and/or rework. For example, if a coil does need to be re-worked, it often can require as little as the winding of an additional turn, which is much simpler to perform prior to the wound toroid being mounted the upper and lower vertical headers 304, 306. Physical inspection can be utilized to inspect for such defects as chipped toroid cores and nicked wires, which could cause subsequent failure of the component(s).

In step 408, the wound coils are mounted in the upper and lower headers. The coils can optionally be secured in the modular header housing utilizing an adhesive such as a single or dual stage epoxy, or a silicone or other encapsulant or potting compound. Alternatively, the coils may be secured simply by routing the wires into the channels 322a, 322b, 350a, 350b and wrapping the wires around the terminals 320a, 320b, 348a, 348b.

In step 410, the wire-wrapped terminals 320a, 320b, 348a, 348b are each dipped into a eutectic solder bath, and the wires from the coils 340 mass-terminated to the terminals 320a, 320b, 348a, 348b. Because the upper and lower headers are made from a high temperature polymer, the dimensional integrity of the assembly remains stable even if it remains partially submerged in the solder bath for a few seconds.

In steps 410 and 412, optional printed circuit boards 360 that have been pre-populated with electronic components are mounted onto the proper respective upper or lower header, and subsequently soldered. While the printed circuit board 360 is most advantageously pre-populated, this is by no means a requirement, and any number of alternative manufacturing processes can be utilized post-mounting (i.e., hand soldering, resistance welding, etc.).

In step 415, each header, both upper and lower, can individually or jointly be electrically tested to ensure there are no defects in workmanship (i.e., cold solder joints, coil shorts due to solder splash, etc.).

In step 416, the lower header 306 is mounted inside of the upper header 304 utilizing a snap-fit mechanism as previously described. While a snap fit is exemplary because of its simplicity and elimination of excess processing steps, other manufacturing methods such as e.g., heat staking and/or use of epoxy adhesives could be used consistent with the principles of the present invention.

In step 418, the top cover 302 is snapped into place over the upper header 304 and is subsequently marked and/or otherwise labeled to identify such items as part number, manufacturing location, country of origin, date code, patent notice, etc.

In step 420, the final assembled part is sent to final test prior to being shipped to an end customer, as previously described with respect to other embodiments.

Figure 5:
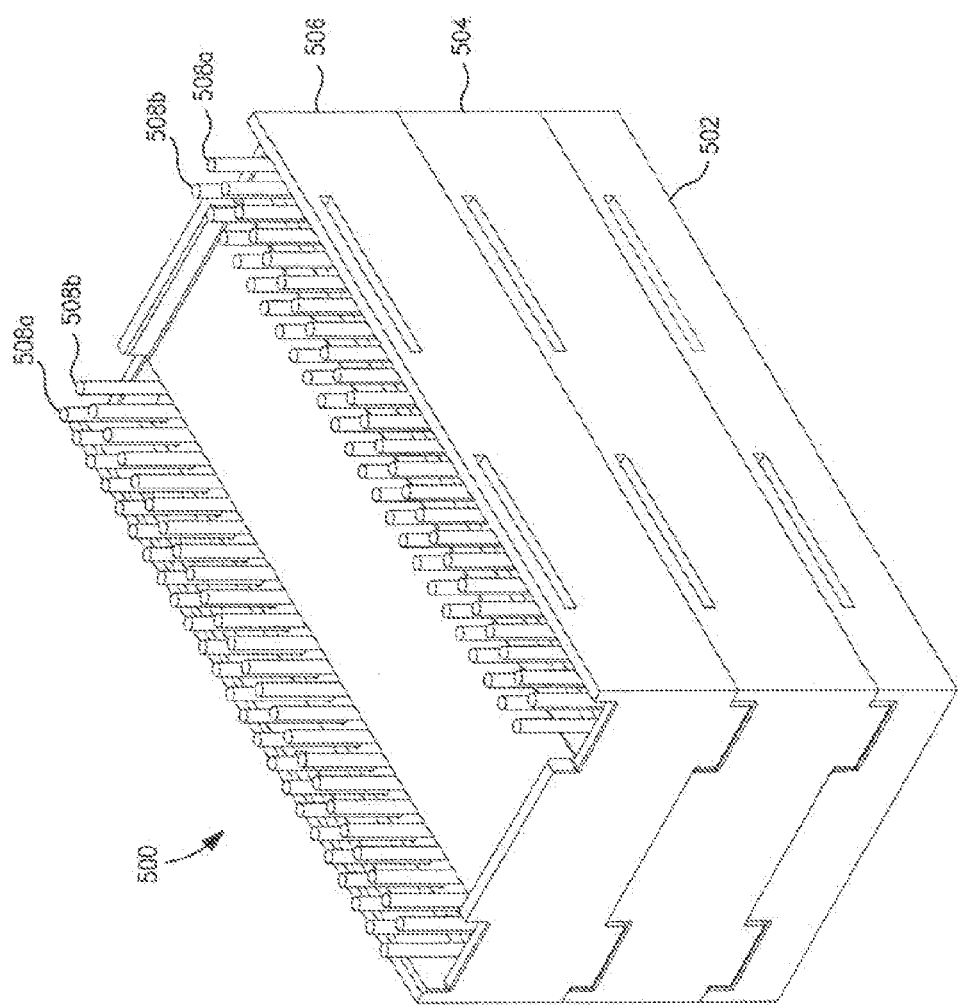
FIG. 5 is a bottom perspective view of a third embodiment of a vertical stacked header assembly according to the principles of the present invention.

Referring now to FIG. 5, a third embodiment of a vertically stacked header assembly device 500 according to the principles of the present invention is described. The device 500 of FIG. 5 comprises a lower header 506, upper header 504 and a cover 502. However, it should be noted that in this embodiment both the upper header 504 and the lower header 506 are essentially identical components with the terminology upper and lower merely reflecting the components respective positions with one another (and not any particular absolute position or orientation with respect to a parent device). The primary difference between the illustrated upper and lower headers is the positioning of the leads 508a and 508b within the header itself.

The device 500 comprises four (4) rows of through-hole leads 508a, 508b, each protruding from the bottom service of the upper and lower headers respectively. It is appreciated however, that the device 500 can be readily modified to accommodate surface mountable leads, similar to those shown in FIG. 3. As the device 500 shown utilizes through-hole leads, the upper header 504, lower header 506 and case 502 need not all comprise a high temperature polymer adapted for use in high temperature reflow environments; however a high temperature polymer may be used if desired for other high temperature applications, such as for solder immersion techniques discussed previously herein.

Figure 5A:
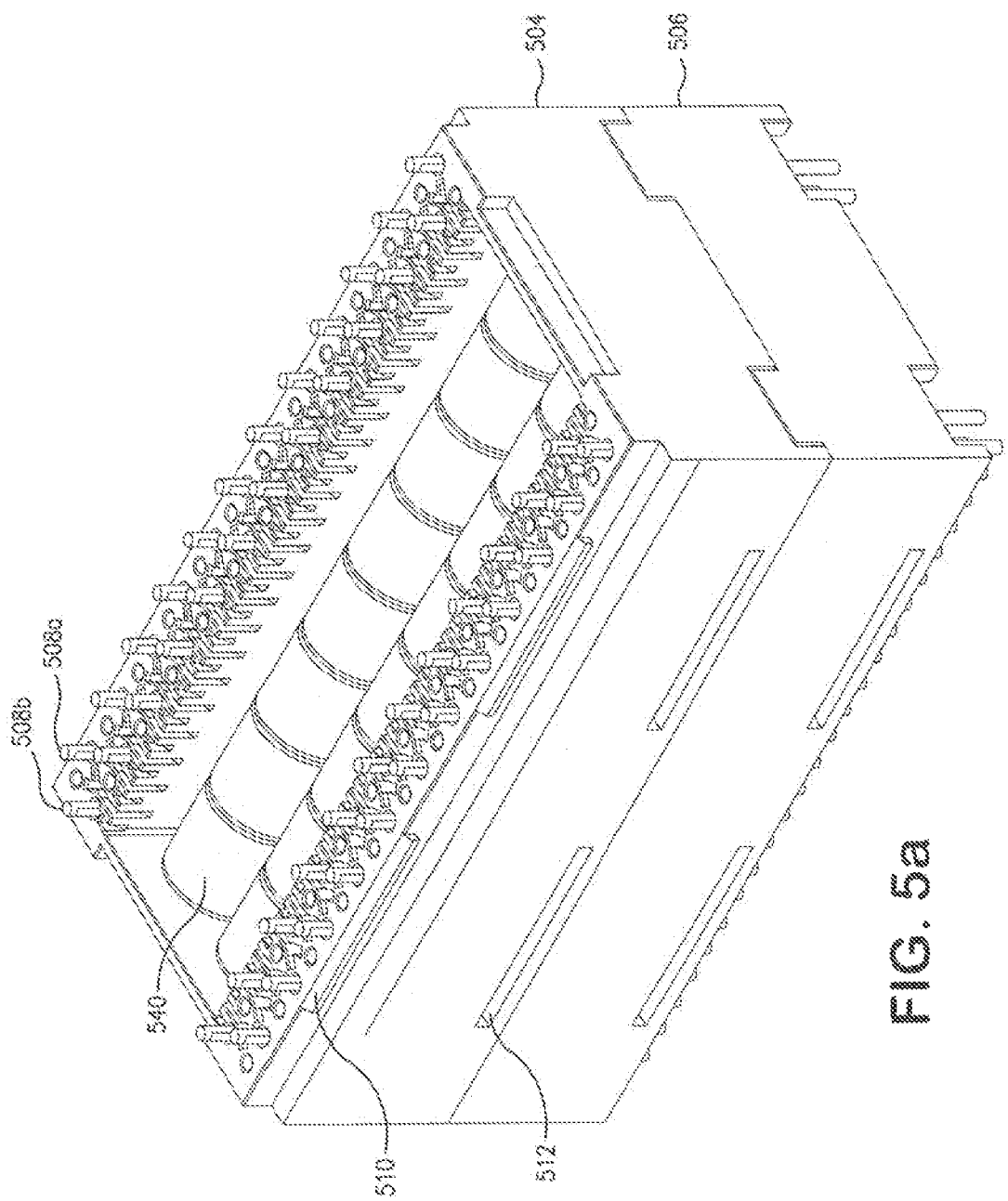
FIG. 5a is a perspective view of a third embodiment of a vertical stacked header assembly shown in FIG. 5.

FIG. 5a shows a perspective view of the device 500 with the cover 502 removed. As is clear in this perspective view, the inner leads 508b and outer leads 508a comprise ninety-six (96) individual leads composed of four (4) rows in offset disposition, only a portion of which are associated with the upper header 504. While the embodiment of FIGS. 5 and 5a show these leads in offset disposition, it will be appreciated that the leads (e.g., the inner and outer sets) may be in-line with respect to one another as well, assuming adaptation of certain other features (such as the lead guide channels discussed below).

The leads 508a, 508b comprise a copper based alloy plated with a tin-nickel overplate that is compliant with the RoHS directive. However, any number of plating and base material combinations may be used (such as a phosphor bronze pin with a tin/lead alloy, etc.) consistent with the disclosure of the present invention, the aforementioned copper alloy/tin-nickel combination merely being exemplary.

The lower header 506 mates with the upper header 504 via symmetrical features common to both headers 506, 504 providing a modular design that can accommodate not only the two headers shown but even one or more additional headers (e.g., in a stacked disposition). The retention features 510, 512 prevent the lower and upper headers from separating after they have been assembled. The cover 502 shown in FIG. 5 generally comprises an injection molded polymer similar in composition to the upper 504 and lower 506 headers, although the polymer chosen could be of a lower or different grade. This is because the upper and lower headers may be subjected to direct contact with a eutectic solder bath during optional mass termination and/or lead tinning processes, while the cover 502 would not necessarily be so exposed. The cover 502 generally comprises a plurality of snap features 512 that receive respective features 510 on the upper vertical header 504, although a plurality of other methods could be utilized (i.e., heat staking, epoxy adhesives or the like).

Figure 5B:
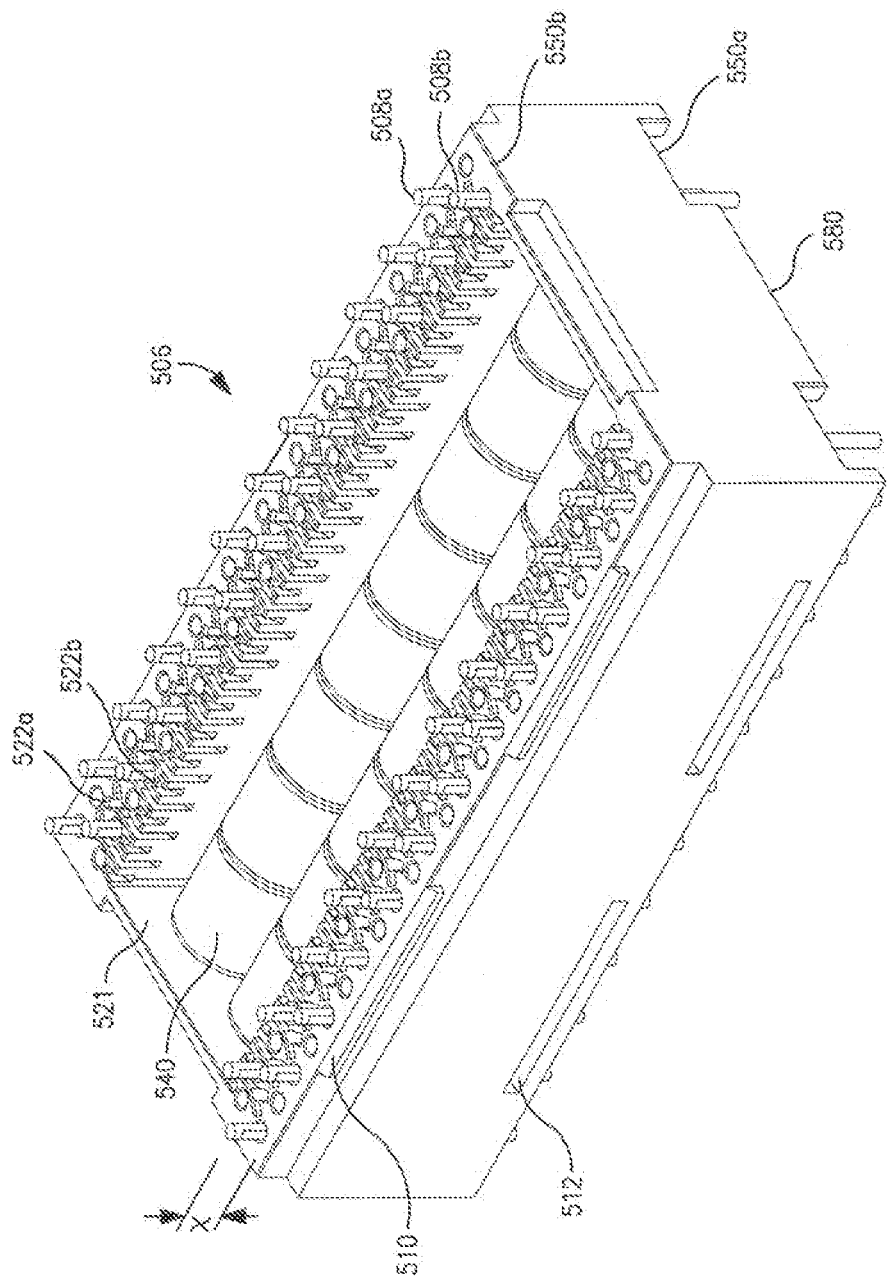

FIG. 5b shows a perspective view of a third exemplary embodiment of a lower header 506. The lower header 506 generally comprises an injection molded polymer base 580, a plurality of through-hole terminal pins 508a, 508b, with both a board mounting end and a wire wrap end. As previously discussed, the molded polymer base 580 could comprise a high temperature polymer such as LCP or other materials.

The leads 508a, 508b are characterized on the top half of the header 506 by dimension "X" as illustrated. This dimension "X" may vary substantially from pin to pin as needed. For example, a first pin may only need to have a small amount of material exposed; e.g., just enough for 2-3 turns of wire originating from an internally mounted coil 540. However, a second pin may have much more pin exposed so that, e.g., a connection can be made from a coil within the lower header 506 while subsequently being fed through the upper header 504 and also connected to an electronic component resident within or in close proximity to the second header 504.

Also of note is the offset present between adjacent wire wrap ends as previously discussed. Although not always required, this offset is desirable as it provides additional spacing between terminals to prevent the occurrence of solder "bridging" during solder manufacturing processes.

A cavity 521 is adapted to house a plurality of electronic components (e.g. the toroidal coil 540 shown in FIG. 5b). The cavity 521 is again generally rectangular in shape to provide an efficient packing of components within the lower header 506 itself, although other shapes are contemplated depending on the geometry of the electronic components that need to be housed. A plurality of wire-routing cavities 522a, 522b provide channels for the routing of wires from inside the cavity 521 to the terminal ends of pins 508a, 508b. This is particularly useful when wound toroidal cores 540 are placed within the cavity to prevent damaging the wires during coil placement, soldering processes, etc.; however, such a channel may not be needed in configurations such as that shown in FIG. 5d discussed subsequently herein. It is noted that the internal channel 522a of the illustrated embodiment is generally Y-shaped; this allows wires to be routed to either of two possible pin locations and contributing to an improvement in the overall modularity of the design.

The exemplary interlocking features 550a and 550b shown serve two main purposes. The feature 550b on the lower header 506 will mate with a respective 550a feature on an upper header (not shown). This allows the connection between the upper header and the lower header 506 to be constrained in at least 4 degrees of freedom. The second purpose of the interlocking features is to provide a cavity in through-hole mounting applications that allows the underside of the device 500 to be cleaned in standard washing operations. This is significant, as chemicals such as fluxes can be highly corrosive if left on the device 500 after soldering it to a printed circuit board or other device, and accordingly must be washed off in order to prevent corrosive effects.

Figure 5C:
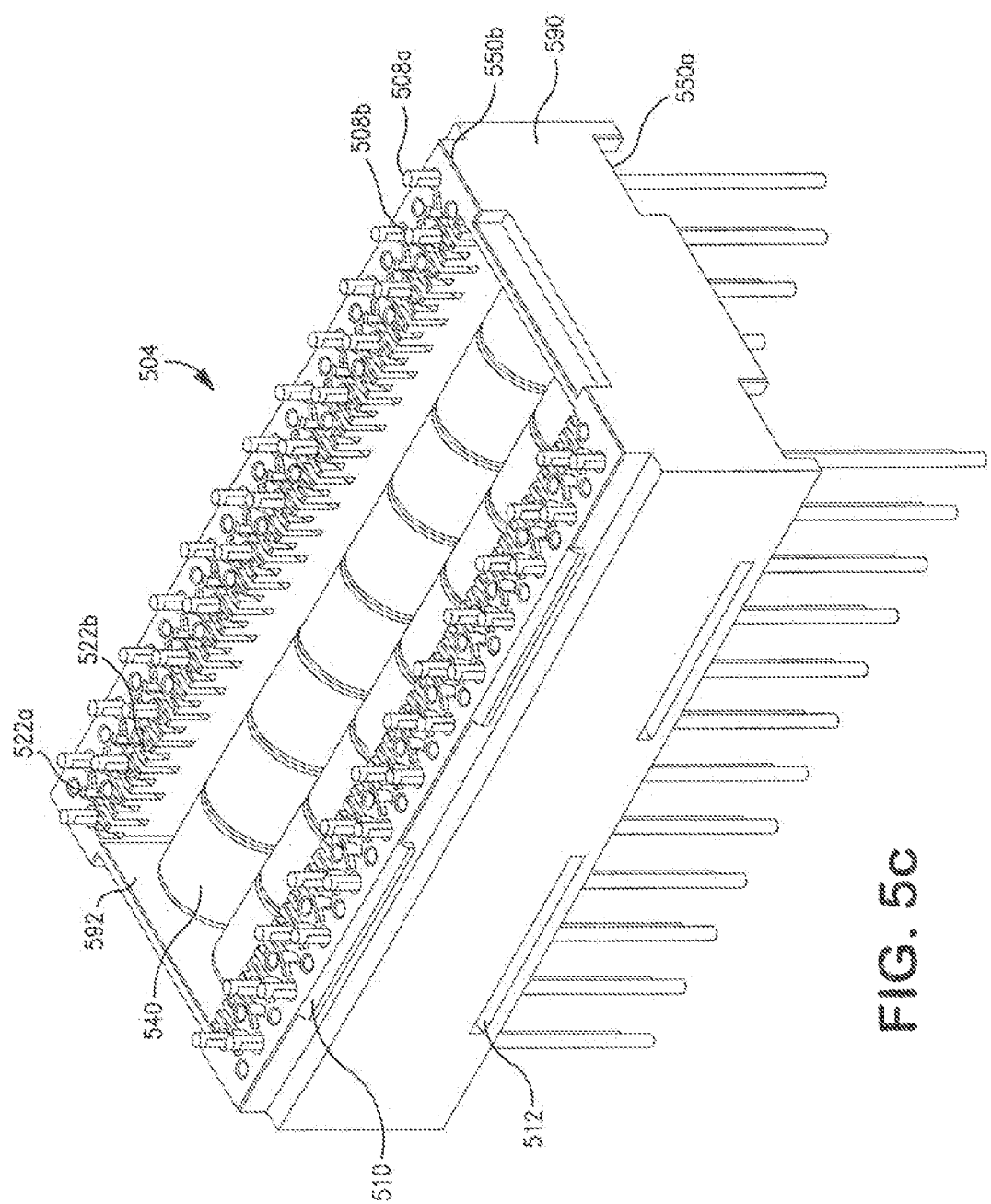

FIG. 5c shows a perspective view of a third exemplary embodiment of an upper header 504. Note again that the upper header is essentially identical in geometry to the lower header 506, thereby contributing to the overall modularity of the design. The upper header 504 generally comprises an injection molded polymer base 590, a plurality of through-hole terminal pins 508a, 508b with both a first (board mounting) end and a second (wire wrap) end. Note that the board mounting end is much longer in length than in the corresponding component in the lower header 506 shown in FIG. 5b. This is because these leads 508a, 508b need to be fed through the lower header 504 in order to make contact with the parent device (e.g., printed circuit board). As previously discussed, the molded polymer base 590 advantageously comprises a high temperature polymer such as the aforementioned LCP.

The leads 508a, 508b can be either insert-molded or alternatively may be post-inserted into the injection molded polymer base 590 after it has been formed. As noted with regards to the device 100 of FIG. 1a, any combination of pin sizes and shapes can be utilized depending on design constraints and/or preferences of the designer.

Figure 5D:
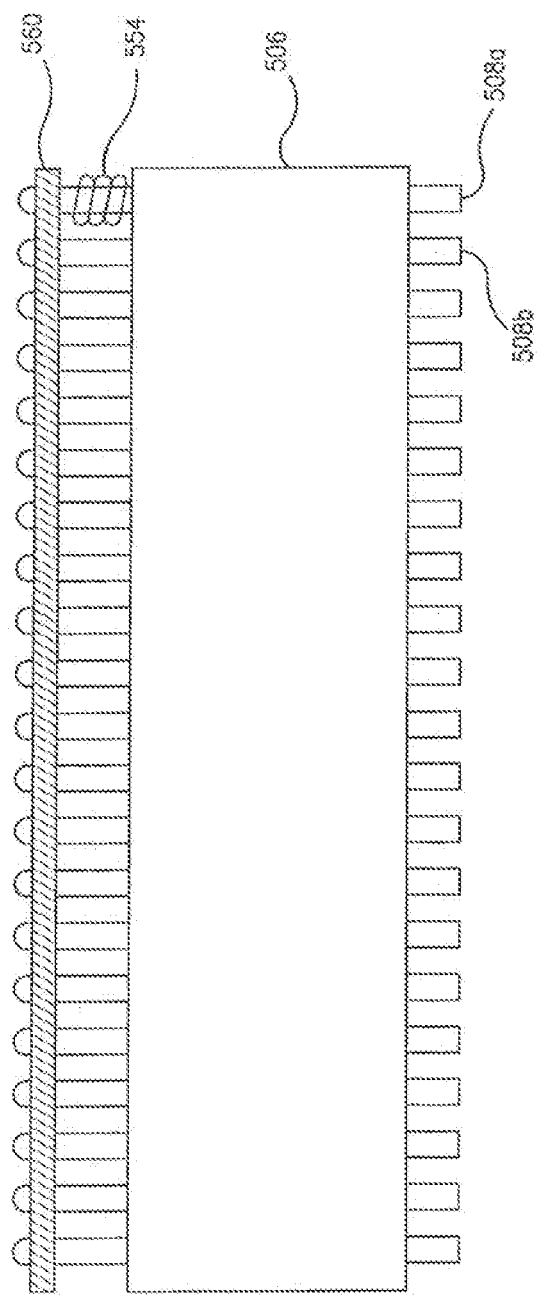
FIG. 5d is a detailed view of a fourth embodiment of either the upper (and/or lower) header of FIG. 5 with a printed circuit board installed.

FIG. 5d shows a fourth exemplary embodiment of the device incorporating a printed circuit board 560 with either the upper and/or lower header 504,506 shown in FIGS. 5-5c. For purposes of brevity, only the incorporation of a printed circuit board 560 within the lower header 506 is discussed, although it will be recognized that either or both of the headers may incorporate the printed circuit board with adaptations readily apparent to one of ordinary skill given the present disclosure. A plurality of plated through holes are positioned throughout the printed circuit board 560 to receive the ends of the terminals 508a, 508b. Optional standoffs (not shown) may also be employed as previously described. The printed circuit board 560 may be e.g., a single-layer, multi-layer, or flex variety with any number of electronic components mounted thereon. Also, while the printed circuit board 560 is shown as a single-unitary structure, the board may comprise a plurality of printed circuit boards as well. This alternative embodiment might be more cost efficient in certain applications, and provide greater modularity (since the boards are separate), thereby resulting in a lower material costs than if a single printed circuit board 560 were used.

Figure 5E:
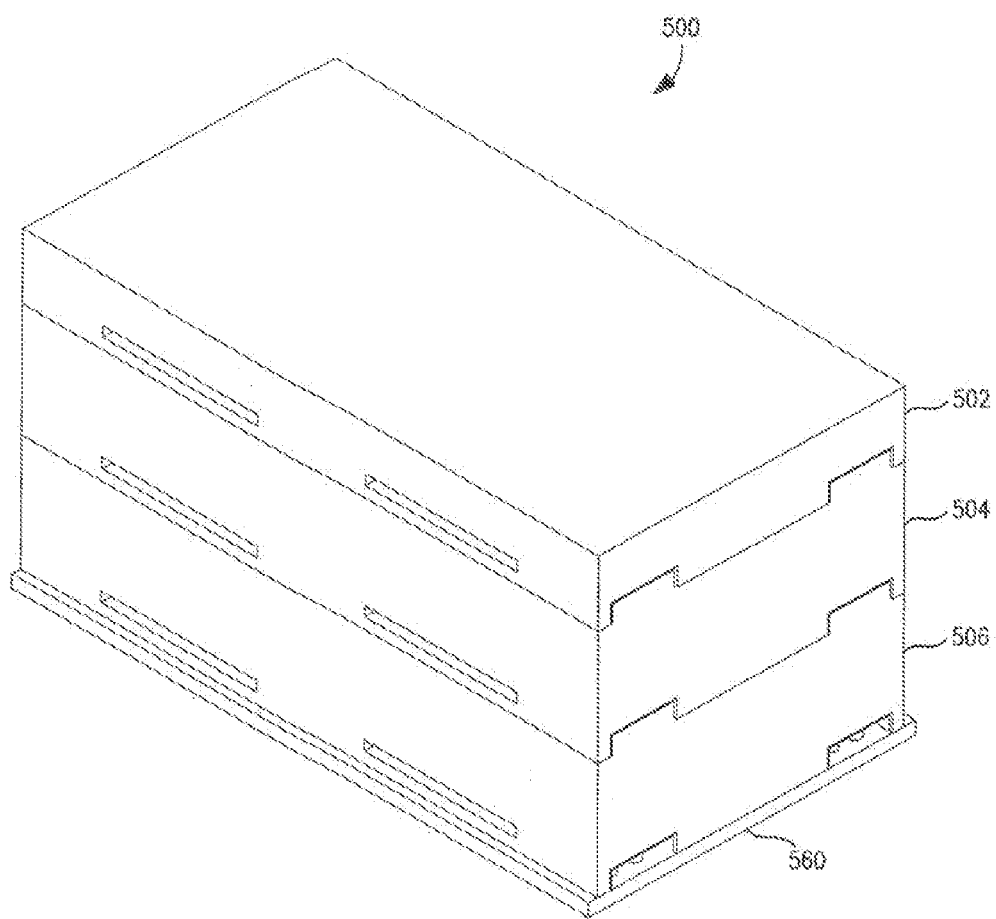
FIG. 5e is a perspective view of another embodiment of the vertically stacked device, showing a printed circuit board installed at the bottom of the lower header.

Referring to FIG. 5e, a fifth exemplary embodiment of a vertical stacked header assembly is shown. This embodiment is generally similar to the embodiments previously described with respect to FIGS. 5-5c (i.e., incorporating a cover 502, upper stacked header 504 and lower stacked header 506); however, the embodiment of FIG. 5e incorporates a surface mountable printed substrate 560 mated proximate the bottom of the lower header 506, instead of the through-hole mounting shown in, e.g. FIG. 5. As previously discussed herein with respect to other vertical stacked header embodiments, this configuration may also use any number of stacked headers although only two are illustrated.

Figure 5F:
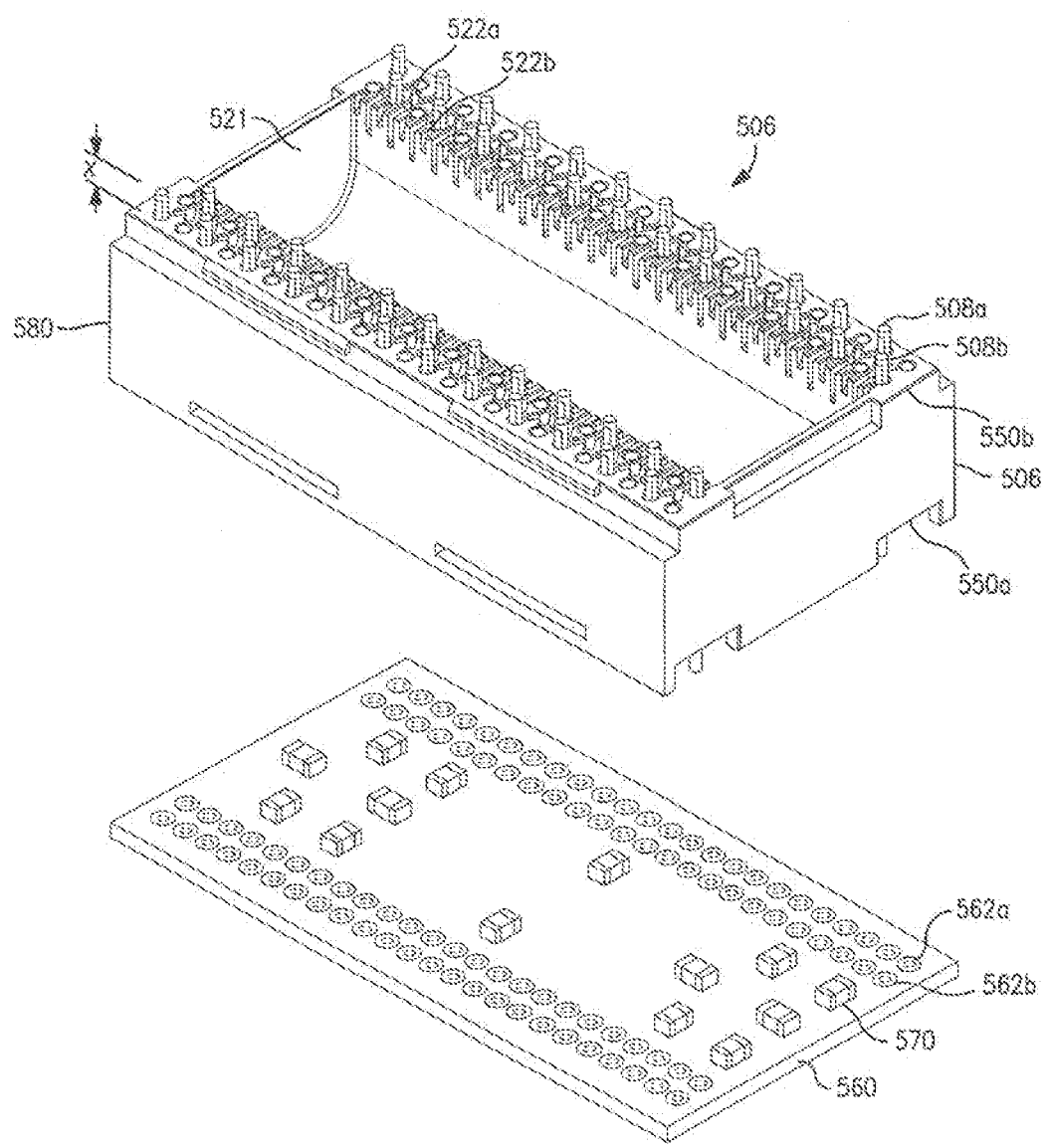
FIG. 5f is a partially exploded perspective view of the fifth embodiment of FIG. 5e showing the lower header and printed circuit board.

As best shown in FIG. 5f, the lower header 506 of this embodiment is essentially identical to that disclosed in FIG. 5b. The lower header 506 generally comprises an injection molded polymer base 580 and a plurality of terminal pins 508a, 508b, each with both a board mounting end and a wire wrap end.

The leads 508a, 508b are characterized on the top half of the header 506 by the dimension "X". This dimension may vary substantially from pin to pin, depending on the electrical circuit needed and the output footprint desired. For example, a first pin may only need to have a small amount of material exposed, just enough for 2-3 turns of wire originating from an internally mounted coil 540. However, a second pin may have larger dimension "X" then the first pin so that, e.g., a connection can be made from a coil within the lower header 506 to an upper header 504. If sufficiently long, the second pin 508 can subsequently be fed through the upper header 504 from the bottom of the header and connected to an electronic component resident within (or in close proximity to) the second header 504.

Moreover, the embodiment shown in FIGS. 5e-5f is not limited to a wire pin. In alternate embodiments, it may be desirable to utilize an insert molded leadframe construction, such as that described with regards to FIGS. 3-3d. Myriad other alternatives are compatible with the invention, and would be readily apparent to one of ordinary skill given the present disclosure.

As can be seen in FIG. 5f, the cavity 521 of the header 506 is adapted to house a plurality of electronic components (such as the toroidal coil 540 shown in FIG. 5b). The cavity 521 is generally rectangular in shape, with a circular bottom surface. As previously noted, this shape provides an efficient packing of toroidal components within the lower header 506 itself, although other shapes are contemplated depending on the geometry of the electronic components that are housed. A plurality of wire-routing cavities 522 provide channels for the routing of wires from inside the cavity 521 to the terminal ends of the pins 508. This is particularly useful when wound toroidal cores 540 are placed within the cavity to prevent damaging the wires during coil placement, soldering processes, etc.; however, such a channel may not be needed in other configurations as previously discussed (see e.g., the discussion of FIG. 5d). Note that the internal channel 522a is generally Y-shaped, similar to the embodiment discussed in FIG. 5b. This allows wires to be routed to either of two possible pin locations and contributing to the overall modularity of the design. Channel shapes other than "Y" can be used for such purposes, however, as will be apparent to those of ordinary skill.

The printed substrate 560 generally comprises one or more conductive metal cladding sheets (e.g., copper sheets) with an insulated substrate such as FR-4 separating the one or more metal layers. The printed substrate 560 also comprises a plurality of plated through holes 562 adapted to receive the board mounting ends of the lower and upper header pins 508. A plurality of electronic components, such as the surface mountable chip or bead components 570 shown in FIG. 5f, may be disposed on the surface of the printed substrate 560 and in signal communication with various pins present in the device 500. Although it is primarily contemplated that electronic components be mounted directly to the substrate 560, it is also contemplated that the board 560 may also be utilized solely for the purpose of routing electrical connections via copper traces between respective terminals 562 located on the substrate itself. The substrate may also be used to carry one or more "piggyback" substrates (e.g., smaller PCBs mated thereto) that can carry the aforementioned electronic components.

Figure 5G:
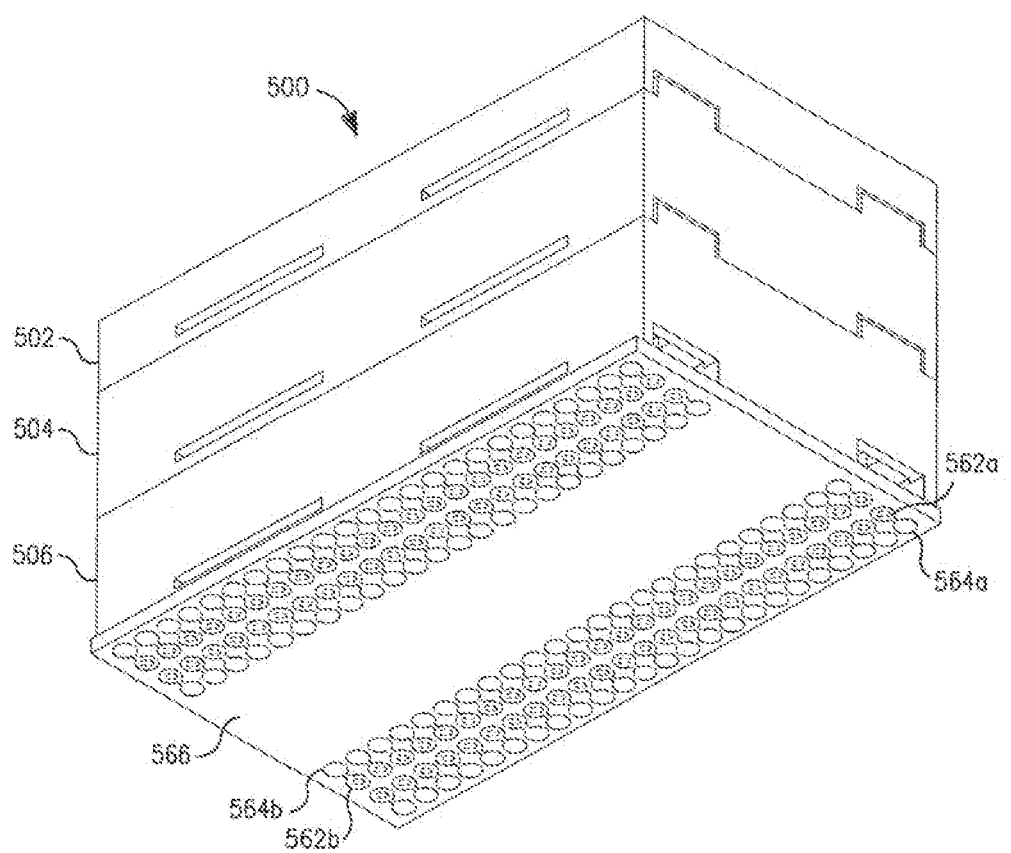
FIG. 5g is a bottom perspective view of the fifth embodiment of the device of FIG. 5e, showing the bottom side of the printed circuit board.

As best shown in FIG. 5g, the bottom of the printed substrate 560 comprises a plurality of plated through-holes 562 as previously discussed, as well as a plurality of printed substrate pads 564. In embodiments where pins 508 are utilized for through-hole mounting (i.e. utilized for mounting to a printed circuit board or other parent apparatus, not shown), the need for printed substrate pads 564 is obviated. However, if pins 508 are only utilized as electric connection between the printed substrate 560 and the device 500, and not for connection to a parent device, then the printed substrate pads 564 can be utilized for purposes of surface mounting the device 500 to the external apparatus.

Figure 5H:
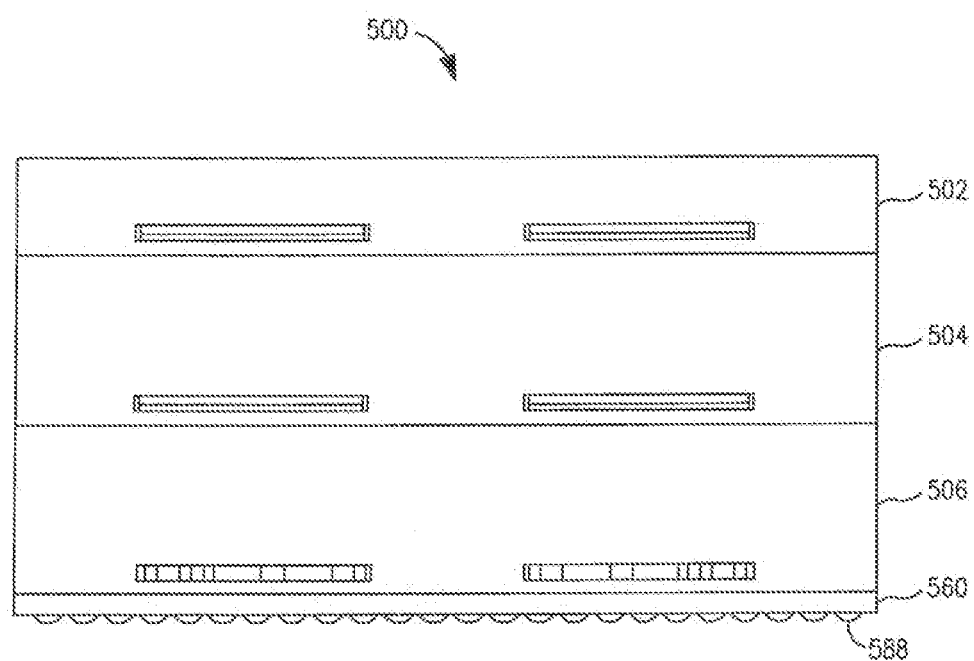
FIG. 5h is a side view showing the device of FIG. 5e.

In the embodiment shown in FIG. 5f, the pins 508 are received in respective printed circuit board 560 through-holes 562. As can be seen best in FIGS. 5g-5h, the pins 508 are adapted to be at or just below the bottom surface 566 of the substrate 560. The pins 508 are then placed into electrical communication with the printed circuit board 560 via a soldering operation, resistance welding, or the like. Next, the printed substrate 560 is placed into a BGA fixture, which adds balls 588 of eutectic solder to the pads 564 as shown in FIG. 5h. The BGA fixture is adapted to maintain co-planarity between each of the solder balls 588 of approximately 0.004 inches (or approximately 0.1 mm) in the illustrated embodiment, although other values may be used. This construction allows the device to be utilized with standard surface mount solder paste screenings of 0.1 mm. BGA technology, and devices and fixtures which create BGA solder connections, are well known in the art and as such will not be discussed further herein.

Figure 6:
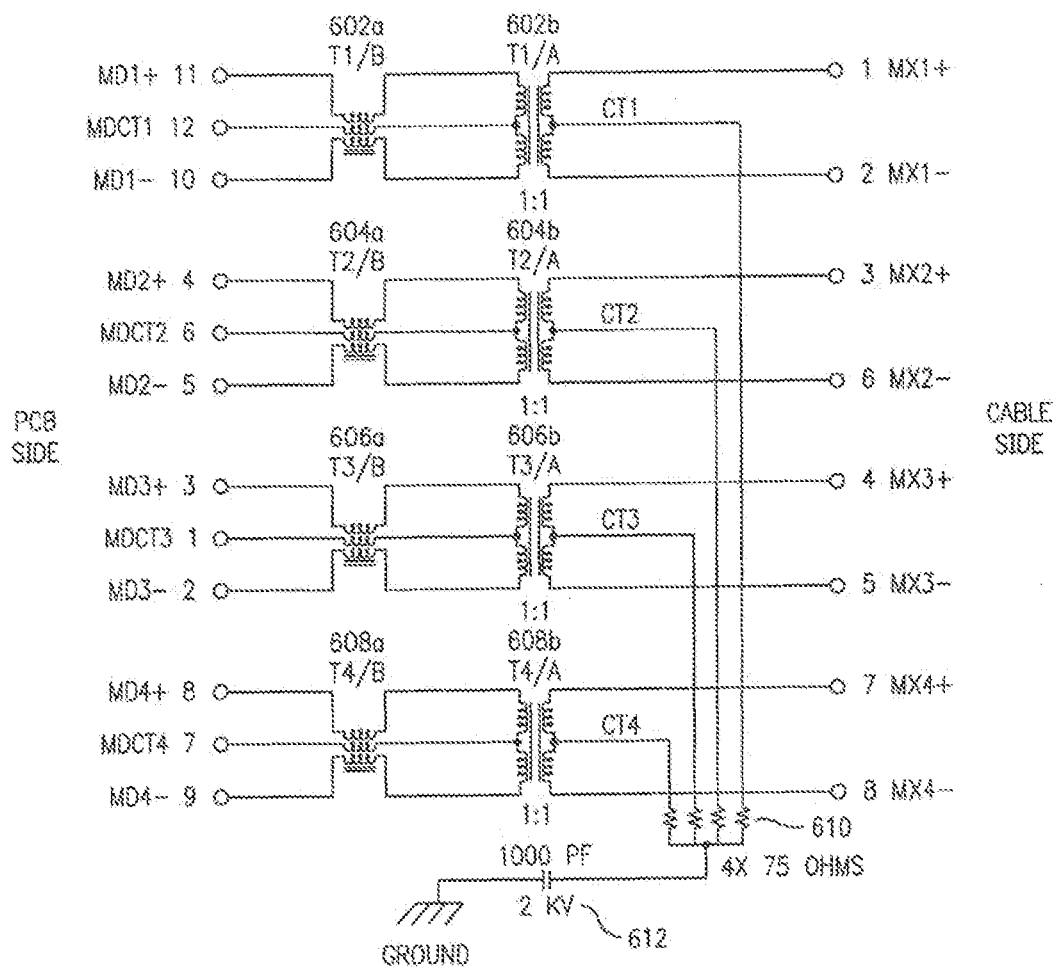
FIG. 6 is a schematic showing exemplary circuitry that may be implemented in the devices shown in FIGS. 3d and 5d.

Referring now to FIG. 6, an exemplary electrical configuration utilized on the device having a printed circuit board 560 (e.g., the device 500 of FIG. 5f) is disclosed. FIG. 6 illustrates what amounts to a single port or channel in a Gigabit Ethernet (GBE) telecommunications application. The coils 602, 604, 606, and 608 may be housed in either upper header 504 or lower header 506, while the resistors 610 and capacitor 612 may be mounted on the printed circuit board 560. The use of printed circuit boards in conjunction with other electronic components such as wound toroidal cores 540 is well understood in the art, especially for telecommunications applications, and as such will not be discussed further herein.

Figure 7:
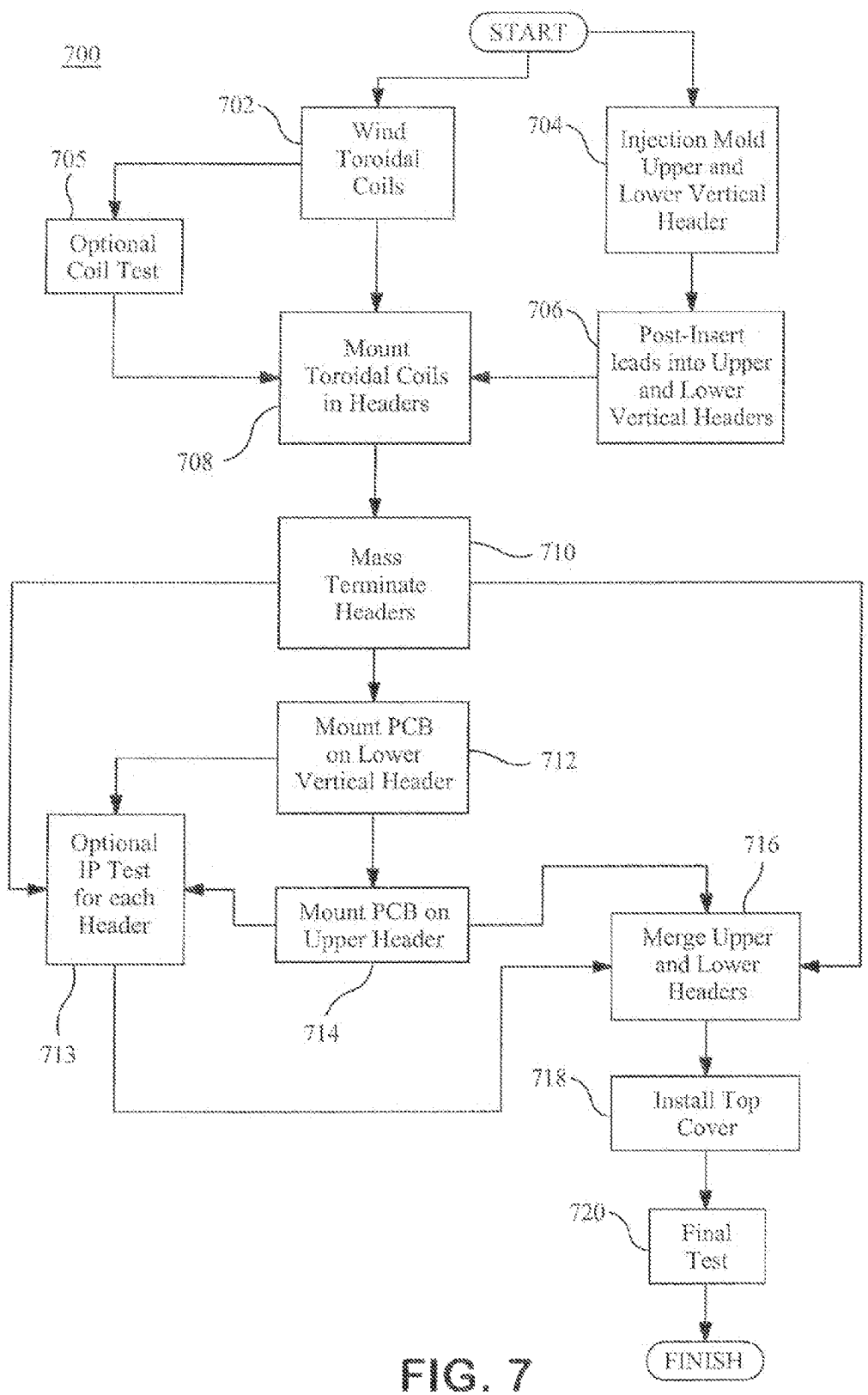
FIG. 7 is a logical flow diagram illustrating one exemplary method of manufacturing the stacked vertical header assembly of FIG. 5.

Referring now to FIG. 7, the method 700 of manufacturing the aforementioned third exemplary embodiment of a vertically stacked header base assembly 500 (FIG. 5b) is described in detail. It is noted that while the following description is cast in terms of the device of FIG. 5b, the broader concepts of this method are equally applicable to other alternative configurations.

The exemplary method 700 generally comprises first winding the magnetically permeable toroidal coils, and/or preparing the other electrical components (step 702). The exemplary toroidal coils may be wound manually or alternatively could be wound using an automated process such as that disclosed in U.S. Pat. No. 3,985,310 previously incorporated herein. The coils may then be optionally stripped and/or "pre-tinned" to provide exposed conductive ends to the wound coils.

Either serially or in parallel, the header bodies are injection molded in step 704. The resultant headers are next designated as either an upper 504 or lower 506 headers. In step 706, depending on whether the header has been chosen as an upper or lower header, round conductive pins are post inserted according to a specific pre-determined pattern so that the upper and lower headers may later interface with one another in a cooperative manner.

In step 705, the wound coils are subjected to optional electrical and/or physical testing. The coils may be tested for open circuit inductance ("OCL"), DC-resistance ("DCR"), turns-ratio testing and the like. The purpose of such a test is to verify that the coils have been manufactured properly and meet design constraints prior to being mounted within a modular header housing, thereby preventing costly waste and/or rework. For example, if a coil does need to be reworked, it often can require as little as the winding of an additional turn, which is much simpler to perform prior to the wound toroid being mounted the upper and lower vertical headers 704, 706. Physical inspection could be utilized to inspect for such defects as chipped toroids and nicked wires which could cause field failures later down the line.

In step 708, the wound coils are mounted in the upper and lower headers. The coils can optionally be secured in the modular header housing utilizing an adhesive such as a single or dual stage epoxy, or encapsulant or potting compound. Alternatively, the coils will be secured simply by routing the wires into the channels 522a, 522b and wrapping the wires around terminals 508a, 508b.

In step 710, the wire-wrapped terminal ends 508a, 508b are each dipped into a eutectic solder bath, and the wires from the coils 540 are mass-terminated to the terminal ends of the signal pins 508a, 508b. Because the upper and lower headers are made from a high temperature polymer, the dimensional integrity of the assembly remains stable as previously described.

In steps 712 and 714, optional printed circuit boards 560 that have been pre-populated with electronic components are mounted on to the upper and/or lower headers and subsequently soldered. While the printed circuit board 560 is most advantageously pre-populated, this is by no means a requirement.

Per step 713, the each upper and lower header assembly can individually or jointly be optionally electrically tested to ensure there are no defects in workmanship (i.e., cold solder joints, coil shorts due to solder splash, etc.).

In step 716, the lower header 506 is mounted on the underside of the upper header 404 utilizing, e.g., a snap-fit. The terminals 508a, 508b on upper header 504 are placed through respective terminal holes on the lower header 506. While a snap fit is exemplary because of its simplicity and elimination of excess processing steps, other manufacturing methods such as e.g., heat staking and/or use of epoxy adhesives could be used consistent with the principles of the present invention.

In step 718, the top cover 502 is snapped into place over the upper header 504, and is subsequently marked and/or otherwise labeled to identify such items as part number, manufacturing location, country of origin, date code, patent marking, etc. In the exemplary embodiment shown in FIG. 5, the cover 502 is placed onto the upper header 504 utilizing a snap-fit, although other methods including epoxy adhesives, heat staking and the like are contemplated.

In step 720, the final assembled part is sent to final test prior to being shipped to an end user or sent for further processing, as previously described.

Figure 8A:
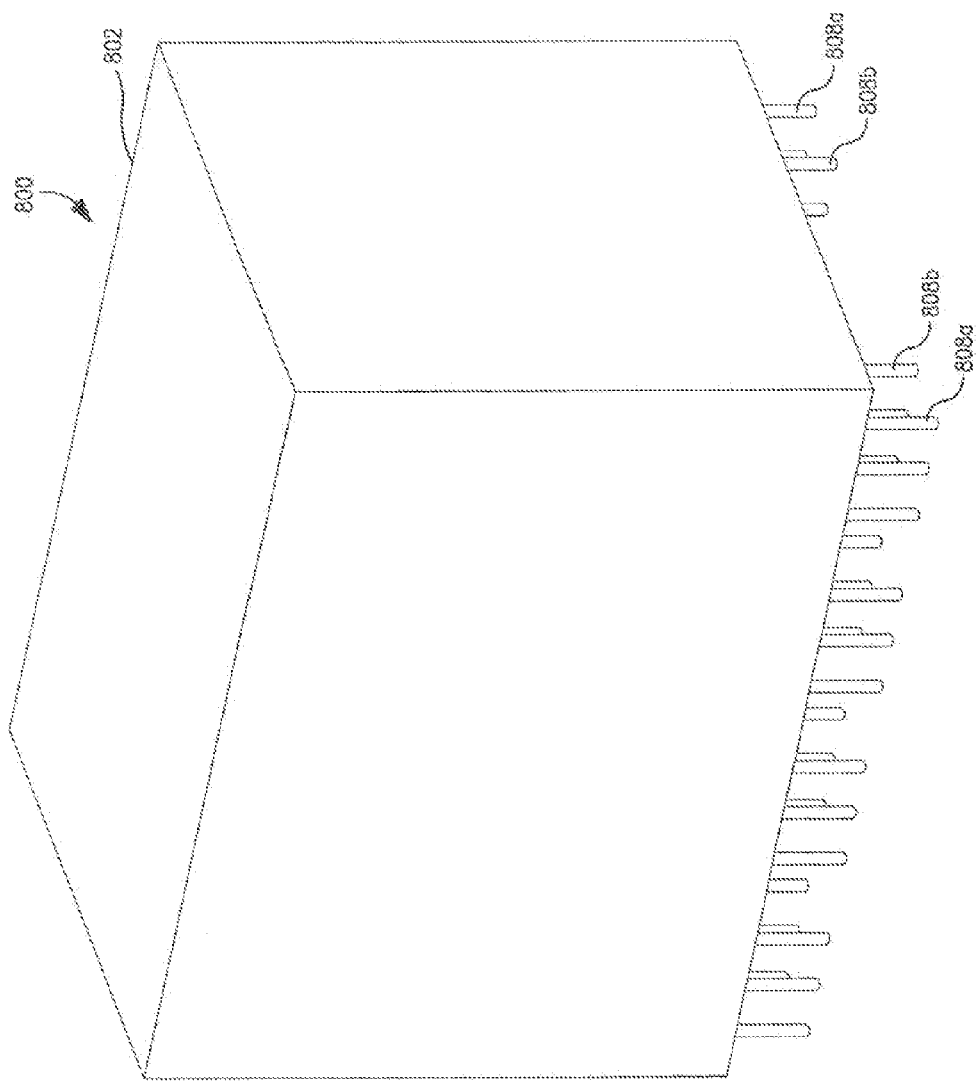
FIG. 8a is a perspective view of a first embodiment of a mixed modular header assembly according to the invention.

Referring now to FIG. 8a, a first embodiment of mixed header assembly device 800 is shown. The device 800 comprises an outer case 802, and a plurality of modular header housings (not shown), each of which utilizes six (6) to twelve (12) round conductive pins 808, although any number could be chosen depending on particular design constraints of the application. The device 800 of the present invention, like the other configurations discussed previously herein, utilizes an inner 808b and outer 808a set of conductive pins 800. This dual-row configuration increases signal pin density; however, other approaches and configurations of the pins may be used as well.

Referring now to FIG. 8b, the first embodiment of FIG. 8a is shown with the cover 802 removed. The mixed header assembly device 800 comprises a plurality of modular header elements incorporating features of both the horizontal and vertical configurations discussed previously. The mixed header assembly device 800 is composed of two rows 804 and 806 of modular header support elements 880. A plurality of pins 808, 810 provide a signal communication between the plurality of toroidal coils 840 and the board receiving ends 808 of the conductive pins. While the first embodiment shows a 4×2 configuration (i.e. four modular header support elements 880 per row and two rows), because of the advantageous modularity of the design, any number of configurations may be utilized consistent with the principles of the present invention. For example, an 8×2, 4×3, etc. device could be made.

Referring to FIG. 8c, an exemplary embodiment of a modular header support element 880 is shown. The element 880 generally comprises a polymer material such as a high-temperature thermoset or thermoplastic polymer. The element 880 can advantageously be manufactured by an injection-molding process, although other processes such as e.g., machining can be used, injection-molding merely being exemplary. The element 880 is formed from a liquid crystal polymer (LCP), phenolic, or other such material with the desired properties.

The modular header elements 880 generally comprise a cavity 826 for housing components such as wire wound toroidal components. While this cavity 826 is shown placing components, such as wound toroids, in a generally vertical orientation, it is appreciated that these cavities could alternatively be placed in a horizontal, or any other position for that matter, depending on the design constraints of the final design. Alternatively, the cavity 826 could be replaced with a plurality of cavities specifically adapted for a certain number or type of electronic components, whether homogeneous or heterogeneous in nature. A plurality of wire routing cavities (not shown) may be used to protect and route wire or lead-frame to the terminal ends 810 of the signal conducting pins 808, or alternatively between vertically adjacent modular header elements 880. The spacing between modular header elements 880 and between the terminal end 810 and cavity 826 can also be adjusted to meet creepage and clearance requirements for supplementary insulation if desired.

Figure 8D:
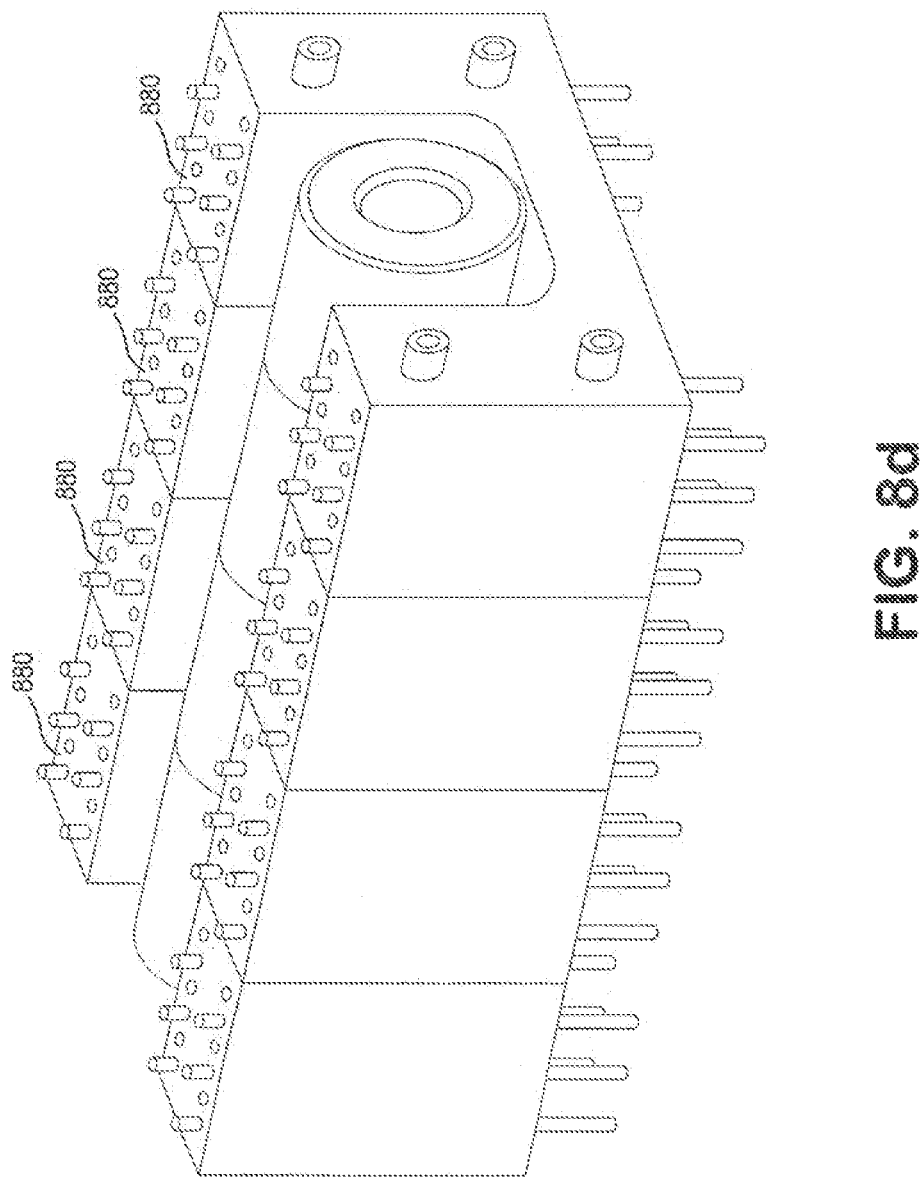
FIG. 8d is a perspective view of an exemplary 4-port (channel) mixed modular header assembly.

Exemplary posts 860 are used in the illustrated embodiment so that a plurality of modular header elements 880 may be stacked in horizontal succession (as best shown in FIG. 8d), as well as being used to orient the modular header elements 880 with the outer case shown in FIG. 8f. These posts 860 engage respective holes (not shown) on the other side of a second modular header element 880 to which the first is mated. These posts may engage with their respective holes via a sliding or frictional fit, or alternatively may contain retention features that allow the modular header elements 120 to engage and lock one another. Alternatively, epoxy adhesives or heat staking may be utilized to secure the modular header elements 880 to one another.

Figure 8E:
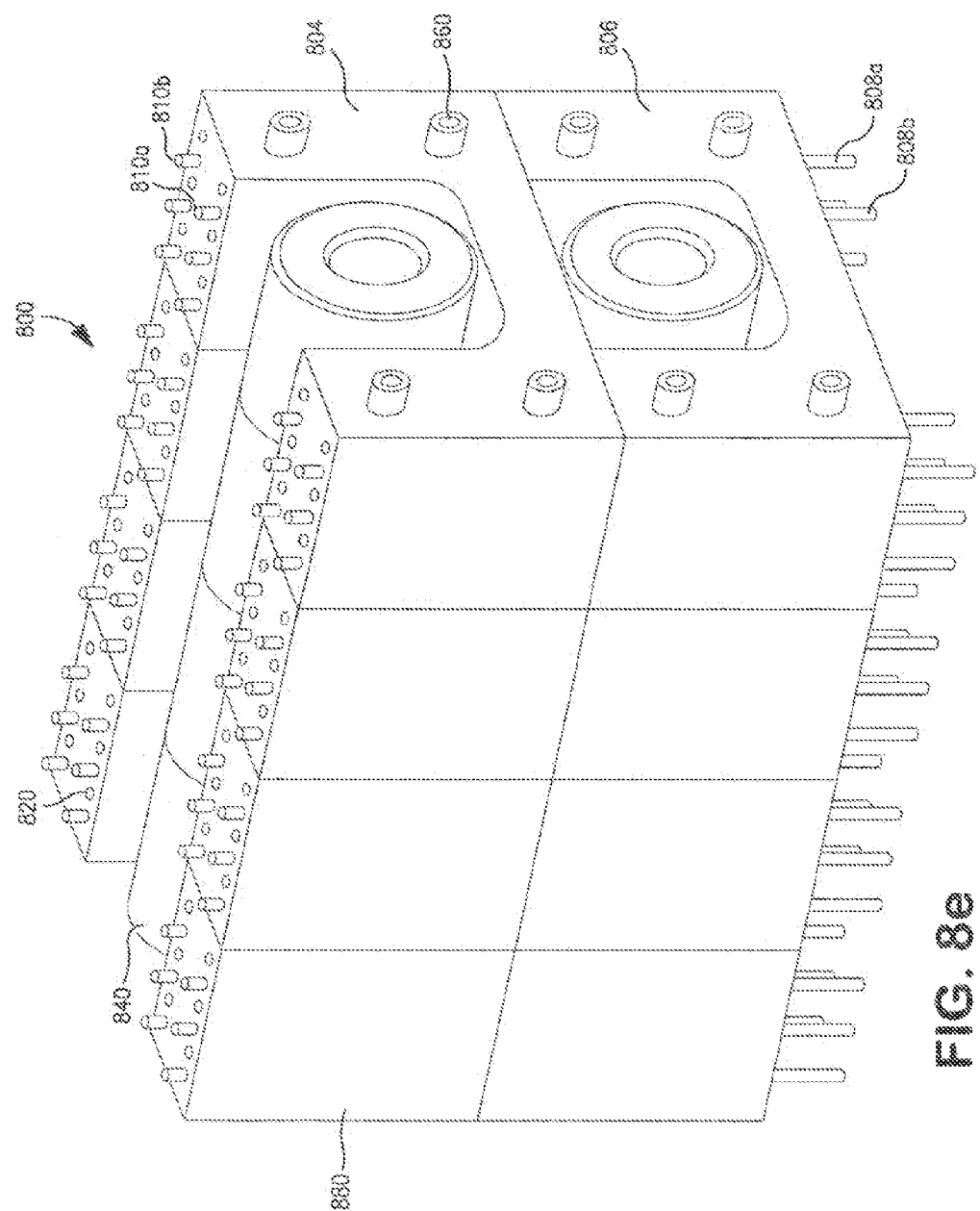
FIG. 8e is a perspective view of an 8-port mixed modular header assembly.

For stacking these modular header elements 880 vertically (as best shown in FIG. 8e), the terminal receiving holes 820 are specifically adapted to receive the conductive pins 808 from a device assembled from above. These conductive pins 808 that are received within holes 820 may purely act as mechanical features so that they only need locate and secure modular header housings vertically with respect to one another, or alternatively may also act as a signal interface between upper modular header elements 880 and the end product printed circuit board (not shown). In the latter case, the pins 808 will be sufficiently long to pass completely through the lower modular header elements 806, and provide a direct interface between the upper element(s) 804 and the end product printed circuit board.

While discussed with regards to specific embodiments shown in FIGS. 8a-8f, other embodiments of the invention (i.e., mixture or combination of the "vertical" and "horizontal" variants) will be readily apparent to those of ordinary skill given the present disclosure.

Figure 9:
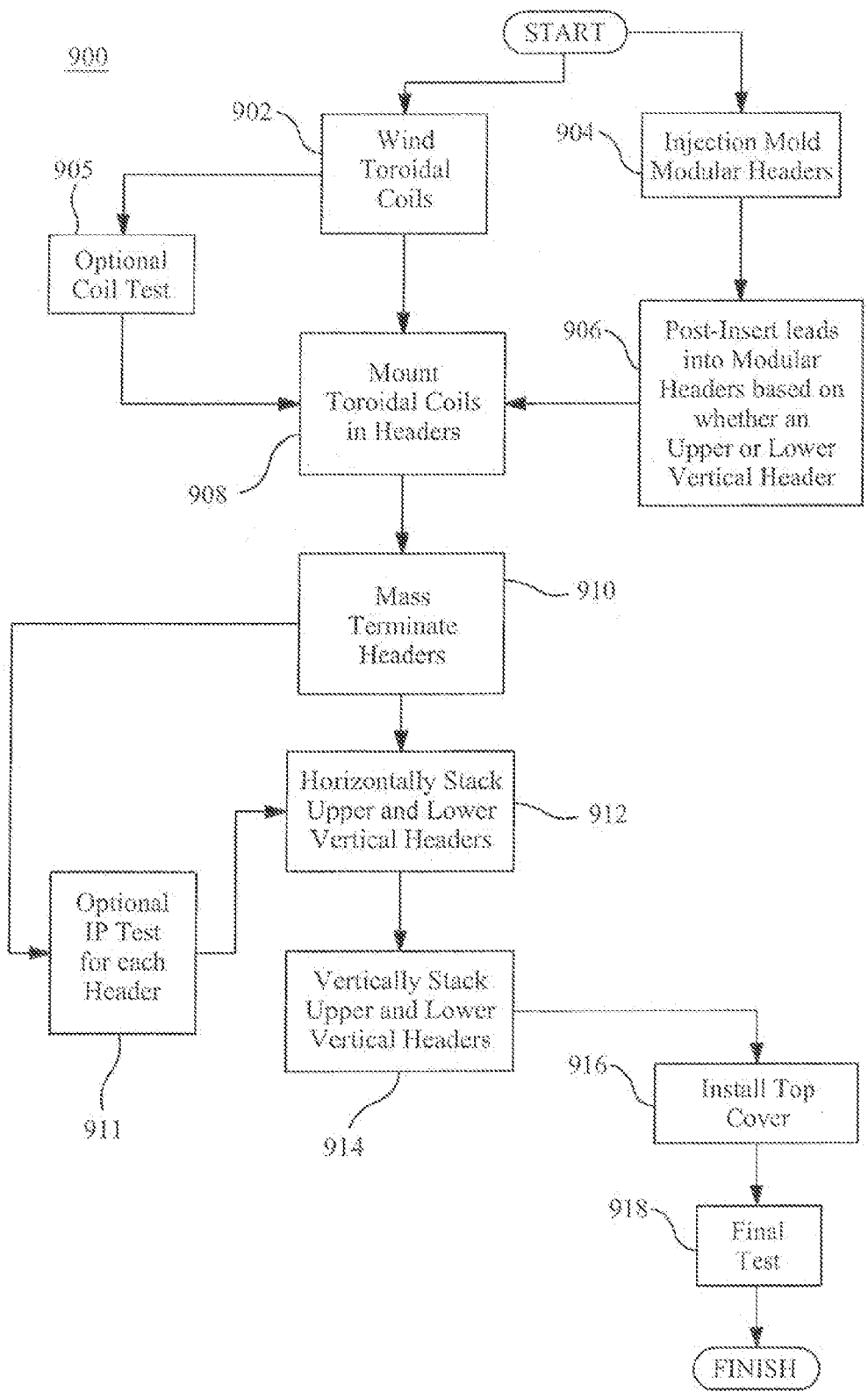

Referring now to FIG. 9, the method 900 of manufacturing the modular header assembly 800 of FIGS. 8a-8e is described in detail. It is noted that while the following description is cast in terms of the four by two (4×2) modular header assembly of FIG. 8e, the broader methodology is equally applicable to other configurations.

In the embodiment of FIG. 9, the method 900 generally comprises first winding the magnetically permeable toroidal coils (or otherwise preparing the electrical components) per step 902. Either serially or in parallel, the modular header elements 880 of FIG. 8c are formed using an injection molding apparatus (step 904). The modular header elements 880 may either have the terminal pins 808 insert molded during step 904, or alternatively be post-inserted after molding in step 906. Each header 880 may also have a different lead pattern based on its position within the final assembly 800. In the embodiment of FIG. 8e, each upper modular header will have the same pin pattern as other upper modular headers while each lower modular header will have the same pin pattern as other lower modular headers.

In step 905, the wound coils are subjected to optional electrical and/or physical testing. The coils may be tested for open circuit inductance ("OCL"), DC-resistance ("DCR"), turns-ratio testing and the like.

In step 908, the wound coils are mounted on the respective modular header elements 880. The coils can optionally be secured in the modular header element utilizing an adhesive such as a single or dual stage epoxy, encapsulant, or potting compound. Alternatively, the coils can be secured simply by routing the wires into the channels (not shown) and wrapping the wires around terminals 810.

In step 910, the wire-wrapped terminals 810 are dipped into a eutectic solder bath and the wires are mass-terminated to the terminals.

In step 911, each modular header assembly shown in FIG. 8e can optionally be electrically tested to ensure there are no defects in workmanship (i.e., cold solder joints, coil shorts due to solder splash, etc.).

In step 912, the modular header housing assemblies are "stacked" horizontally with their posts 860 being placed into respective holes on the back side of an adjacent modular header element 880. In the exemplary embodiment of FIG. 8e, four (4) modular header housing assemblies are stacked in succession to form half of the filter device 800. More or less modular header housing assemblies could be used consistent with the present invention, and the two (or more) vertically stacked rows need not have the same number of header elements 880 in each row. Friction between the posts and respective holes hold the modular header elements together, although adhesives or yet other means well known to those of ordinary skill could be used as well.

In step 914, a second grouping of upper modular header elements 804 are placed on top of the grouping of lower modular header elements 806 assembled in step 912. Each of the upper modular header assemblies 804 are first stacked horizontally (similar to step 912), and then the upper modular base leads 808 are routed through holes 820 located in the lower modular header elements. The resulting assembly forms a four-by-two (4×2) modular header assembly.

In step 916, the cover 802 is assembled over the four-by-two assembly. Guide posts 860 on the assembly are placed within cover grooves 870 to orient and position the assembly within the cover. An epoxy adhesive is utilized to secure the cover to the assembly to form the device shown in FIG. 8a, although other methods such as heat staking or mechanical interlocks could be readily incorporated into the design by one of ordinary skill. Alternatively, no adhesive or other means are used, the assembly merely relying on the mechanical interface (e.g., snap fit, friction, etc.) between the two components to retain them in place.

In step 918, the final assembled part is sent to final test prior to being shipped to an end user (or further processing).

Figure 10:
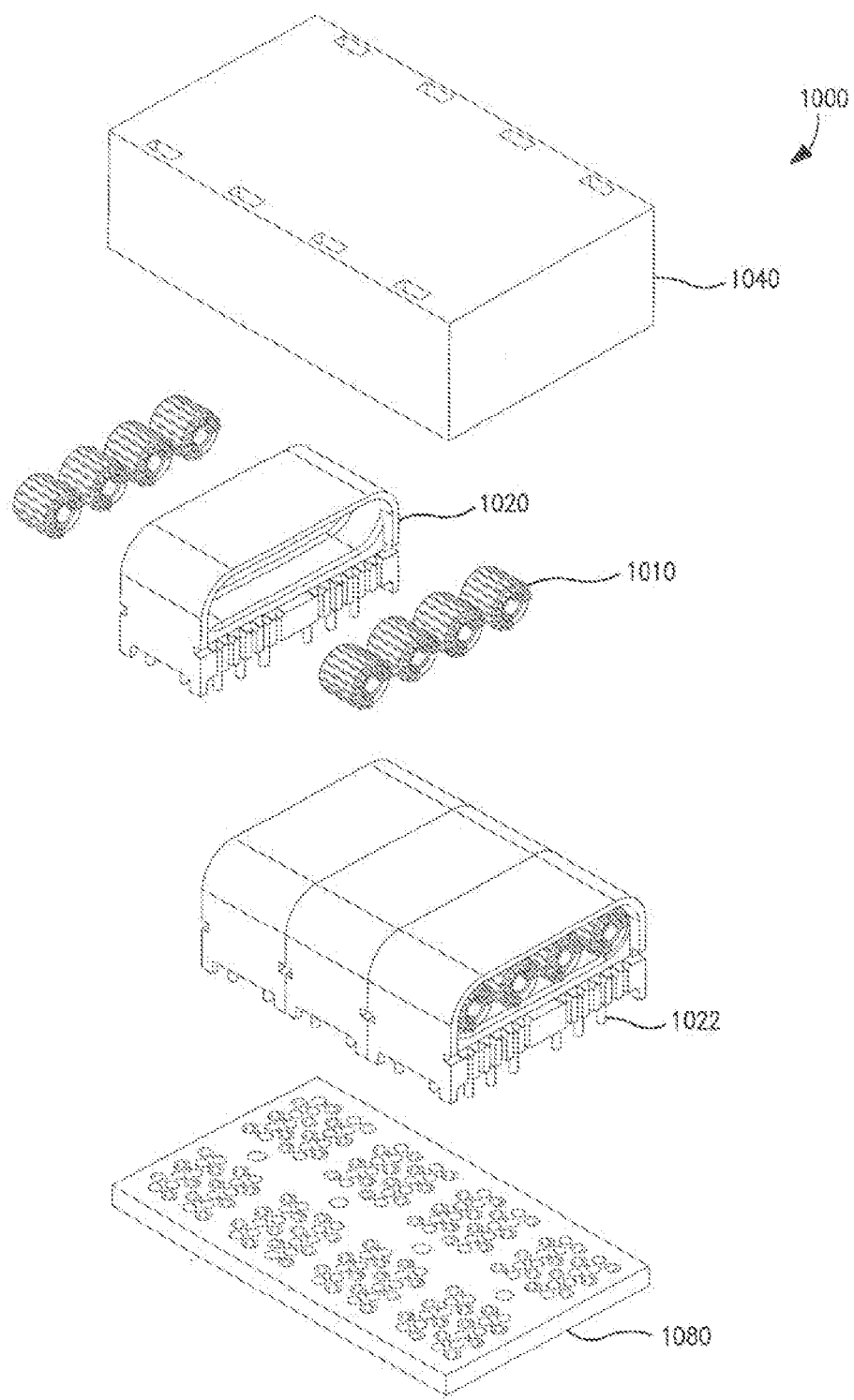
FIG. 10 is a perspective view of another exemplary embodiment of a modular header assembly according to the invention.

Referring now to FIG. 10, yet another embodiment of a modular header assembly is described. As shown in FIG. 10, this device 1000 comprises an outer case 1040, a plurality (e.g. eight (4)) of modular header support assemblies 1020 each of which utilize twenty-four (24) straight conductive pins 1022. The exemplary device 1000 of FIG. 10 therefore has a total of ninety-six (96) signal conducting straight pins 1022. The pins 1022 can either be utilized for through-hole applications, or alternatively could be specifically adapted for surface mounting applications (as shown in embodiments discussed previously and subsequently herein). In one variant of the aforementioned surface mounting applications, the pins 1022 may be placed into soldering fixtures which deposit a small semi-spherical ball of solder at the tip of each pin 1022. The device 1000 then may be mounted to an end customer printed circuit board in a ball-grid array ("BGA") fashion.

Alternatively, each of the pins 1022 will be received in a printed circuit board 1080; however in one variant the length of the pins 1022 will not be long enough to pass entirely through the thickness of the board 1080. The semi-spherical solder balls are then added to the bottom side of the printed circuit board 1080 while being electrically coupled to the pins 1022 via traces present within one or more of the copper layers present on the printed board 1080. The latter BGA-like configuration is exemplary as it reduces lead lengths of the pins 1022 and resultant inductances of the leads, thereby promoting less signal distortion at high frequencies than similar through-hole mounted configurations, while simplifying assembly techniques in the end application for configurations which desire the use of surface mount technology ("SMT").

Figure 10A:
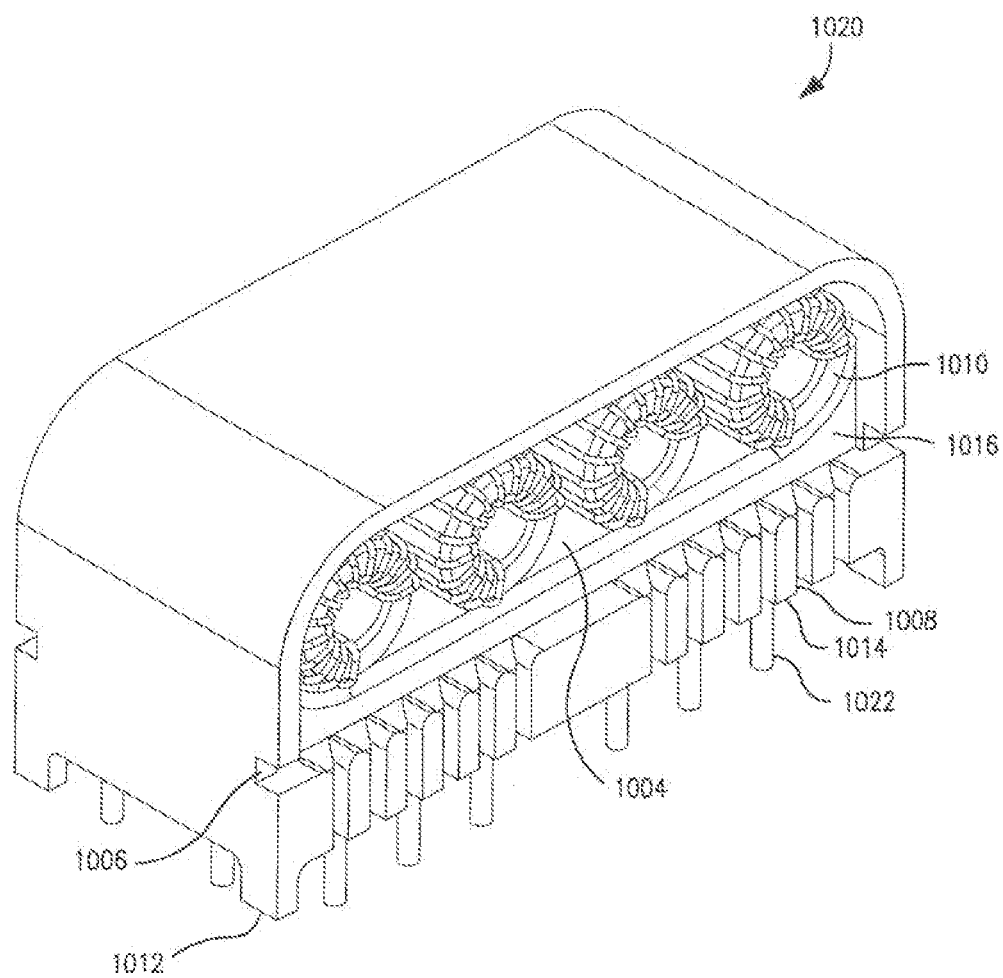
FIG. 10a is a perspective view of an individual header element utilized in the header assembly of FIG. 10.

Also, in the embodiment shown in FIGS. 10 and 10a, twenty four (24) signal conducting pins 1022 are shown for each modular element, although it will be appreciated that more or fewer pins may be utilized depending on the desired design constraints. In addition, the terminal pins 1022 may be either insert molded or post-inserted. The present invention contemplates literally any suitable approach for maintaining the pins in a substantially fixed position with respect to the support element(s) 1020.

The signal conducting terminals 1022, while shown utilizing a generally round cross-sectional shape, may be utilized in any number of cross-sectional shapes (including without limitation square, rectangular, triangular, polygonal, e.g., hexagonal, oval or elliptical, and so forth) depending on the particular needs of the application. In another exemplary embodiment, the round pins 1022 can be manufactured with flat edges pressed into the round pin on opposing sides near the wire terminating area of the pin 1022. These flat areas give a sharp edge where the wires are to be placed so that the wires can be readily "cut" by hand after the wire has been wrapped around the pin so as to facilitate the wire wrapping of the pins 1022.

In yet other alternative embodiments utilizing the aforementioned post-insertion process, other cross sectional shapes such as hexagonal cross sections have advantages in terms of pin retention strength and pin insertion yield (i.e. by reducing the amount of modular header support elements 1020 that are cracked during the pin insertion process). The large number of variations and tradeoffs for the selection of signal conducting pins 1022 are well understood in the art, and as such will not be discussed further herein.

Referring back to FIG. 10*a*, an exemplary embodiment of a modular header 1020 utilized in the embodiment of FIG. 10 is shown. Each element 1020 generally comprises a polymer material such as a high-temperature thermoset or thermoplastic polymer (e.g., LCP as previously discussed), with a plurality of conductive pins 1022 present therein. The header 1020 is advantageously manufactured by an injection-molding process. In another exemplary embodiment, the header 1020 comprises a high temperature phenolic of the type previously described, although yet other materials may be used with equal success.

The modular header 1020 plastic housing element generally comprises a plurality (e.g. two (2)) of cavities 1004, for receiving electronic components such as wire wound toroidal components 1010, although it is foreseeable that in certain applications a single cavity may be formed on either side of the header 1020, or alternatively a single cavity 1004 could be formed as a through-hole through the entire header 1020 width. In addition, a plurality of smaller cavities (not shown) could be placed within the larger cavity 1010 for the placement of center tapped wires, etc.

The header 1020 further comprises a plurality of wire routing channels 1008 that are adapted to route wire, either: (1) from cavity 1004 to opposite cavity 1004; or (2) from cavity 1004 to lead 1022. The length of these channels 1008 can also be adjusted to meet creepage and clearance requirements for supplementary insulation requirements if desired, or for other purposes, as previously discussed.

As best seen in FIG. 10*a*, the exemplary configuration of the cavity 1004 is recessed within a larger cavity 1016. This stacking of recessed cavities provides added room for the routing of wires (such as those exiting from the wound toroidal coils) while preventing damage from resultant header 1020 stacking Optionally, other electronic components (or electronic components mounted on substrates) could be housed within the outer cavity 1016, while the wound toroids 1010 are housed within the inner cavity 1004. Myriad other possibilities exist with the utilization of a "cavity within a cavity" configuration of the type shown in FIG. 10*a*.

The aforementioned wire routing channels 1008 are defined by their respective ridges 1014. These ridge-channel combinations advantageously utilize curved or chamfered lead-in features to further prevent damage to routed wires, while cleanly guiding respective wires to desired pins 1022. The further use of channels 1008 also helps minimize manufacturing errors helping to index wires to there proper respective channel and subsequent respective pin 1022. Further markings or features (not shown), such as e.g., dimples, letters, numbers, etc., can be placed proximate the channels 1008 to further facilitate proper wire routing, etc.

The exemplary header 1020 also comprises one or more strain relief channels 1006. These channels are utilized during manufacturing processes to provide extra relief to wires routed between the coils 1010 and the pins 1022. The purpose of these channels 1006 and their use will be discussed further subsequently herein at FIG. 11 and its accompanying disclosure.

Optional standoffs 1012 located at the bottom surface of the header 1020 provide clearance for wires that are wrapped around pins 1022, while allowing a wash area for cleaning underneath the header 1020 when desired. In addition to the standoffs 1012 visible at the outer corners of the header 1020, an optional locating post (not shown) could also be located near the center of the header 1020 on the bottom side. This locating post can be used for the positioning of the header 1020 on a printed circuit board such as that shown on FIG. 10*b*.

Figure 10B:
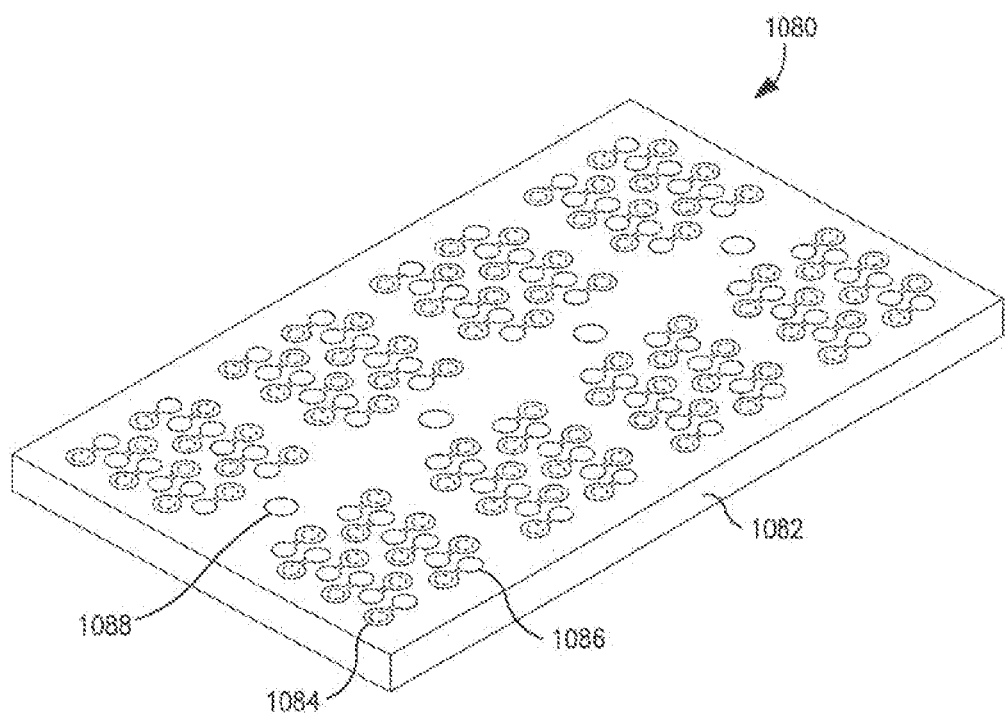
FIG. 10b is a perspective view of a first exemplary printed circuit board utilized in conjunction with the header element of FIG. 10a and the header assembly of FIG. 10.

Referring now to FIG. 10*b*, a printed circuit board 1080 utilized in conjunction with a one or more (e.g., four (4) in the illustrated embodiment) headers 1020 is shown. The printed circuit board 1080 is shown in a bottom perspective orientation (i.e. the modular header pins 1020 would be inserted from the non-visible side). The board 1080 comprises a plurality of plated through-holes 1084 adapted to receive pins 1022 of header 1020. Each of these plated through-holes 1084 is electrically connected to a respective BGA-type pad 1086 or bump, although these BGA pads 1086 could be obviated altogether in purely "through-hole" configurations of the type well known in the prior art. The printed circuit board 1080 also comprises a through hole locator feature 1088 which receives a respective post located on the header 1020 to help position the header onto the printed circuit board 1080.

The printed circuit board 1080 can be utilized for the placement of electronic components (not shown) or may be simply utilized to route electrical connections. While currently contemplated as a two-layer printed circuit board (i.e. having top and bottom layers), a multi-layer (e.g., three or more layer) printed circuit board could be utilized as well to further add electrical connectivity at internal conductive levels of the printed substrate 1080 or for forming electrical relationships (e.g. capacitive) between other layers of the printed circuit board 1080. The use of printed circuit boards is well understood in the electronic arts, and as such will not be discussed further herein.

Figure 10C:
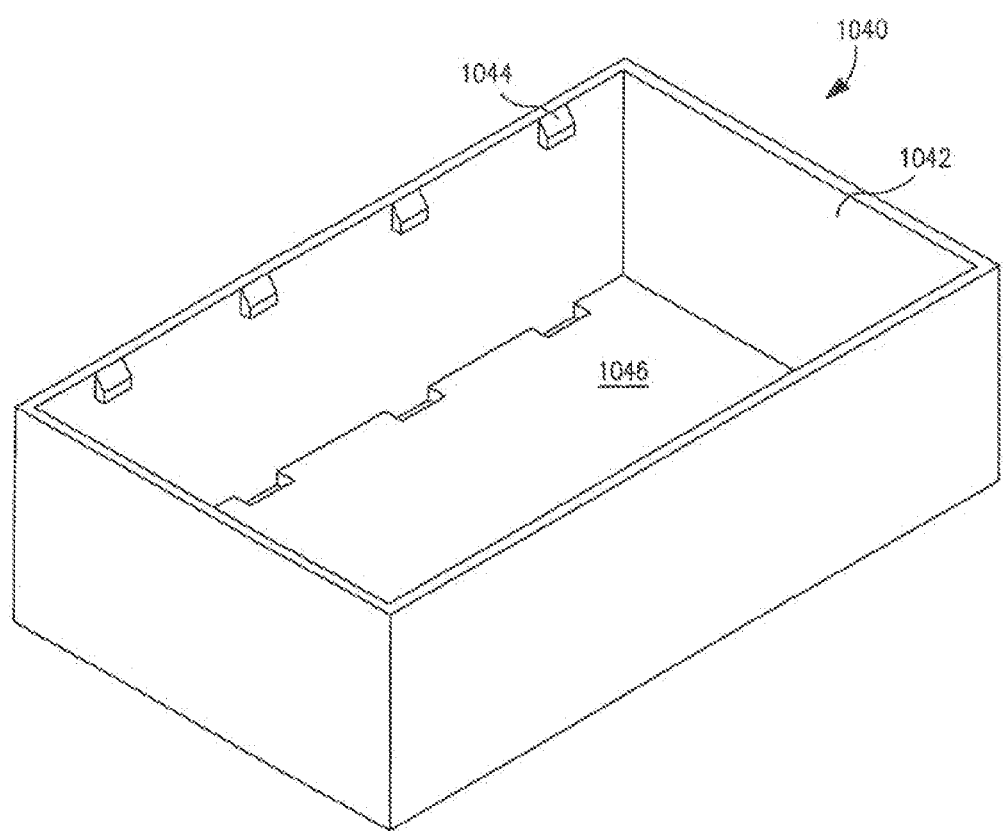
FIG. 10c is a perspective view of a first exemplary cover utilized with the header assembly of FIG. 10.
Figure 10D:
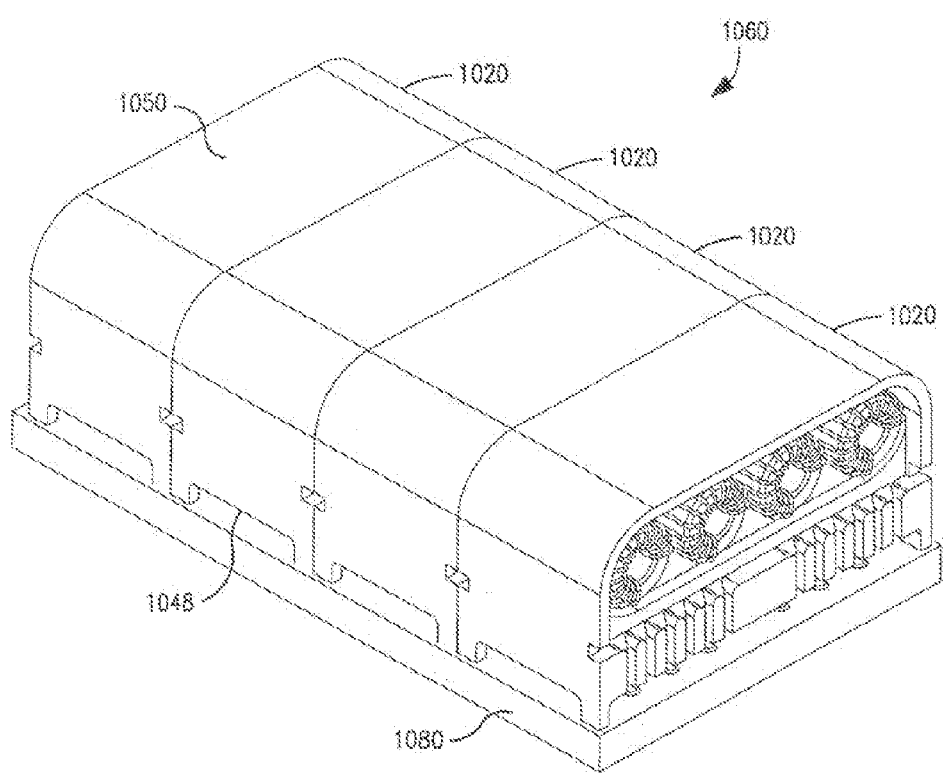
FIG. 10d is a perspective view of the assembled header assembly of FIG. 10 with the cover removed.

Referring now to FIGS. 10*c*-10*d*, an exemplary embodiment of a protective cover 1040 and its use is described in detail. The cover 1040 comprises a five-sided box with a top surface 1046 and four (4) side surfaces 1042. The top surface 1046 of FIG. 10*c* is adapted to mate with the top surface 1050 of the modular header(s) 1020 as shown in FIG. 10*d*. Also, while the cover 1040 is shown as having a substantially rectangular shape, other shapes are possible as will be recognized by those of ordinary skill. The cover 1040 also optionally comprises a plurality of cantilever snaps 1044, which are adapted to engage corresponding ledges 1048 present on the modular header(s) 1020. While shown with snaps 1044, other methods such as the use of adhesives, etc. could be used instead of or in addition to the snaps 1044 consistent with the principles of the present invention.

The embodiment of FIG. 10*c* comprises an injection moldable polymer that is chosen based on its intended application. For example, if the outer case 1040 is to be utilized in a high temperature application such as a surface mounting reflow process, a high temperature polymer such as high temperature LCP or PPS may be desirable. The selection of polymer materials is well understood in the arts and as such will not be discussed further herein.

The outer case 1040 can also be fully or partially covered with a metal noise shield (not shown), whether integral therewith (such as via a coating or plating layer(s)), or discrete or separable therefrom, to improve the EMI shielding of the device 1000. In some instances a metal shield may be desired to replace the outer case 1040 altogether, or alternatively to be placed on the inside surface of the outer case 1040. In one exemplary process, a conductive filler material is utilized within the case plastic itself to provide EMI shielding protection. Alternatively, one could plate desired surfaces (i.e., through vacuum metallization or the like) to provide means to reduce the effects of EMI on the device or other devices operating in close proximity to the device 100.

Referring to FIG. 10*d*, four (4) modular headers 1020 are shown mounted on a printed substrate 1080, with the cover 1040 removed. In a first exemplary application, each modular header 1020 will comprise a single port or channel in a telecommunications channel. Therefore, the use of four modular headers 1020 on a single substrate 1080 will mean that the device is a four (4) port or four (4) channel device. As previously discussed, the modularity of the design has manufacturing advantages as manufacturing defects can be detected earlier in the manufacturing process, such as e.g. via in process electrical testing or visual inspection, prior to being mounted on the printed substrate 1080. Ultimately this is more cost effective then final testing a four port device, as errors found at the four port device level require much more complex rework procedures and/or the scrapping of otherwise perfectly manufactured channels.

However, while primarily discussed as a single port or channel per modular header, the invention is not so limited. For example, the transmit side of a channel could be placed in one header 1020, and the receive side of a channel in another header 1020. Alternatively, two or more channels could be placed into a single modular header 1020. Such a design would be particularly advantageous in designs incorporating a high number of channels such as e.g. eight (8), sixteen (16), etc. Myriad other embodiments and permutations/combinations of channels are possible which consistent with the principles of the present invention.

The mating face of the device 1000 (i.e., that from which the pins 1022 protrude) can also be shielded if desired, such as for example through use of the multi-layered metalized/non-conducting substrate shields described in U.S. Pat. No. 6,585, 540 to Gutierrez, et al. issued Jul. 1, 2003 entitled "Shielded microelectronic connector assembly and method of manufacturing", incorporated herein by reference in its entirety.

Internal shields (such as those described in U.S. Pat. No. 6,585,540,) can also be utilized, such as between the modular headers 1020 to prevent harmful coupling effects between adjacent coils.

Furthermore, while it is primarily considered advantageous to engage the plurality of modular headers 1020 mounted on a printed substrate 1080 with a respective outer case 1040, this outer case 1040 may not be necessary in all applications. For example, one alternate embodiment of the invention could use a plurality of header elements 1020 mated together (such as frictionally, via adhesive, etc.) without any external case or housing 1040. In another variant, plastic is molded directly around the header assembly to encapsulate the internal components, or encapsulated using silicone or a similar encapsulant or potting compound.

Figure 11:
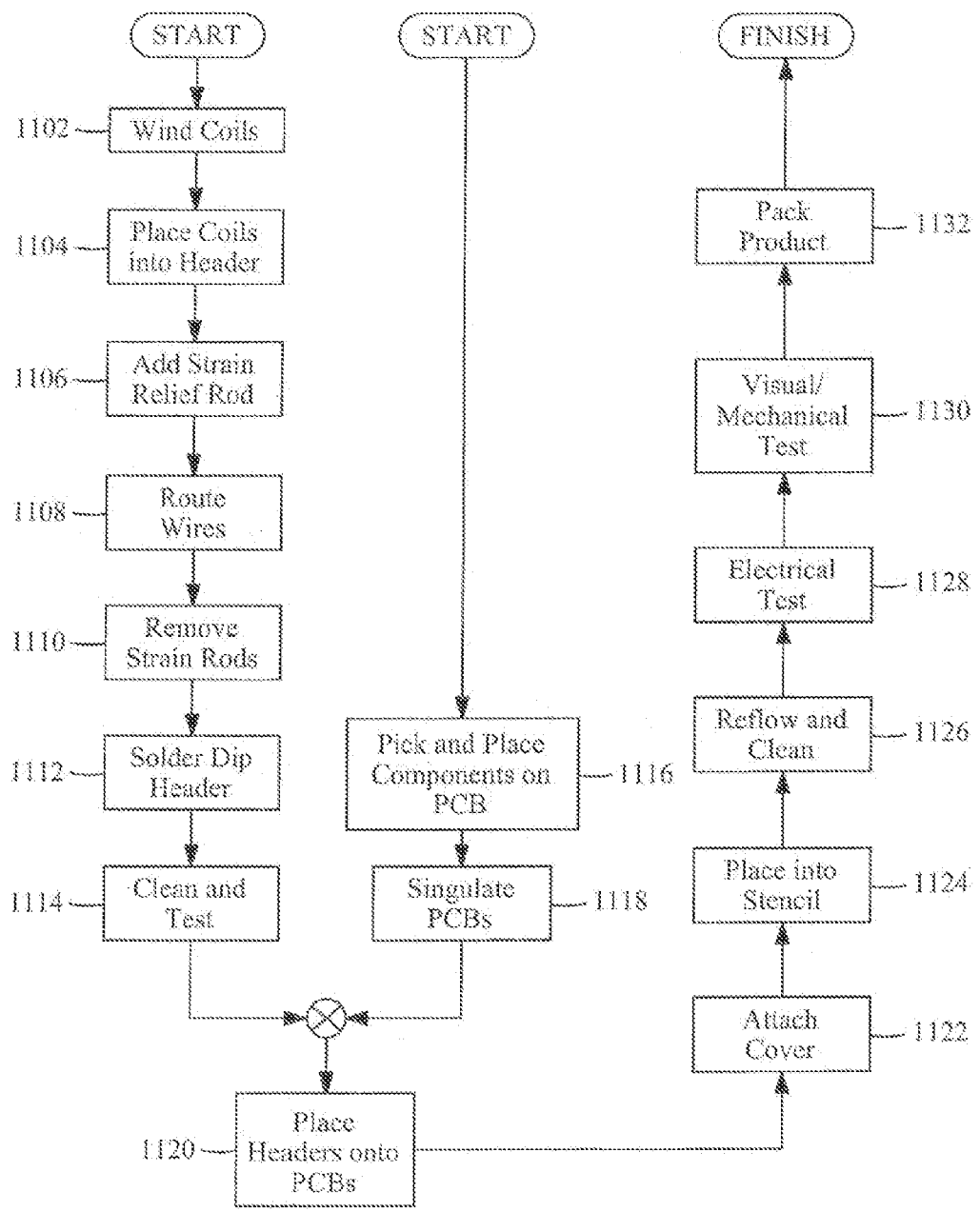
FIG. 11 is a logical flow diagram illustrating one exemplary embodiment of the method of manufacturing the header assembly of FIGS. 10-10d.

Referring now to FIG. 11, one exemplary embodiment of the method of manufacturing the header assembly of FIGS. 10-10*d* is described in detail. As shown in FIG. 11, the first step 1102 comprises wrapping wire or another conductor around a magnetic toroid to form a wound toroid assembly 1010. It will be appreciated that while toroids are described, other electrical components can be substituted for, or used in addition to, the toroids.

Next in step 1104, one or more of these wound toroidal assemblies 1010 are placed within the cavity 1004 of the header 1020. The coils 1010 are optionally secured with an adhesive such as silicone, single stage epoxy, or the like.

Next in step 1106, a strain relief rod (not shown) is inserted into the strain relief cavity 1006 of the header 1020; e.g., laterally across the width of the element 1020. The strain relief rod ideally has a smooth outer surface to prevent damage to the wires that will be subsequently routed in close proximity to the rods. The function of the rod is to mitigate stresses on the wires of the electronic components (e.g., toroids) during manufacturing, thereby reducing the chance of a wire being over-stressed and ultimately breaking.

Next in step 1108, wires from the wound coils 1010 are routed to their respective cavities 1008 and subsequently to their respective pins 1022. The wires are then wrapped around each terminal 1022 with two to three turns minimum and excess wire trimmed.

Next in step 1110, the strain rods are removed from the strain relief cavities 1006. The wires from the wound toroids 1010 will now not be under any deleterious tension, and thus damage to the wires due to thermal expansion during IR reflow, etc. will be minimized or even completely eliminated.

Next in step 1112, the header assembly is solder dipped to terminate the wires from the toroids 1010 to the pins 1022. The solder bath advantageously comprises an RoHS solder bath of the type previously described. While RoHS solder is exemplary, other solders which utilize lead ("Pb"), could also be utilized consistent with the principles of the present invention.

In step 1114, each header assembly is optionally cleaned to remove corrosive fluxes that may be present following the solder dipping operation of step 1112 and the parts "in-process" tested (electrically and/or mechanically) to ensure the resultant channel or port meets or exceeds predetermined specifications.

Either in parallel or serially with the preceding steps, steps 1116 and 1118 are performed. In step 1116, any desired electronic components such as the previously mentioned discrete passive or active electronic components are placed onto the printed circuit board 1080. Advantageously, each of these electronic components can be placed using standard pick and place techniques and surface mount reflow soldered, although the present invention is in no such way limited.

In step 1118, the printed circuit boards 1080 which were presently combined onto a standard panel size are singulated from the panel into individual boards.

Next in step 1120, the header assemblies resultant from step 1114 are placed on the singulated printed circuit boards 1080 from step 1118. In the exemplary embodiment, four headers are placed on the printed circuit board 1080 to provide a four-channel device, although literally any number may be used.

In step 1122, the outer cover 1040 is snapped onto the header/printed circuit board assembly of step 1120. The outer cover 1040 may then optionally be secured with an adhesive to further enhance bonding.

In step 1124, the entire device 1000 is placed onto a stencil fixture and screen printed with a RoHS compliant or other type of solder paste.

In step 1126, the device is reflowed using standard SMT techniques and the resultant device 1000 is cleaned to remove any harmful or corrosive chemicals left on the device 1000.

In step 1128, electrical testing is performed to ensure that the part meets specifications as previously defined and then in step 1130, the device 1000 is inspected visually and mechanical dimensions are checked.

In step 1132, the device 1000 is packaged for shipment. In one exemplary embodiment, the device is packaged in an industry standard tape and reel carrier to facilitate automated handling by the end customer. Alternatively, the device 1000 can either be packaged in a tray, tube or bulk packaging for shipment to the end customer of the device 1000.

It will be recognized that while certain aspects of the exemplary methods presented herein are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

It will further be recognized that while described in terms of telecommunications channels such as LAN and WAN channels or connections, the invention is in no way so limited. For example, literally any type of network or circuits can be substituted in place of the LAN and WAN described herein, the LAN and WAN filtering application being merely exemplary. For example, the device could be used in DSL applications (e.g., ADSL), wireless applications, and literally any other electronic or electrical application where signal conditioning is required.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A modular electronic apparatus for mounting onto an external substrate, comprising:
    a printed circuit board comprising a first layer comprised of a plurality of surface mountable conductive interfaces;
    a plurality of substantially identical modular headers, each of said modular headers comprising:
        a non-conductive base member having an electronic component receiving cavity formed therein;
        a plurality of surface-mountable signal conducting elements disposed at least partially within said non-conductive base member on a bottom surface thereof; and
    a cover at least partially enclosing said plurality of modular headers; and
    a plurality of electronic components at least partially disposed within said electronic component receiving cavities of said modular headers, at least one of said plurality of electronic components comprising a wire having two ends, said ends of said wire being wire wrapped around respective ones of at least a portion of said surface-mountable signal conducting elements;
    wherein at least a portion of said plurality of surface-mountable signal conducting elements are soldered to said first layer of said printed circuit board.

2. The modular apparatus of claim 1, where said plurality of modular headers are disposed adjacent to one another.

3. The modular apparatus of claim 2, wherein at least three of said plurality of modular headers are disposed such that a cavity of said at least three of said plurality of modular headers is disposed such that it faces an adjacent one of said modular headers.

4. The modular apparatus of claim 2, wherein at least one of said plurality of electronic components comprises a toroidal coil, said toroidal coil being disposed within its respective electronic component receiving cavity.

5. The modular apparatus of claim 4, wherein said wire having two ends is routed so as to prevent damage to said wire from an adjacently mounted component.

6. The modular apparatus of claim 4, wherein each of said modular headers comprises a single channel in a telecommunications circuit.

7. The modular apparatus of claim 4, where a number of said modular headers is four (4) and a number of said surface-mountable signal conducting elements is ninety-six (96).

8. The modular apparatus of claim 1, wherein the cover is secured to at least one of said plurality of modular headers by way of an adhesive.

9. The modular apparatus of claim 1, wherein each of the plurality of surface mountable conductive interfaces is electrically coupled to a respective one of a plurality of ball-grid array conductive interfaces.

10. A method of manufacturing a modular electronic apparatus, the method comprising:
    inserting a plurality of electronic components at least partially within each of a plurality of electronic component receiving cavities of a plurality of modular header assemblies;
    routing a plurality of wires associated with said plurality of electronic components onto respective ones of surface-mountable signal conducting elements;
    wire wrapping said wires to respective ones of said surface-mountable signal conducting elements;
    soldering said wires to respective ones of said surface-mountable signal conducting elements;
    mounting each of said modular header assemblies onto a multi-layer printed circuit board;
    securing said modular header assemblies to said multi-layer printed circuit board using a soldering process;
    placing said cover over at least a portion of said modular header assemblies; and
    forming a plurality of ball-grid array conductive interfaces on a second layer of said multi-layer printed circuit board.

11. The method of claim 10, further comprising:
    testing each of said plurality of modular header assemblies prior to said act of mounting each of said modular header assemblies; and
    selectively discarding or reworking at least one of said modular header assemblies for failing said testing.

12. The method of claim 10, where said act of soldering said wires to respective ones of said surface-mountable signal conducting elements is performed using a mass termination method.

13. A modular electronic apparatus for mounting onto an external substrate, comprising:
    a printed circuit board comprising two interface surfaces, a first of said interface surfaces configured for interfacing with a plurality of modular headers, and a second interface surface configured for interfacing with said external substrate;
    a plurality of modular headers, each of said modular headers comprising:
        a base element comprised of a bottom surface that substantially opposes said first interface surface and further comprising at least one cavity formed therein;

a plurality of signal conducting elements disposed at least partially within said base element and on a bottom surface thereof; and a cover at least partially enclosing said plurality of modular headers; and a plurality of electronic components at least partially disposed within each of said at least one cavities of said modular headers, each of said electronic components comprising wire ends, said ends of said wire being wire wrapped around respective ones of at least a portion of said signal conducting elements;

wherein at least a portion of said plurality of signal conducting elements are electrically coupled with said first interface surface of said printed circuit board.

14. The modular apparatus of claim 13, wherein said plurality of signal conducting elements comprise surface mountable signal conducting elements.

15. The modular apparatus of claim 14, wherein said second interface surface comprises a plurality of ball grid array (BGA) style contacts.

16. The modular apparatus of claim 13, where said plurality of modular headers are disposed adjacent to one another.

17. The modular apparatus of claim 13, wherein said plurality of electronic components comprises a toroidal coil.

18. The modular apparatus of claim 17, wherein said first interface surface is electrically coupled with said second interface surface of said printed circuit board.

19. The modular apparatus of claim 18, wherein said plurality of signal conducting elements are arranged in a row and column fashion comprised of at least three rows and at least three columns.

20. The modular apparatus of claim 19, wherein the wire wrapped portion of said wire is disposed between said bottom surface and said first interface surface.

* * * * *